US009905598B2

(12) United States Patent
Yamazaki et al.

(10) Patent No.: US 9,905,598 B2
(45) Date of Patent: Feb. 27, 2018

(54) IMAGING DEVICE

(71) Applicant: Semiconductor Energy Laboratory Co., Ltd., Atsugi-shi, Kanagawa-ken (JP)

(72) Inventors: Shunpei Yamazaki, Tokyo (JP); Masayuki Sakakura, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/688,406

(22) Filed: Apr. 16, 2015

(65) Prior Publication Data

US 2015/0311245 A1 Oct. 29, 2015

(30) Foreign Application Priority Data

Apr. 23, 2014 (JP) ................................. 2014-088747

(51) Int. Cl.
H01L 29/82 (2006.01)
H01L 27/146 (2006.01)
H01L 29/786 (2006.01)

(52) U.S. Cl.
CPC .... H01L 27/14629 (2013.01); H01L 27/1464 (2013.01); H01L 27/14612 (2013.01);
(Continued)

(58) Field of Classification Search
None
See application file for complete search history.

(56) References Cited

U.S. PATENT DOCUMENTS 5,698,844 A 12/1997 Shinohara et al.
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

Primary Examiner — Cuong Q Nguyen
Assistant Examiner — Nishath Yasmeen
(74) Attorney, Agent, or Firm — Fish & Richardson P.C.

(57) ABSTRACT

An image-capturing device which is capable of capturing high quality images and can be formed at a low cost is provided. The image-capturing device includes a first circuit including a first transistor and a second transistor, and a second circuit including a third transistor and a photodiode. The first transistor is provided on a first surface of a silicon substrate. The second transistor is provided over the first transistor. The photodiode is provided to the silicon substrate. The silicon substrate includes a second insulating layer surrounding a side surface of the photodiode. The first transistor is a p-channel transistor including an active region in the silicon substrate. The third transistor is an n-channel transistor including an oxide semiconductor layer as an active layer. A light-receiving surface of the photodiode is a surface of the silicon substrate opposite to the first surface.

23 Claims, 62 Drawing Sheets

(52) U.S. Cl.
CPC .. *H01L 27/14623* (2013.01); *H01L 27/14632* (2013.01); *H01L 27/14641* (2013.01); *H01L 27/14643* (2013.01); *H01L 29/7869* (2013.01)

(56) References Cited

U.S. PATENT DOCUMENTS

| | | | |
|---|---|---|---|
| 5,744,864 | A | 4/1998 | Cillessen et al. |
| 6,204,524 | B1 | 3/2001 | Rhodes |
| 6,251,712 | B1 | 6/2001 | Tanaka et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,849,853 | B2 | 2/2005 | Ikeda et al. |
| 6,960,817 | B2 | 11/2005 | Ogura et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,115,923 | B2 | 10/2006 | Hong |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,427,776 | B2 | 9/2008 | Hoffman et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,663,165 | B2 | 2/2010 | Mouli |
| 7,674,650 | B2 | 3/2010 | Akimoto et al. |
| 7,732,819 | B2 | 6/2010 | Akimoto et al. |
| 7,791,072 | B2 | 9/2010 | Kumomi et al. |
| 7,800,148 | B2 | 9/2010 | Lee et al. |
| 7,916,195 | B2 | 3/2011 | Kudoh |
| 7,956,394 | B2 | 6/2011 | Lee |
| 8,164,256 | B2 | 4/2012 | Sano et al. |
| 8,193,045 | B2 | 6/2012 | Omura et al. |
| 8,333,913 | B2 | 12/2012 | Inoue et al. |
| 8,378,391 | B2 | 2/2013 | Koyama et al. |
| 9,711,549 | B2 | 7/2017 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0121708 | A1* | 6/2005 | Hong ............... H01L 27/14609 257/292 |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0125038 | A1 | 6/2006 | Mabuchi |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0018075 | A1 | 1/2007 | Cazaux et al. |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0069258 | A1* | 3/2007 | Ahn ............... H01L 27/14634 257/290 |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0054319 | A1 | 3/2008 | Mouli |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0303072 | A1 | 12/2008 | Lee et al. |
| 2009/0008566 | A1* | 1/2009 | Agarwal ........... H01L 27/14658 250/370.11 |
| 2009/0065771 | A1 | 3/2009 | Iwasaki et al. |
| 2009/0068773 | A1 | 3/2009 | Lai et al. |
| 2009/0073325 | A1 | 3/2009 | Kuwabara et al. |
| 2009/0101948 | A1 | 4/2009 | Park et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0140609 | A1 | 6/2010 | Yano et al. |
| 2010/0201834 | A1 | 8/2010 | Maruyama et al. |
| 2010/0296540 | A1* | 11/2010 | Pan .................... H01L 27/15 372/45.012 |
| 2011/0062310 | A1* | 3/2011 | Kudo .................. H04N 5/2176 250/208.1 |
| 2011/0108706 | A1* | 5/2011 | Koyama ........... H01L 27/14632 250/208.1 |
| 2011/0215323 | A1* | 9/2011 | Kurokawa ........ H01L 27/14603 257/53 |
| 2013/0001403 | A1 | 1/2013 | Yamakawa |
| 2013/0285045 | A1 | 10/2013 | Sasaki et al. |
| 2015/0263053 | A1 | 9/2015 | Yamazaki et al. |

FOREIGN PATENT DOCUMENTS

| | | |
|---|---|---|
| JP | 60-198861 A | 10/1985 |
| JP | 63-174356 A | 7/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |

(56) References Cited

FOREIGN PATENT DOCUMENTS

| | | |
|---|---|---|
| JP | 63-265818 A | 11/1988 |
| JP | 04-118977 A | 4/1992 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-114453 A | 4/2000 |
| JP | 2000-150900 A | 5/2000 |
| JP | 2001-160624 A | 6/2001 |
| JP | 2002-076356 A | 3/2002 |
| JP | 2002-246580 A | 8/2002 |
| JP | 2002-289859 A | 10/2002 |
| JP | 2003-086000 A | 3/2003 |
| JP | 2003-086808 A | 3/2003 |
| JP | 2003-197890 A | 7/2003 |
| JP | 2004-103957 A | 4/2004 |
| JP | 2004-273614 A | 9/2004 |
| JP | 2004-273732 A | 9/2004 |
| JP | 2006-165527 A | 6/2006 |
| JP | 2007-096055 A | 4/2007 |
| JP | 2007-123861 A | 5/2007 |
| JP | 2007-250862 A | 9/2007 |
| JP | 2008-198791 A | 8/2008 |
| JP | 2009-158528 A | 7/2009 |
| JP | 2011-119711 A | 6/2011 |
| WO | WO-2004/114391 | 12/2004 |
| WO | WO-2009/031377 | 3/2009 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350°C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al.. "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002. vol. 1, pp. 64-68.

Tsuda.K et al., "Ultra Low Power Consumption Technologies for Mobile TFT-LCDs ", IDW '02 : Proceedings of the 9th International Display Workshops, Dec. 4. 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006. vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15. No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M. "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al.. "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40. pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al.. "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al.. "15.2: Development of Driver-Integrated Panel using Amorphous In—Ga—Zn-Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", Nirim Newsletter. Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters) , 2005, vol. 87, pp. 122102-1-122102-3.
Clark.S et al., "First Principles Methods Using Caster", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39. pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008. vol. 39, pp. 633-636.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39. pp. 629-632.
Fung.T et al., "2-D Numerical Simulation of High Performance Amorphous In—Ga—Zn—O TFTs for Flat Panel Displays". AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Oh.M et at, "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Letters) . Sep. 13, 2004, vol. 85, No. 11, pp. 1993-1995.
A 1/4-inch 8Mpixel CMOS Image Sensor with 3D Backside-Illuminated 1.12μm Pixel with Front-Side Deep-Trench Isolation and Vertical Transfer Gate, ISSCC 2014 (Digest of Technical Papers. IEEE International Solid-State Circuits Conference), Feb. 10, 2014, pp. 124-126.

* cited by examiner (A) Initial State ($V_OH$)

(B) Final State ($V_O$, H–O)

(A) Initial State ($V_O H$)

(B) Final State ($V_O$, H–O)

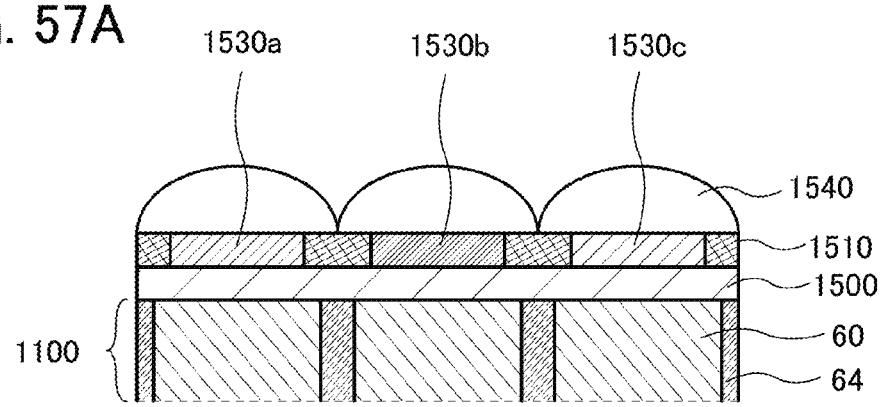
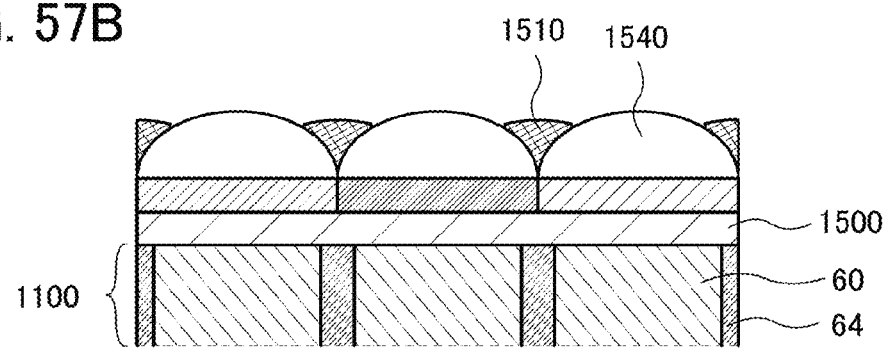
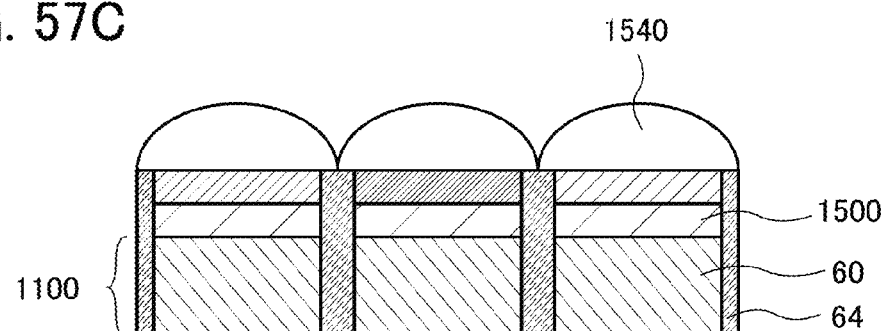
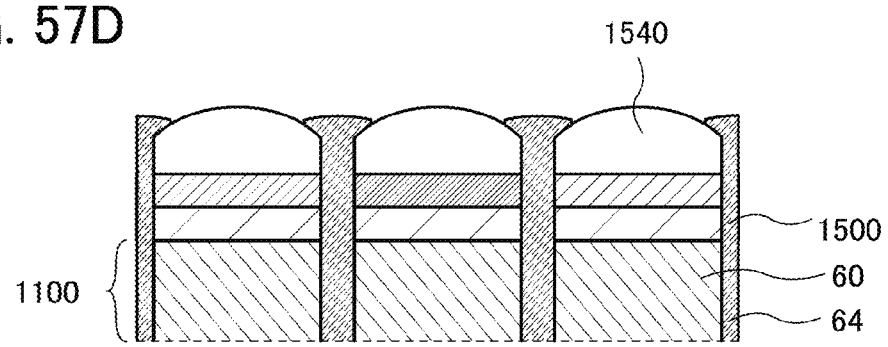

IMAGING DEVICE

BACKGROUND OF THE INVENTION

1. Field of the Invention

One embodiment of the present invention relates to an imaging device including an oxide semiconductor.

Note that one embodiment of the present invention is not limited to the above technical field. Specifically, examples of the technical field of one embodiment of the present invention disclosed in this specification include a semiconductor device, a display device, a method for driving any of them, and a method for manufacturing any of them.

In this specification and the like, a semiconductor device generally means a device that can function by utilizing semiconductor characteristics. A transistor and a semiconductor circuit are embodiments of semiconductor devices. A storage device, a display device, an imaging device, or an electronic appliance includes a semiconductor device.

2. Description of the Related Art

A technique to form transistors by using semiconductor thin films formed over a substrate having an insulating surface has been attracting attention. The transistor is used in a wide range of electronic devices such as an integrated circuit (IC) or an image display device (also simply referred to as a display device). As semiconductor thin films applicable to the transistors, silicon-based semiconductor materials have been widely used, and oxide semiconductors have been attracting attention as alternative materials.

For example, a technique for forming a transistor using zinc oxide or an In—Ga—Zn-based oxide semiconductor as an oxide semiconductor is disclosed (see Patent Documents 1 and 2).

Patent Document 3 discloses that a transistor including an oxide semiconductor and having an extremely low off-state current is used in at least part of a pixel circuit and a transistor including a silicon semiconductor with which a complementary metal oxide semiconductor (CMOS) circuit can be formed is used in a peripheral circuit, whereby an imaging device with high speed operation and low power consumption can be manufactured.

REFERENCE

Patent Document

[Patent Document 1] Japanese Published Patent Application No. 2007-123861

[Patent Document 2] Japanese Published Patent Application No. 2007-096055

[Patent Document 3] Japanese Published Patent Application No. 2011-119711

SUMMARY OF THE INVENTION

In view of the usage in various environments, imaging devices are required to have the capability of capturing high quality images even in a low illuminance environment and in the case of capturing an image of a moving subject. Furthermore, an imaging device which satisfies the requirement and can be formed at a lower cost is demanded.

Therefore, an object of one embodiment of the present invention is to provide an imaging device capable of capturing an image under a low illuminance condition. Another object is to provide an imaging device with a wide dynamic range. Another object of one embodiment of the present invention is to provide an imaging device with high resolution. Another object of one embodiment of the present invention is to provide a highly integrated imaging device. Another object of one embodiment of the present invention is to provide an imaging device which can be used in a wide temperature range. Another object is to provide an imaging device that is suitable for high-speed operation. Another object of one embodiment of the present invention is to provide an imaging device with low power consumption. Another object of one embodiment of the present invention is to provide an imaging device with a high aperture ratio. Another object of one embodiment of the present invention is to provide an imaging device formed at low cost. Another object of one embodiment of the present invention is to provide an imaging device with high reliability.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to an imaging device including a pixel circuit including a transistor formed using an oxide semiconductor, a photoelectric conversion element formed using silicon, and a peripheral circuit including a transistor formed using an oxide semiconductor and a transistor formed using silicon.

One embodiment of the present invention is an imaging device including a first circuit including a first transistor and a second transistor, and a second circuit including a third transistor and a photodiode. The first transistor is provided over a first surface of a silicon substrate; the photodiode is provided to the silicon substrate, the second transistor is provided over the first transistor; the silicon substrate includes a first insulating layer; the first insulating layer surrounds a side surface of the photodiode; the first transistor is a p-channel transistor; the first transistor includes an active region in the silicon substrate; the second transistor and the third transistor is an n-channel transistor; active layers of the second transistor and the third transistor each include an oxide semiconductor; and a light-receiving surface of the photodiode is a surface of the silicon substrate opposite to the first surface.

The first transistor and the second transistor can form a CMOS circuit.

The second circuit may further include fourth to sixth transistors; the fourth to sixth transistors are n-channel transistors; active layers of the fourth to sixth transistors include an oxide semiconductor; one of a source and a drain of the third transistor is electrically connected to an anode or a cathode of the photodiode; the other of the source and the drain of the third transistor is electrically connected to one of a source and a drain of the fourth transistor; the other of the source and the drain of the third transistor is electrically connected to a gate of the fifth transistor; and one of a source and a drain of the fifth transistor is electrically connected to one of a source and a drain of the sixth transistor.

The oxide semiconductor layer preferably includes In, Zn, and M (M is Al, Ti, Ga, Sn, Y, Zr, La, Ce, Nd, or Hf).

The plane orientation of a crystal in the first surface of the silicon substrate is preferably (110).

According to one embodiment of the present invention, an imaging device capable of taking an image under low illuminance can be provided. An imaging device with a wide dynamic range can be provided. An imaging device with high resolution can be provided. A highly integrated imaging device can be provided. An imaging device which can be used in a wide temperature range can be provided. An imaging device that is suitable for high-speed operation can be provided. An imaging device with low power consumption can be provided. An imaging device with a high aperture ratio can be provided. An imaging device which is formed at low cost can be provided. An imaging device with high reliability can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 57A to 57D are cross-sectional views each illustrating an imaging device.

DETAILED DESCRIPTION OF THE INVENTION

Figure 1A:
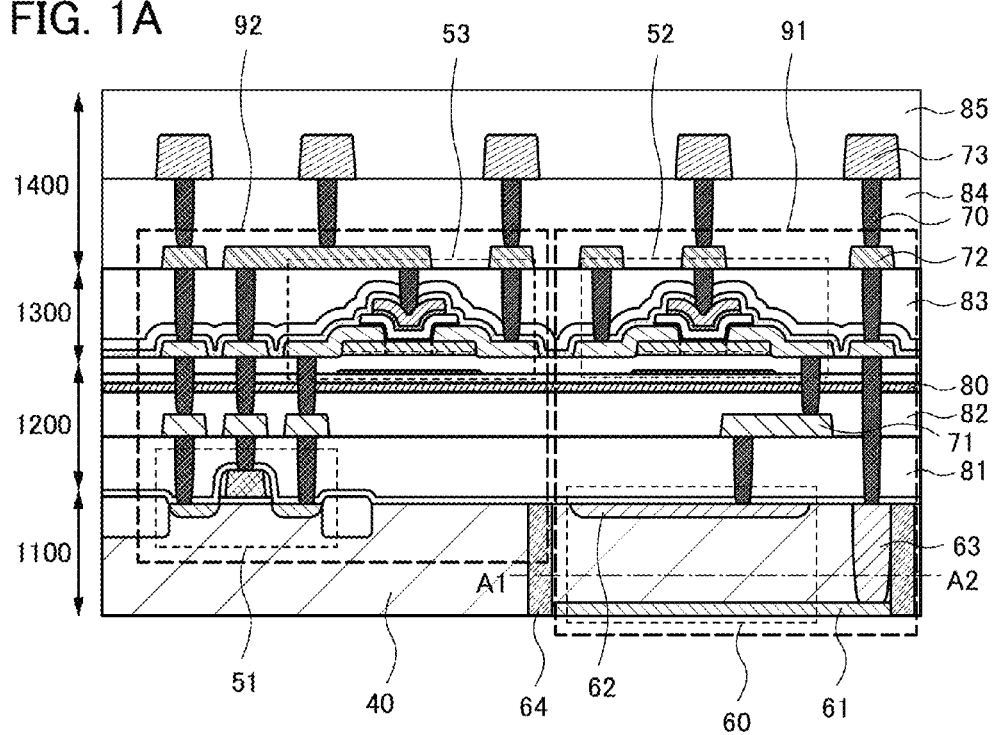
FIGS. 1A to 1C are a cross-sectional view and circuit diagrams illustrating an imaging device.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of Embodiments below. Note that in structures of the present invention described below, the same portions or portions having similar functions are denoted by the same reference numerals in different drawings, and description thereof is not repeated in some cases. It is also to be noted that the same components are denoted by different hatching patterns in different drawings, or the hatching patterns are omitted in some cases.

Note that in this specification and the like, when it is explicitly described that X and Y are connected, the case where X and Y are electrically connected, the case where X and Y are functionally connected, and the case where X and Y are directly connected are included therein. Here, X and Y each denote an object (e.g., a device, an element, a circuit, a line, an electrode, a terminal, a conductive film, a layer, or the like). Accordingly, another element may be interposed between elements having a connection relation shown in drawings and texts, without limiting to a predetermined connection relation, for example, the connection relation shown in the drawings and the texts.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a DC-DC converter, a step-up DC-DC converter, or a step-down DC-DC converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generator circuit; a memory circuit; and/or a control circuit) can be connected between X and Y. When a signal output from X is transmitted to Y, it can be said that X and Y are functionally connected even if another circuit is provided between X and Y.

Note that when it is explicitly described that X and Y are connected, the case where X and Y are electrically connected (i.e., the case where X and Y are connected with another element or another circuit positioned therebetween), the case where X and Y are functionally connected (i.e., the case where X and Y are functionally connected with another circuit positioned therebetween), and the case where X and Y are directly connected (i.e., the case where X and Y are connected without another element or another circuit positioned therebetween) are included therein. That is, when it is explicitly described that "X and Y are electrically connected", the description is the same as the case where it is explicitly only described that "A and B are connected".

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Embodiment 1

In this embodiment, an imaging device that is one embodiment of the present invention is described with reference to drawings.

FIG. 1A is a cross-sectional view illustrating a structure of the of one embodiment of the present invention. The imaging device in FIG. 1A includes a transistor 51 including an active region in a silicon substrate 40, transistors 52 and 53 each including an oxide semiconductor layer as an active layer, and a photodiode 60 provided in the silicon substrate 40. Each transistor and the photodiode 60 are electrically connected to wiring layers and conductors 70 embedded in insulating layers. An anode 61 of the photodiode 60 is electrically connected to the conductor 70 through a low-resistance region 63.

Figure 58A:
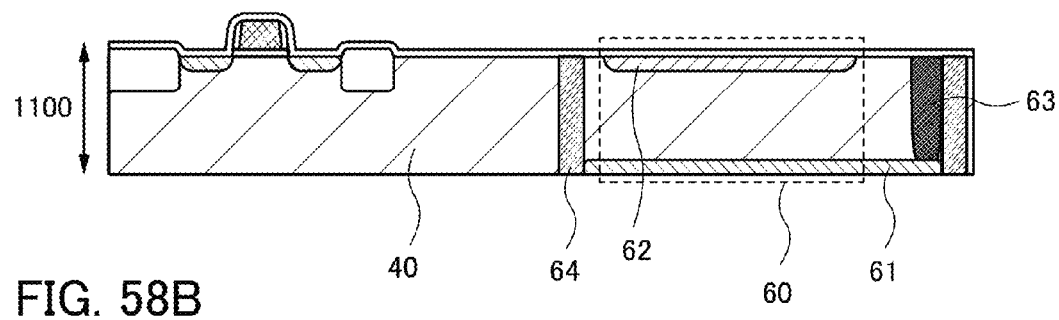
FIGS. 58A to 58D are cross-sectional views each illustrating an imaging device.
Figure 58B:
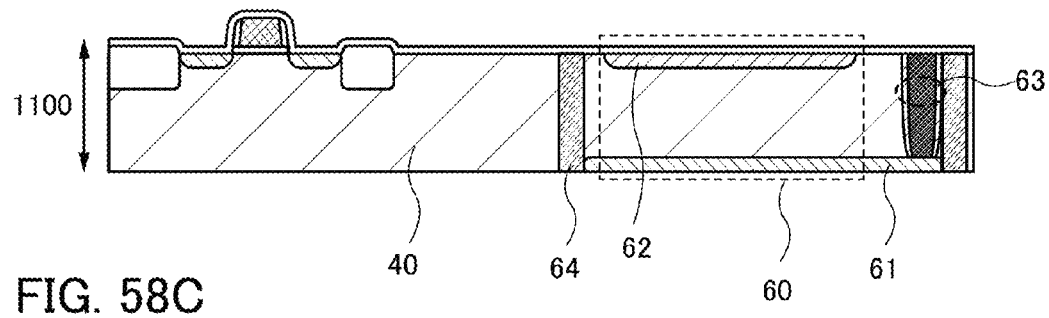

Note that although the low-resistance region 63 can be formed by a p-type region obtained by adding an impurity to the silicon substrate 40, a metal may be used instead, as illustrated in FIG. 58A. Alternatively, the low-resistance region 63 may have a structure in which the metal passes through the p-type region as illustrated in FIG. 58B.

Note that the above-described electrical connection between the components is only an example. In addition, the same reference numeral is used for wirings, electrodes, and the like which are provided over the same surface or formed by the same process, and only a typical one is denoted by the reference numeral in the drawings. All the conductors embedded in the insulating layers are collectively denoted by the reference numeral 70. Although the wirings, the electrodes, and the conductors 70 are illustrated as independent components in the drawings, components that are electrically connected to each other in the drawings may be regarded as one component in an actual device.

The imaging device includes a first layer 1100 including the transistor 51 provided on the silicon substrate 40, and the photodiode 60 and a light-controlling layer 64 provided in the silicon substrate 40; a second layer 1200 including a wiring layer 71 and insulating layers 81 and 82; a third layer 1300 including the transistors 52 and 53 and an insulating layer 83; and a fourth layer 1400 including wiring layers 72, wiring layers 73, and insulating layers 84 and 85. The first layer 1100, the second layer 1200, the third layer 1300, and the fourth layer 1400 are stacked in this order.

There are a case where one or more of the wirings are not provided and a case where another wiring or transistor is included in any of the layers. Furthermore, another layer may be included in the stacked-layer structure. In addition, one or more of the layers are not included in some cases. The insulating layers 81 to 85 each function as an interlayer insulating film.

The side surface of the photodiode 60 included in the first layer 1100 is surrounded by the light-controlling layer 64. The light-controlling layer 64 also functions as an element separation layer between the photodiode and an adjacent photodiode. Light passing through the light-receiving surface toward the side surface of the photodiode 60 is reflected or attenuated by the light-controlling layer 64. Thus, the light can be prevented from entering the photodiode 60 of an adjacent pixel, so that an image with little noise can be obtained.

A material which has a lower refractive index than silicon is preferably used for the light-controlling layer 64. For example, the light-controlling layer 64 can be formed using an insulator such as aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. An organic material such as an acrylic resin or a polyimide may be used. Use of a material having a lower refractive index than silicon readily allows total reflection of light incident on the side surface of the photodiode 60. Furthermore, a gas such as air, nitrogen, oxygen, argon, or helium can be used instead of the above material. In this case, the gas may have a pressure lower than an atmospheric pressure.

A material which efficiently absorbs light may be used for the light-controlling layer 64. For example, it is possible to use a resin to which a material such as a carbon-based black pigment (e.g., carbon black), a titanium-based black pigment (e.g., titanium black), an oxide of iron, a composite oxide of copper and chromium, or a composite oxide of copper, chromium, and zinc is added.

Figure 58C:
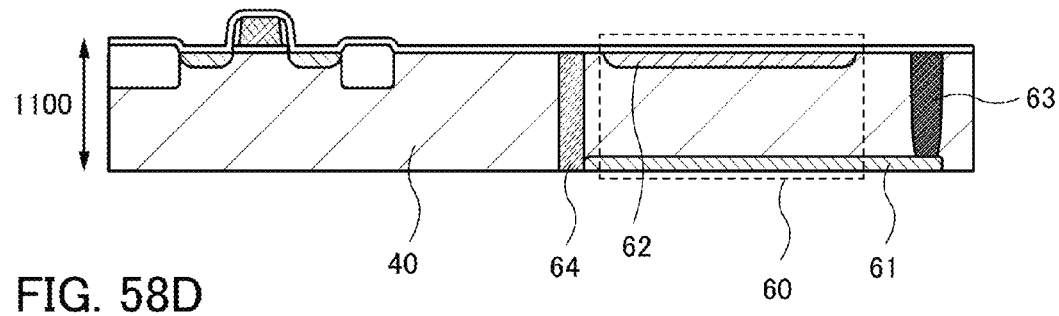

Note that as illustrated in FIG. 58C, part of the side surface of the photodiode 60 may not be provided with the light-controlling layer 64. Here, a metal such as tungsten, tantalum, titanium, or aluminum is used for the low-resistance region 63 to reflect incident light so that the low-resistance region 63 functions as the light-controlling layer. Alternatively, a metal having low reflectivity, such as molybdenum or chromium, may be used.

Figure 58D:
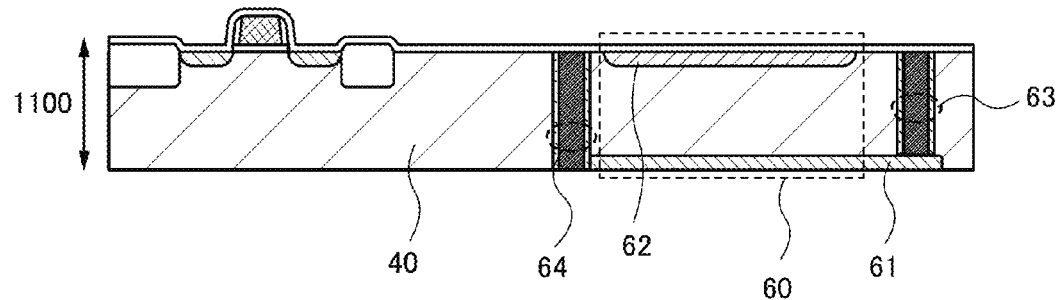

As illustrated in FIG. 58D, the metal may passed through the light-controlling layer 64. Note that part of the metal in the light-controlling layer 63 can be electrically connected to the anode 61 of the photodiode 60.

A top shape of a portion denoted by a dashed-dotted line A1-A2 in FIG. 1A (the photodiode portion) in the depth direction of the drawing can be any of shapes illustrated in FIGS. 59A to 59F, for example.

Figure 59A:
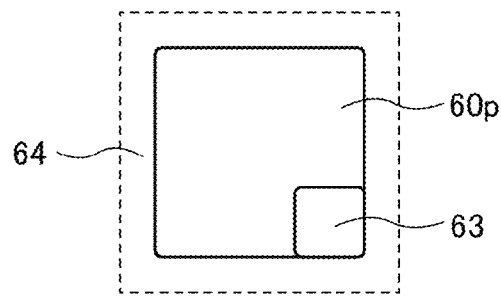
FIGS. 59A to 59F are top views each illustrating a photodiode portion.

In FIG. 59A, the top surface of a light-receiving portion 60p of the photodiode 60 has a substantially quadrangular shape, and the light-controlling layer 64 is provided around the light-receiving portion 60p.

Figure 59B:
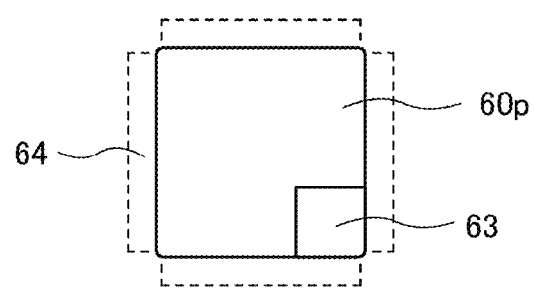

In FIG. 59B, the top surface of the light-receiving portion 60p has a substantially quadrangular shape, and the light-controlling layer 64 is provided on part of the periphery of the light-receiving portion 60p. Note that the top surfaces of the light-receiving portions 60p in FIGS. 59A and 59B each have a substantially square shape; however, the top surface may have, for example, a substantially rectangular shape or a substantially trapezoidal shape.

Figure 59C:
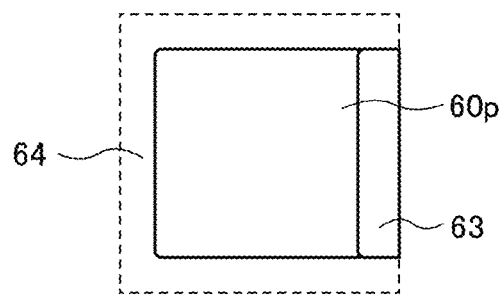

FIG. 59C illustrates an example of a top view of the photodiode portion in the structure of FIG. 58C.

Figure 59D:
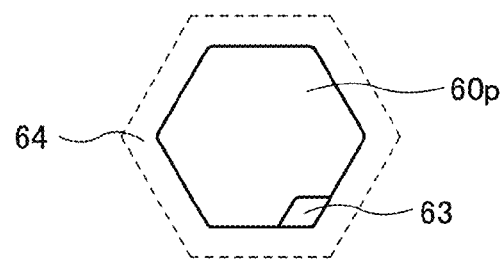

In FIG. 59D, the top surface of the light-receiving portion 60p has a substantially hexagonal shape, and the light-controlling layer 64 is provided around the light-receiving portion 60p.

Figure 59E:
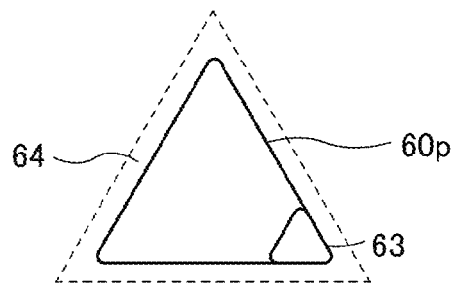

In FIG. 59E, the top surface of the light-receiving portion 60p has a substantially triangular shape, and the light-controlling layer 64 is provided around the light-receiving portion 60p.

Figure 59F:
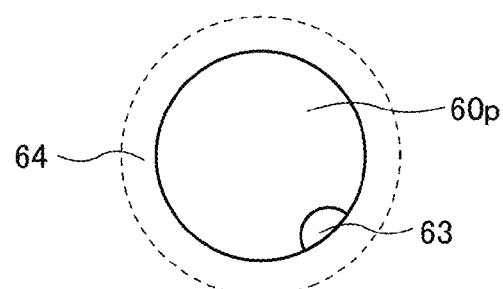

In FIG. 59F, the top surface of the light-receiving portion 60p has a substantially circular shape, and the light-controlling layer 64 is provided around the light-receiving portion 60p.

A structure in which the light-controlling layer 64 is provided on part of the periphery of the light-receiving portion 60p may be employed also in the structures illustrated in any of FIGS. 59C to 59F. The top surface of the light-receiving portion 60p may have a polygonal shape or an elliptical shape other than the aforementioned shapes.

The low-resistance region 63 may have a structure including the metal as illustrated in FIG. 58B. The light-controlling layer 64 may have a structure including the conductor as illustrated in FIG. 58D.

Since the side surface of the photodiode is covered with the light-controlling layer 64 or the like as described above, light which travels toward the side surface of the photodiode 60 from a variety of angles can be reflected into the photodiode 60 or attenuated.

Figure 60A:
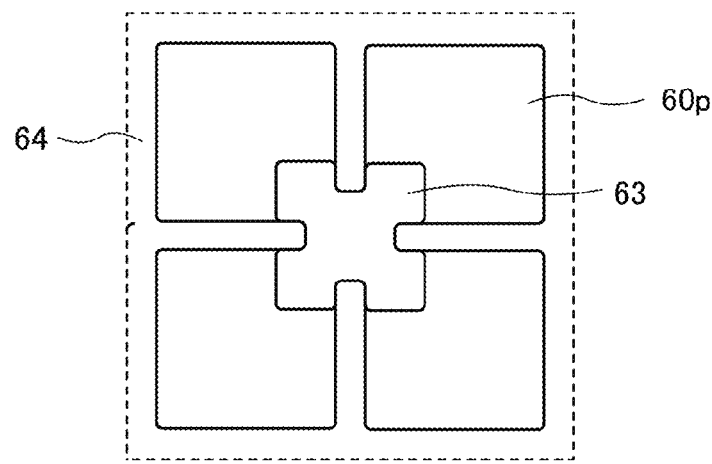
FIGS. 60A to 60C are top views each illustrating a photodiode portion.

The low-resistance region 63 can be shared by a plurality of photodiodes (a plurality of pixels). Sharing the low-resistance region 63 can reduce the number of wirings and the like. For example, in the case where the top surface of the light-receiving portion 60p has a substantially quadrangular shape as illustrated in FIG. 59A, the low-resistance region 63 can be shared by four photodiodes as illustrated in FIG. 60A.

Figure 60B:
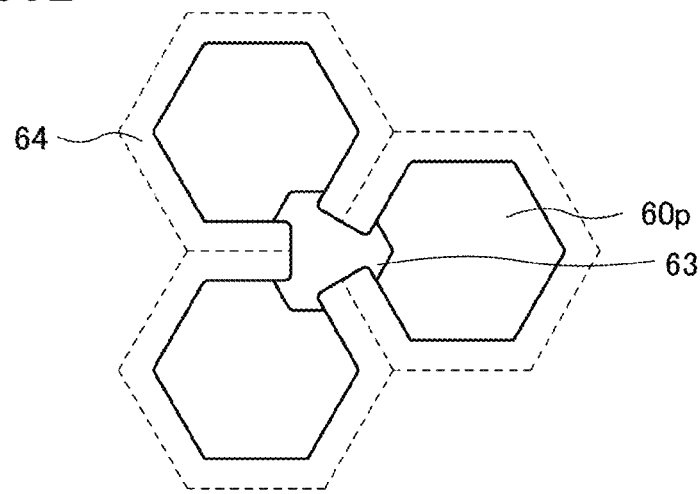

In the case where the top surface of the light-receiving portion 60p has a substantially hexagonal shape as illustrated in FIG. 59D, the low-resistance region 63 can be shared by three photodiodes as illustrated in FIG. 60B.

Figure 60C:
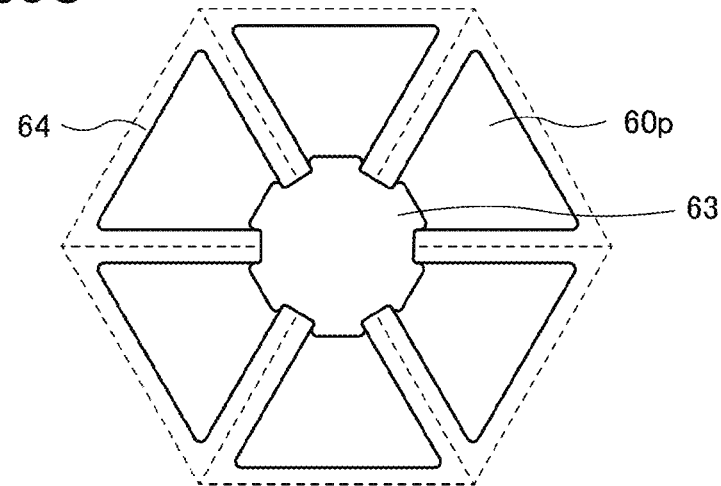

In the case where the top surface of the light-receiving portion 60p has a substantially triangular shape as illustrated in FIG. 59E, the low-resistance region 63 can be shared by six photodiodes as illustrated in FIG. 60C.

Note that the silicon substrate 40 is not limited to a bulk silicon substrate and may be an SOI substrate. Furthermore, the silicon substrate 40 can be replaced with a substrate made of germanium, silicon germanium, silicon carbide, gallium arsenide, aluminum gallium arsenide, indium phosphide, gallium nitride, or an organic semiconductor.

In the aforementioned stacked-layer structure, an insulating layer 80 is provided between the first layer 1100 including the transistor 51 and the photodiode 60 and the third layer 1300 including the transistors 52 and 53.

Dangling bonds of silicon are terminated with hydrogen in an insulating layer provided in the vicinity of the active region of the transistor 51. Therefore, the hydrogen has an effect of improving the reliability of the transistor 51. Meanwhile, hydrogen in insulating layers which are provided in the vicinities of the oxide semiconductor layers that are the active layers of the transistors 52 and 53 and the like causes generation of carriers in the oxide semiconductor layers. Therefore, the hydrogen may reduce the reliability of the transistors 52 and 53 and the like. Thus, in the case where the layer including a transistor using a silicon-based semiconductor material and the other layer including a transistor using an oxide semiconductor are stacked, it is preferable that the insulating layer 80 having a function of preventing diffusion of hydrogen be provided between these layers. Hydrogen is confined in the one layer by the insulating layer 80, whereby the reliability of the transistor 51 can be improved. Furthermore, diffusion of hydrogen from the one layer to the other layer is prevented, whereby the reliability of each of the transistors 52 and 53 and the like can be increased.

The insulating layer 80 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

The transistor 52 and the photodiode 60 form a circuit 91, and the transistor 51 and the transistor 53 form a circuit 92. The circuit 91 can function as a pixel circuit, and the circuit 92 can function as a driver circuit for driving the circuit 91.

Figure 1B:
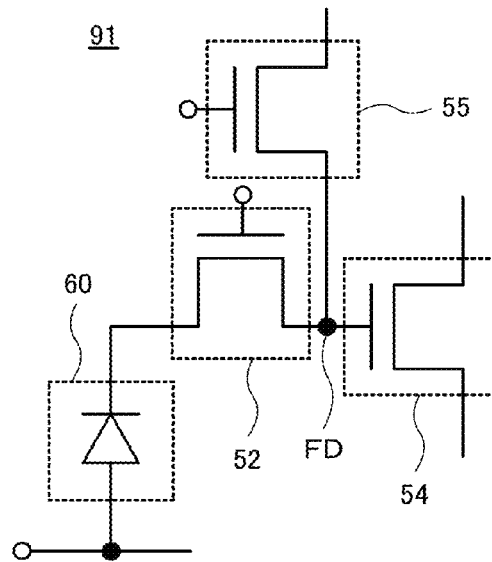

The circuit 91 can have a configuration shown in a circuit diagram of FIG. 1B. One of a source and a drain of the transistor 52 is electrically connected to a cathode 62 of the photodiode 60; and the other of the source and the drain of the transistor 52, a gate of a transistor 54 (not illustrated in FIG. 1A), one of a source and a drain of a transistor 55 (not illustrated in FIG. 1A) are electrically connected to a charge storage portion (FD).

Specifically, the charge storage portion is formed of the depletion layer capacitance of the sources or the drains of the transistors 52 and 53, the gate capacitance of the transistor 54, wiring capacitance, and the like.

Here, the transistor 52 can function as a transfer transistor for controlling the potential of the charge storage portion (FD) in response to output of the photodiode 60. The transistor 54 can function as an amplifying transistor configured to output a signal corresponding to the potential of the charge storage portion (FD). The transistor 55 can function as a reset transistor for initializing the potential of the charge storage portion (FD).

Figure 1C:
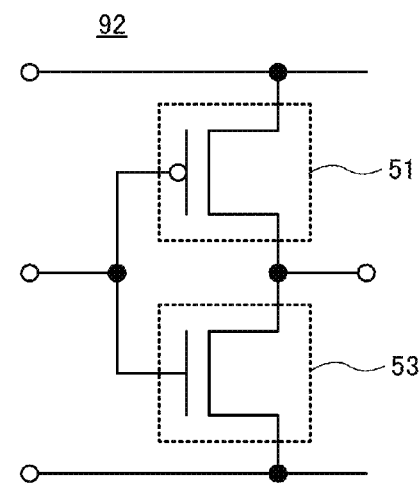

The circuit 92 may include a CMOS inverter shown in a circuit diagram of FIG. 1C, for example. A gate of the transistor 51 is electrically connected to a gate of the transistor 53. One of a source and a drain of the transistor 51 is electrically connected to one of a source and a drain of the transistor 53. The other of the source and the drain of the transistor 51 is electrically connected to a wiring and the other of the source and the drain of the transistor 53 is electrically connected to another wiring. In other words, the transistor 51 including the active region in the silicon substrate and the transistor 53 including the oxide semiconductor layer as the active layer form the CMOS circuit.

In the imaging device, the transistor 51 including the active region in the silicon substrate 40 is a p-channel transistor, and the transistors 52 to 55 each including the oxide semiconductor layer as the active layer are n-channel transistors.

All the transistors included in the circuit 91 are formed in the third layer 1300, in which a structure making electrical connection therebetween can be simplified, resulting in a simplified manufacturing process.

Extremely low off-state current characteristics of the transistor including an oxide semiconductor can widen the dynamic range of image-capturing. In the circuit shown in FIG. 1B, an increase in the intensity of light entering the photodiode 60 reduces the potential of the charge storage portion (FD). Since the transistor using an oxide semiconductor has an extremely small off-state current, a current corresponding to the gate potential can be accurately output even when the gate potential is extremely low. Thus, it is possible to widen the detection range of illuminance, i.e., the dynamic range.

A period during which charge can be retained in the charge storage portion (FD) can be extremely long owing to the low off-state current characteristics of the transistors 52 and 55. Therefore, a global shutter system, in which accumulation operation is performed in all the pixel circuits at the same time, can be used without a complicated circuit configuration and operation method, and thus, an image with little distortion can be easily obtained even in the case of a moving object. Furthermore, exposure time (a period for conducting charge accumulation operation) can be long in a global shutter system; thus, the imaging device is suitable for image-capturing even in a low illuminance environment.

In addition, the transistor including an oxide semiconductor has lower temperature dependence of change in electrical characteristics than the transistor including silicon, and thus can be used at an extremely wide range of temperatures. Therefore, an imaging device and a semiconductor device which include transistors formed using an oxide semiconductor are suitable for use in automobiles, aircrafts, and spacecrafts.

It is preferred that the transistors 52 and 55 and the like which are used for controlling the potential of the charge storage portion (FD) be transistors with little noise. A transistor including two or three oxide semiconductor layers, which is described later, has a buried channel, and thus has extremely high resistance to noise; therefore, use of the transistor makes it possible to obtain an image with little noise.

In the circuit 91, the photodiode 60 provided in the first layer 1100 and the transistor provided in the third layer 1300 can be formed to overlap each other; thus, the integration degree of pixels can be increased. In other words, the resolution of the imaging device can be increased. Furthermore, since no transistor is formed in the silicon substrate in the circuit 91, the area of the photodiode can be large. Thus, an image with little noise can be obtained even in a low illuminance environment.

Formation of the circuit 92 does not require a process for forming an n-channel transistor including an active region in the silicon substrate 40; therefore, steps of forming a p-type well, an n-type impurity region, and the like can be omitted and the number of steps can be drastically reduced. Moreover, the n-channel transistor of the CMOS circuit can be formed at the same time as the transistors included in the circuit 91.

In the imaging device shown in FIGS. 1A to 1C, a surface of the silicon substrate 40 opposite to a surface where the transistor 51 is formed includes a light-receiving surface of the photodiode 60. Therefore, an optical path can be secured without the influence by the transistors or wirings, and therefore, a pixel with a high aperture ratio can be formed. Note that the light-receiving surface of the photodiode 60 can be the same as the surface where the transistor 51 is formed.

Note that the structure of the transistors and the photodiode included in the imaging device described in this embodiment is only an example. Therefore, for example, the circuit 91 may be formed using transistors in which active regions or an active layers include silicon or the like. Furthermore, the circuit 92 may be formed using transistors including an oxide semiconductor layer as an active layer. In addition, an amorphous silicon layer may be used as a photoelectric conversion layer of the photodiode 60. The transistor 51 including the active region in the silicon substrate 40 can be an n-channel transistor.

Figure 2A:
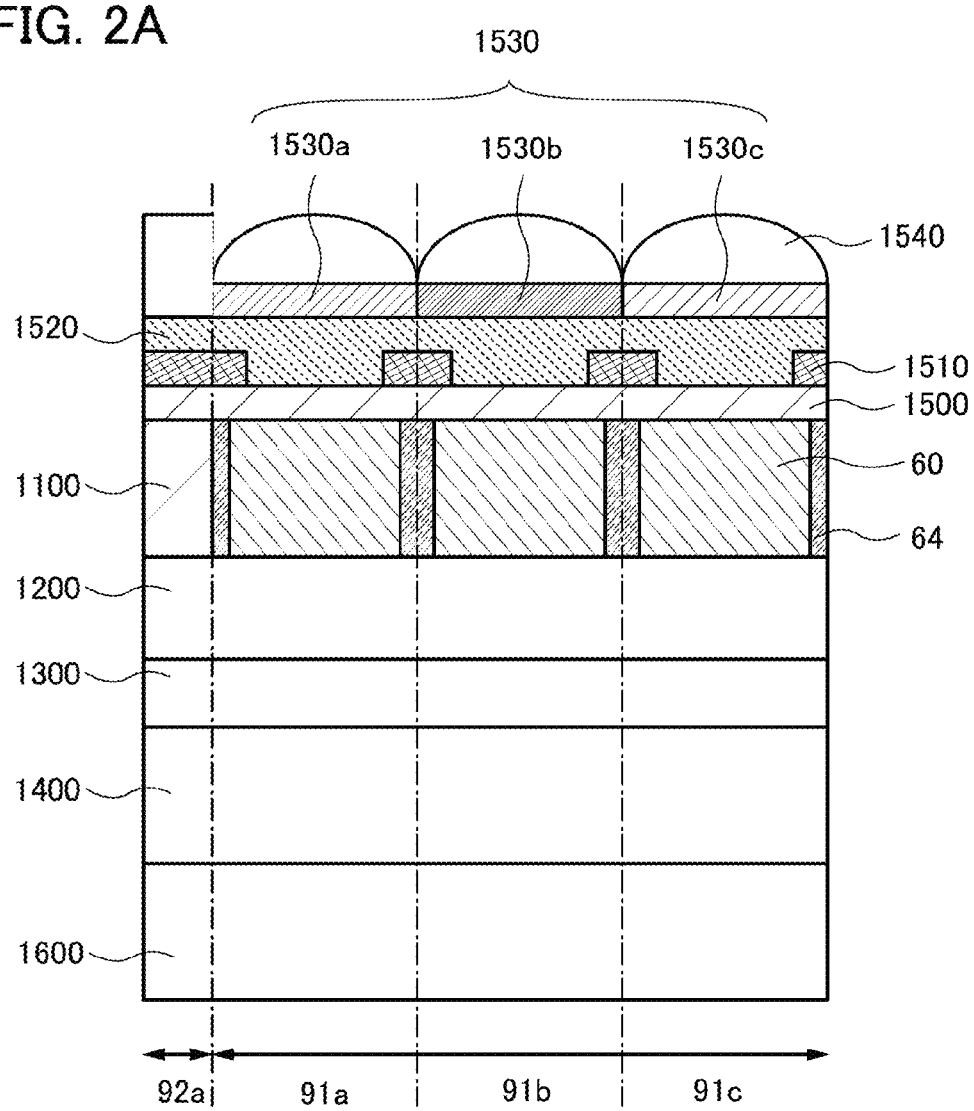
FIGS. 2A and 2B are cross-sectional views of an imaging device.
Figure 56A:
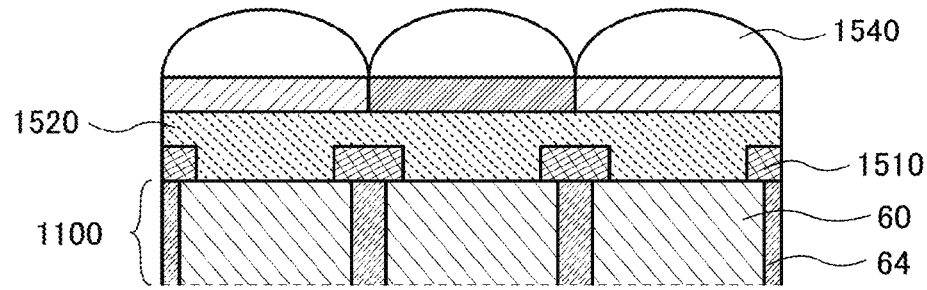
FIGS. 56A to 56D are cross-sectional views each illustrating an imaging device.

FIG. 2A is a cross-sectional view of an example of a mode in which color filters and the like are added to the imaging device in FIG. 1A, illustrating three regions (region 91a, 91b, and 91c) corresponding to three pixels and each including the circuit 91 and a region 92a including the circuit 92. An insulating layer 1500 is formed over the photodiode 60 provided in the first layer 1100. As the insulating layer 1500, for example, a silicon oxide film with a high visible-light transmitting property can be used. In addition, a silicon nitride film may be stacked as a passivation film. A dielectric film of hafnium oxide or the like may be stacked as an anti-reflection film. Note that as illustrated in FIG. 56A, a structure not including the insulating layer 1500 may be employed.

Figure 56B:
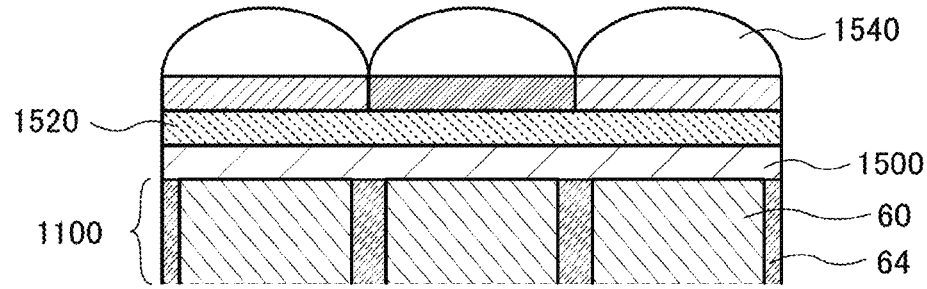

A light-blocking layer 1510 is formed over the insulating layer 1500. The light-blocking layer 1510 has a function of inhibiting color mixing of light passing through the color filter. Furthermore, the light-blocking layer 1510 over the region 92a has a function of inhibiting a change in characteristics of the transistor including the active region in the silicon substrate 40 due to light irradiation. The light-blocking layer 1510 can be formed of a metal layer of aluminum, tungsten, or the like, or a stack including the metal layer and a dielectric film functioning as an anti-reflection film. Note that as illustrated in FIG. 56B, a structure not including the light-blocking layer 1510 may be employed.

Figure 56C:
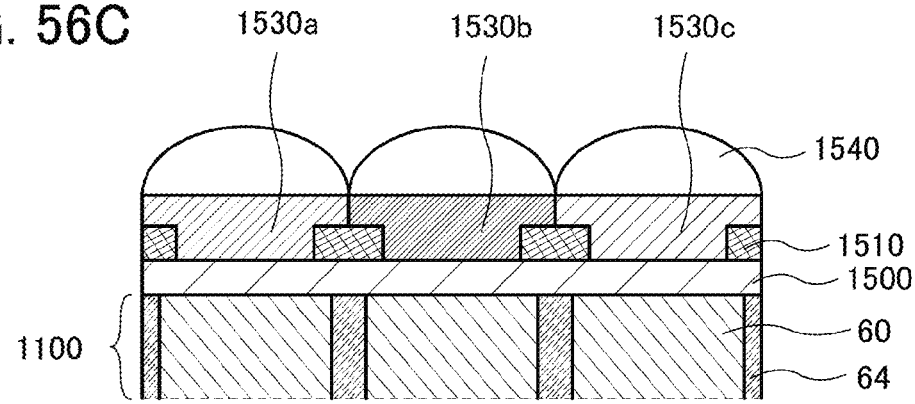
Figure 56D:
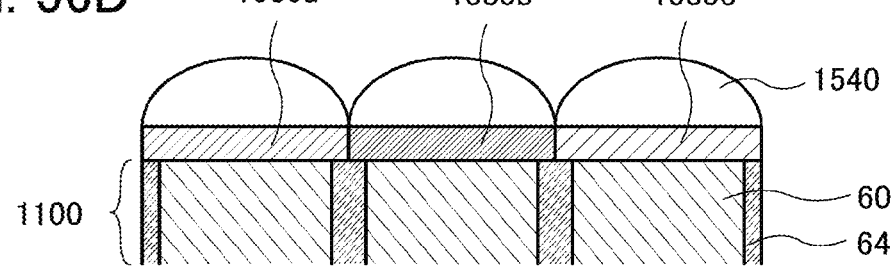

An organic resin layer 1520 is formed as a planarization film over the insulating layer 1500 and the light-blocking layer 1510. A color filter 1530a, a color filter 1530b, and a color filter 1530c are formed over the region 91a, the region 91b, and the region 91c to be paired up with the region 91a, the region 91b, and the region 91c, respectively. The color filter 1530a, the color filter 1530b, and the color filter 1530c have colors of R (red), G (green), and B (blue), whereby a color image can be obtained. Note that as illustrated in FIG. 56C, a structure not including the organic resin layer 1520 may be employed. Alternatively, as illustrated in FIG. 56D, a structure including none of the insulating layer 1500, the light-blocking layer 1510, and the organic resin layer 1520 may be employed. Alternatively, although not illustrated, a structure not including any two of the insulating layer 1500, the light-blocking layer 1510, and the organic resin layer 1520 may be employed.

A microlens array 1540 is provided over the color filters 1530a, 1530b, and 1530c. Thus, light passing through the lenses included in the microlens array 1540 further passes through the color filters positioned under the lenses to reach the photodiodes.

As illustrated in FIG. 57A, the light-blocking layer 1510 may be provided between the color filters.

As illustrated in FIG. 57B, the light-blocking layer 1510 may be provided to cover the boundary between the lenses of the microlens array 1540.

As illustrated in FIG. 57C, a structure in which the light-blocking layer 1510 is not provided and the light-controlling layer 64 extends to the space between the color filters may be employed.

As illustrated in FIG. 57D, a structure in which the light-blocking layer 1510 is not provided and the light-controlling layer 64 extends to the space between the lenses of the microlens array 1540 may be employed.

Figure 61A:
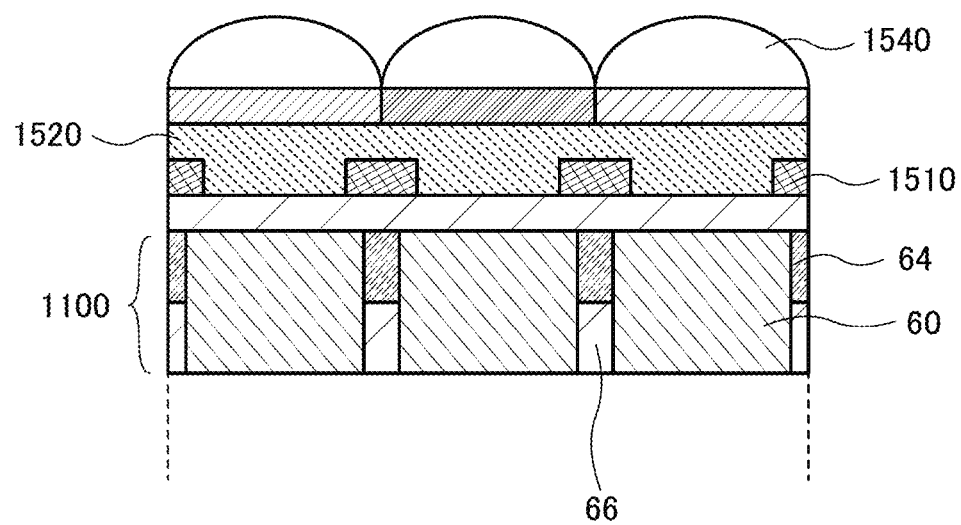
FIGS. 61A and 61B are cross-sectional views each illustrating an imaging device.
Figure 61B:
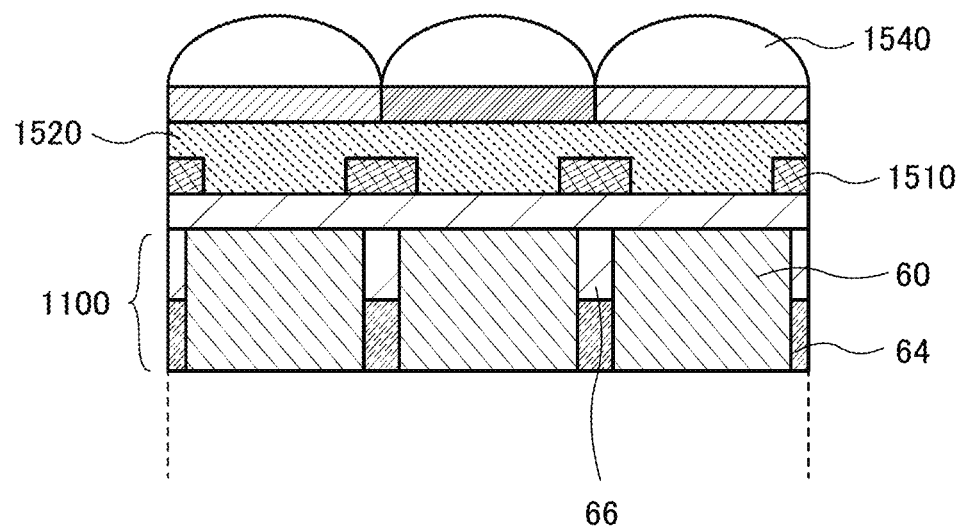

The light-controlling layer 64 may not necessarily cover the entire side surface of the photodiode 60, and may be formed to cover part of the side surface of the photodiode 60 which is close to the light-receiving surface as illustrated in FIG. 61A. Alternatively, as illustrated in FIG. 61B, the light-controlling layer 64 may be formed to cover part of the side surface of the photodiode 60 which is away from the light-receiving surface. Note that a region 66 is part of the silicon substrate 40 and may be part of the structure of the photodiode 60.

Figure 62A:
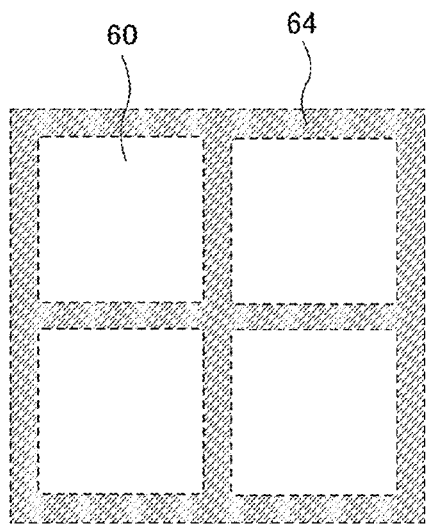
FIGS. 62A to 62D are top views illustrating an imaging device.
Figure 62B:
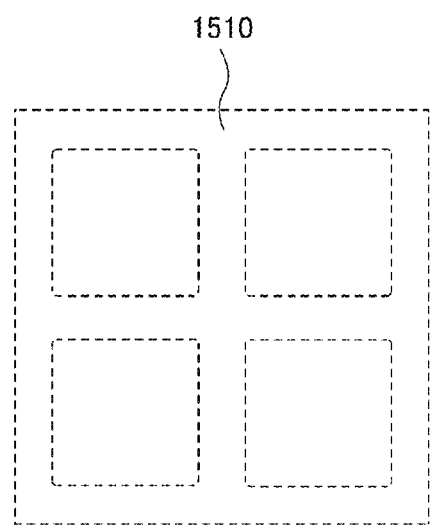
Figure 62C:
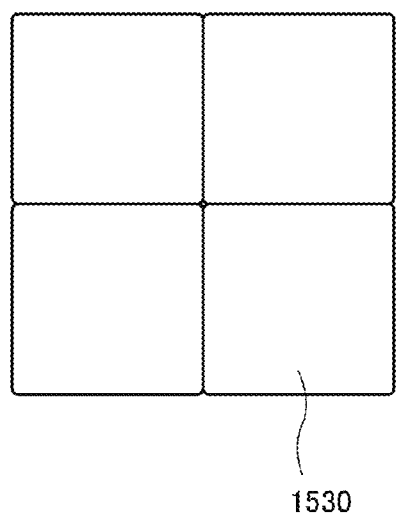
Figure 62D:
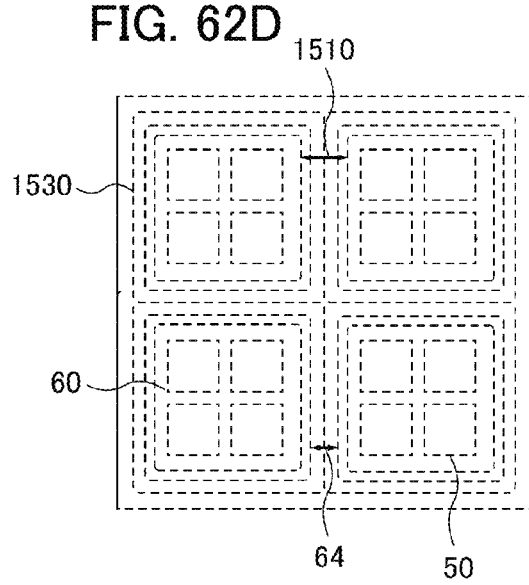

FIG. 62A is a top view of the photodiodes 60 and the light-controlling layer 64. FIG. 62B is a top view of the light-blocking layer 1510. FIG. 62C is a top view of color filters 1530. FIG. 62D illustrates a structure in which the components of FIGS. 62A to 62C and transistors 50 included in the circuit 91 overlap one another. Since the transistors 50 included in the circuit 91 and the photodiode 60 can be provided to overlap one another, the aperture ratio of the photodiode 60 can be increased.

A supporting substrate 1600 is provided in contact with the fourth layer 1400. As the supporting substrate 1600, a hard substrate such as a semiconductor substrate (e.g., a silicon substrate), a glass substrate, a metal substrate, or a ceramic substrate can be used. Note that an inorganic insulating layer or an organic resin layer may be between the fourth layer 1400 and the supporting substrate 1600.

The circuits 91 and 92 may be connected to a power supply circuit, a controlling circuit, or the like provided on the outside with the wiring layer 72 or the wiring layer 73 in the fourth layer 1400.

Figure 2B:
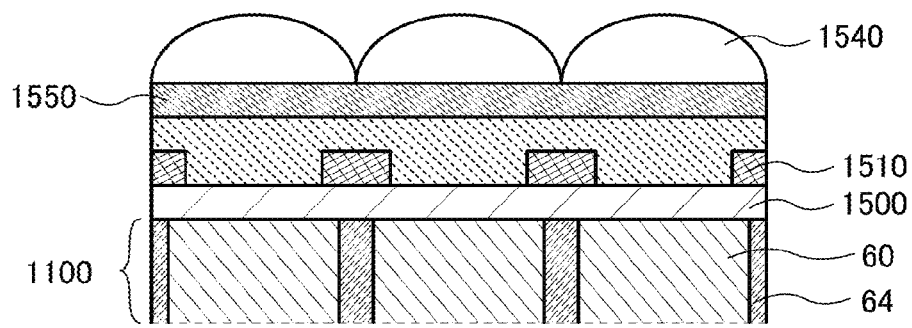

In the structure of the imaging device, when an optical conversion layer 1550 (see FIG. 2B) is used instead of the color filters 1530a, 1530b, and 1530c, the imaging device can take images in various wavelength regions.

For example, when a filter which blocks light having a wavelength shorter than or equal to that of visible light is used as the optical conversion layer 1550, an infrared imaging device can be obtained. When a filter which blocks light having a wavelength shorter than or equal to that of near infrared light is used as the optical conversion layer 1550, a far-infrared imaging device can be obtained. When a filter which blocks light having a wavelength longer than or equal to that of visible light is used as the optical conversion layer 1550, an ultraviolet imaging device can be obtained.

Note that in the case of an infrared imaging device, the sensitivity to infrared light may be increased by adding germanium is added to narrow the band gap of the photoelectric conversion layer of the photodiode 60. In the case of an ultraviolet imaging device, the sensitivity to ultraviolet rays may be increased with the use of an oxide semiconductor layer or the like with a wide band gap as the photoelectric conversion layer of the photodiode 60.

Furthermore, when a scintillator is used as the optical conversion layer 1550, an imaging device which captures an image visualizing the intensity of radiation and is used for an X-ray imaging device, for example, can be obtained. Radiation such as X-rays passes through a subject to enter a scintillator, and then is converted into light (fluorescence) such as visible light or ultraviolet light owing to a phenomenon known as photoluminescence. Then, the photodiode 60 detects the light to obtain image data. Furthermore, the imaging device having the structure may be used in a radiation detector or the like.

A scintillator is formed of a substance that, when irradiated with radial rays such as X-rays or gamma-rays, absorbs energy of the radial rays to emit visible light or ultraviolet light or a material containing the substance. Examples of the known materials include $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO, and a resin or ceramics in which any of the materials is dispersed.

Figure 3A:
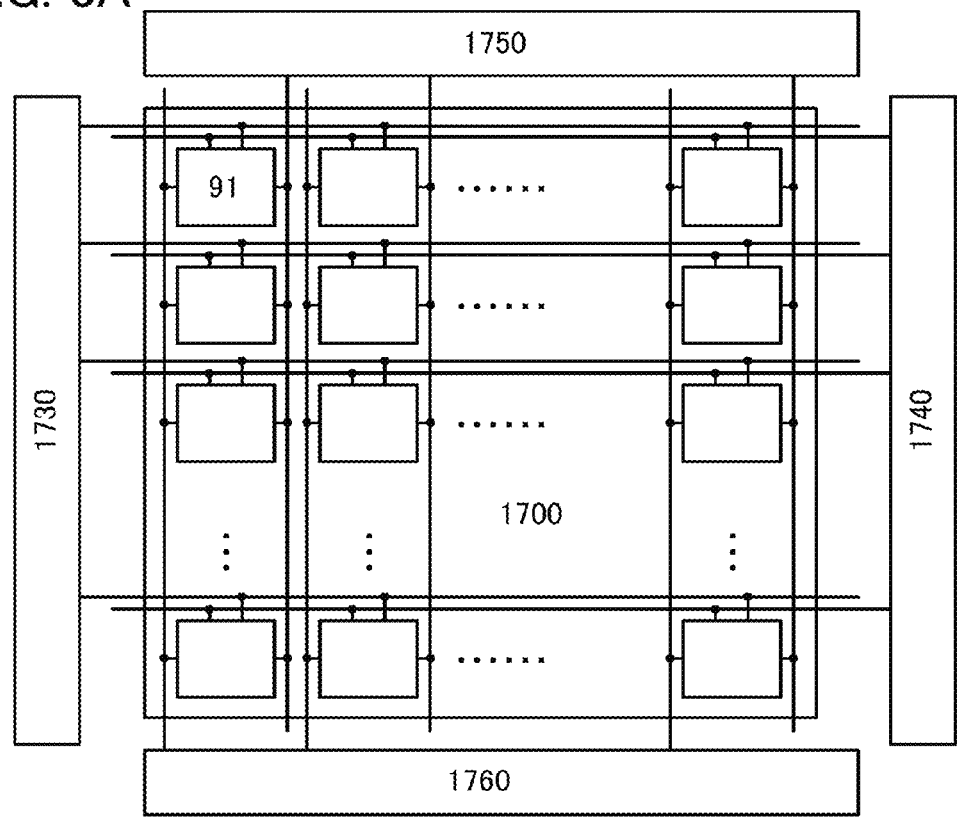
FIGS. 3A and 3B illustrate the structure of an imaging device.
Figure 3B:
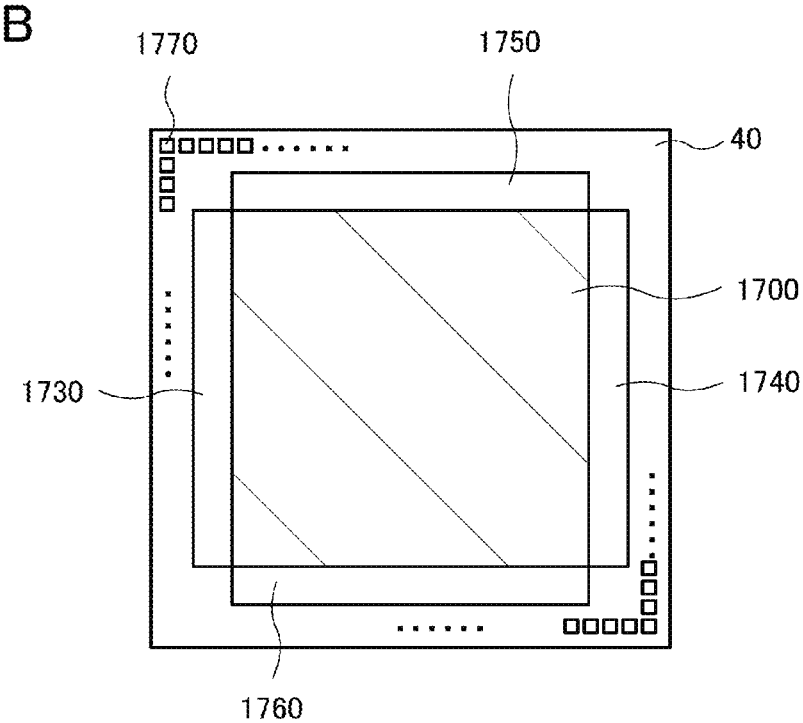

FIGS. 3A and 3B are schematic views illustrating the configuration of the imaging device. A circuit 1730 and a circuit 1740 are provided on the sides of a pixel matrix 1700 including the circuit 91. The circuit 1730 can serve as a driver circuit for a reset transistor, for example. In this case, the circuit 1730 is electrically connected to the transistor 55 in FIG. 1B. The circuit 1740 can serve as a driver circuit for a transfer transistor, for example. In this case, the circuit 1740 is electrically connected to the transistor 52 in FIG. 1B. Note that although the circuit 1730 and the circuit 1740 are separately provided in FIGS. 3A and 3B, the circuit 1730 and the circuit 1740 may be collectively arranged in one region.

A circuit 1750 is connected to the pixel matrix 1700. For example, the circuit 1750 can function as a driver circuit which selects a vertical output line which is to be electrically connected to the transistor 54.

A circuit 1760 may be connected to the pixel matrix 1700. The circuit 1760 can have a function of a circuit separated from the circuit 1750, a power supply circuit, a memory circuit, or the like. Note that a structure not including the circuit 1760 may be employed.

An example of a specific positional relationship of the circuits is illustrated in FIG. 3B. For example, the circuit 1730, the circuit 1740, the circuit 1750, and the circuit 1760 are provided in the respective four regions. Note that the position and the occupation area of each circuit are not limited to those illustrated in FIG. 3B. The pixel matrix 1700 is provided on the inside of the regions where these circuits are provided. Signal lines, power supply lines, and the like connected to the circuit 1730, the circuit 1740, the circuit 1750, the circuit 1760, and the pixel circuits in the pixel matrix 1700 are electrically connected to wirings formed over the silicon substrate 40. Furthermore, the wirings are electrically connected to terminals 1770 formed in the inner periphery of the silicon substrate 40. The terminals 1770 formed on the silicon substrate 40 can be electrically connected to an external circuit by wire bonding or the like.

Figure 4A:
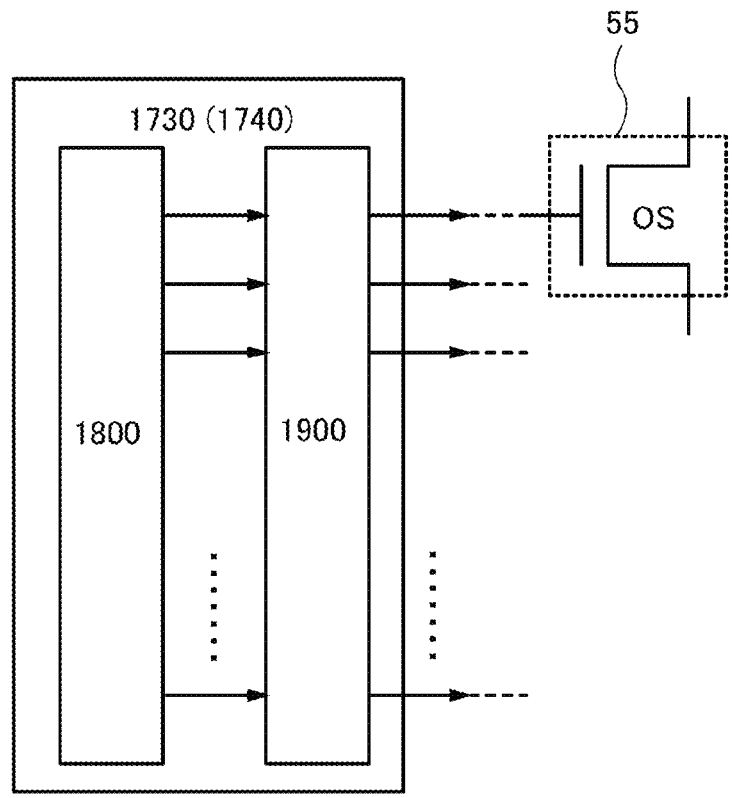
FIGS. 4A and 4B illustrate driver circuits of an imaging device.

The circuit 1730 and the circuit 1740 are each a driver circuit that outputs signals having binary values of high level and low level; therefore, their operations can be conducted with a combination of a shift register 1800 and a buffer circuit 1900 as illustrated in FIG. 4A.

Figure 4B:
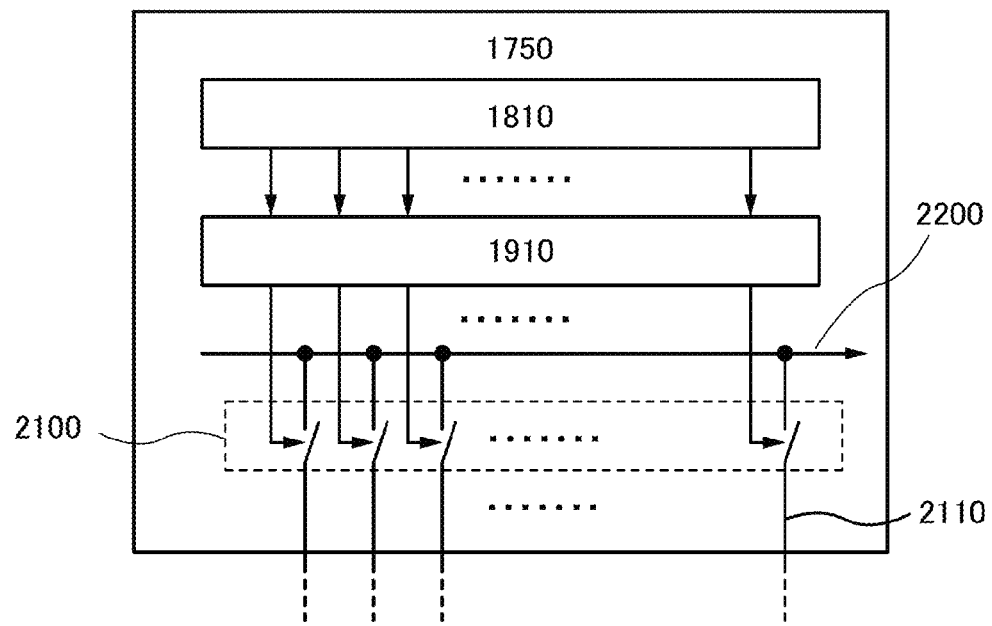

The circuit 1750 can include a shift register 1810, a buffer circuit 1910, and analog switches 2100, as illustrated in FIG. 4B. Vertical output lines 2110 are selected with the analog switches 2100, and the potentials of the selected output lines 2110 are output to an image output line 2200. The analog switches 2100 are sequentially selected by the shift register 1810 and the buffer circuit 1910.

In one embodiment of the present invention, one or more of the circuit 1730, the circuit 1740, and the circuit 1750 include the circuit 92. That is, one or more of the shift register 1800, the buffer circuit 1900, the shift register 1810, the buffer circuit 1910, and the analog switches 2100 include a CMOS circuit including a p-channel transistor including an active region in silicon substrate 40 and an n-channel transistor including an oxide semiconductor layer as an active layer.

In Embodiment 1, one embodiment of the present invention has been described. Other embodiments of the present invention are described in Embodiments 2 to 7. Note that one embodiment of the present invention is not limited to the above examples. Although an example in which one embodiment of the present invention is applied to an imaging device is described, one embodiment of the present invention is not limited thereto. Depending on circumstances, one embodiment of the present invention is not necessarily applied to an imaging device. One embodiment of the present invention may be applied to a semiconductor device with an another function, for example.

This embodiment can be implemented in an appropriate combination with any of the structures described in the other embodiments.

Embodiment 2

In this embodiment, the circuit 91 described in Embodiment 1 is described.

Figure 5A:
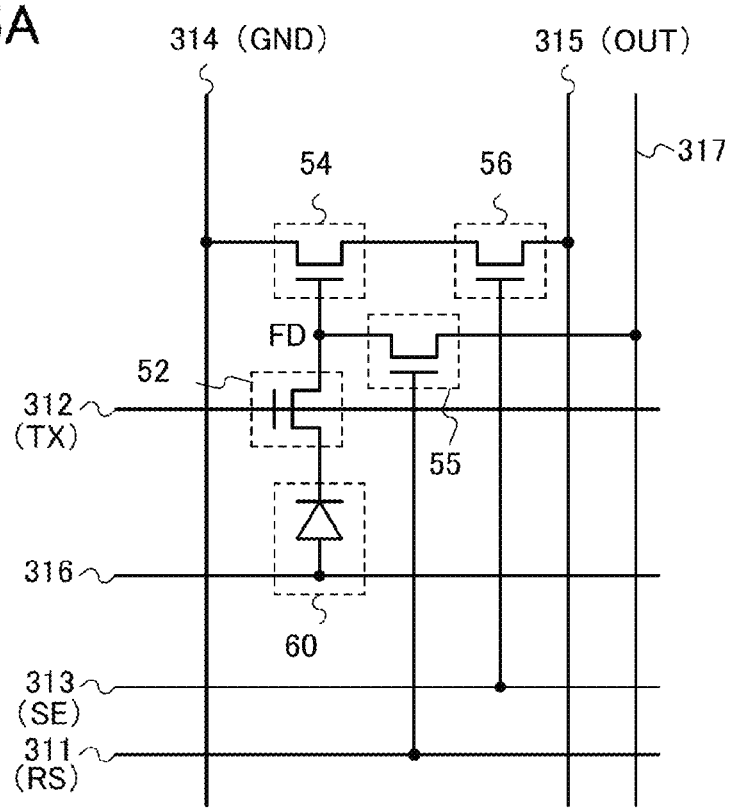
FIGS. 5A and 5B each illustrate a configuration of a pixel circuit.

FIG. 5A shows details of connections between the circuit 91 in FIG. 1B and a variety of wirings. The circuit in FIG. 5A includes the photodiode 60, the transistor 52, the transistor 54, the transistor 55, and a transistor 56.

The anode of the photodiode 60 is electrically connected to a wiring 316, and the cathode of the photodiode 60 is electrically connected to one of the source and the drain of the transistor 52. The other of the source and the drain of the transistor 52 is electrically connected to the charge storage portion (FD), and a gate of the transistor 52 is electrically connected to a wiring 312 (TX). One of a source and a drain of the transistor 54 is electrically connected to a wiring 314 (GND), the other of the source and the drain of the transistor 54 is electrically connected to one of a source and a drain of the transistor 56, and the gate of the transistor 54 is electrically connected to the charge storage portion (FD). One of the source and the drain of the transistor 55 is electrically connected to the charge storage portion (FD), the other of the source and the drain of the transistor 55 is electrically connected to a wiring 317, and a gate of the transistor 55 is electrically connected to a wiring 311 (RS). The other of the source and the drain of the transistor 56 is electrically connected to a wiring 315 (OUT), and a gate of the transistor 56 is electrically connected to a wiring 313 (SE). Note that all the above connections are electrical connections.

A potential such as GND, VSS, or VDD may be supplied to the wiring 314. Here, a potential or a voltage has a relative value. Therefore, the potential GND is not necessarily 0 V.

The photodiode 60 is a light-receiving element and can have a function of generating current corresponding to the amount of light incident on the pixel circuit. The transistor 52 can have a function of controlling supply of charge from the photodiode 60 to the charge storage portion (FD). The transistor 54 can have a function of executing an operation of outputting a signal which corresponds to the potential of the charge storage portion (FD). The transistor 55 can have a function of executing an operation of resetting the potential of the charge storage portion (FD). The transistor 56 can have a function of executing an operation of controlling selection of the pixel circuit at the time of reading.

Note that the charge storage portion (FD) is a charge retention node and retains charge that is changed depending on the amount of light received by the photodiode 60.

Note that the transistor 54 and the transistor 56 can be connected in series between the wiring 315 and the wiring 314. The wiring 314, the transistor 54, the transistor 56, and the wiring 315 may be arranged in order, or the wiring 314, the transistor 56, the transistor 54, and the wiring 315 may be arranged in order.

The wiring 311 (RS) can function as a signal line for controlling the transistor 55. The wiring 312 (TX) can function as a signal line for controlling the transistor 52. The wiring 313 (SE) can function as a signal line for controlling the transistor 56. The wiring 314 (GND) can function as a signal line for supplying a reference potential (e.g., GND). The wiring 315 (OUT) can function as a signal line for reading a signal output from the transistor 54. The wiring 316 can function a signal line for outputting charge from the charge storage portion (FD) through the photodiode 60 and is a low-potential line in the circuit in FIG. 5A. The wiring 317 can function as a signal line for resetting the potential of the charge storage portion (FD) and is a high-potential line in the circuit in FIG. 5A.

Figure 5B:
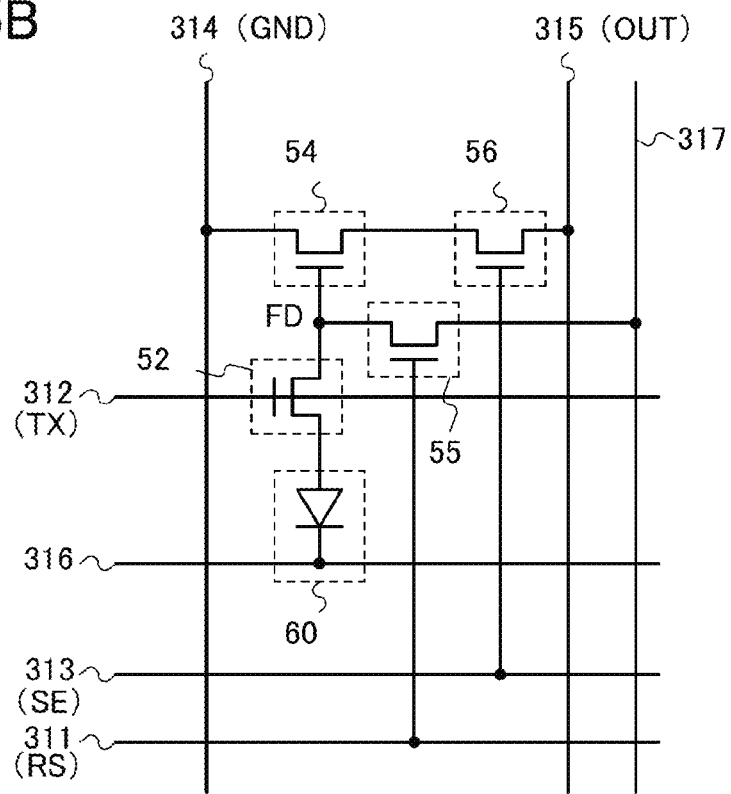

The circuit 91 may have a configuration illustrated in FIG. 5B. The circuit illustrated in FIG. 5B includes the same components as those in the circuit in FIG. 5A but is different from the circuit in that the anode of the photodiode 60 is electrically connected to one of the source and the drain of the transistor 52 and the cathode of the photodiode 60 is electrically connected to the wiring 316. In this case, the wiring 316 functions as a signal line for supplying charge to the charge storage portion (FD) through the photodiode 60 and is a high-potential line in the circuit in FIG. 5B. The wiring 317 is a low-potential line.

Next, a structure of each component illustrated in FIGS. 5A and 5B is described.

An element formed using a silicon substrate with a pn junction or a pin junction can be used as the photodiode 60, for example.

A silicon semiconductor such as amorphous silicon, microcrystalline silicon, polycrystalline silicon, or single crystal silicon can be used to form the transistor 52, the transistor 54, the transistor 55, and the transistor 56. An oxide semiconductor is preferably used to form the transistors. A transistor in which a channel formation region is formed of an oxide semiconductor has an extremely low off-state current.

In particular, when the transistors 52 and 55 connected to the charge storage portion (FD) has a high leakage current, charge accumulated in the charge storage portion (FD) cannot be retained for a sufficiently long time. The use of an oxide semiconductor for the transistors 52 and 55 prevents undesirable output of charge from the charge storage portion (FD).

Undesirable output of charge also occurs in the wiring 314 or the wiring 315 when the transistor 54 and the transistor 56 have a large leakage current; thus, transistors in which a channel formation region is formed of an oxide semiconductor are preferably used as these transistors.

Figure 6A:
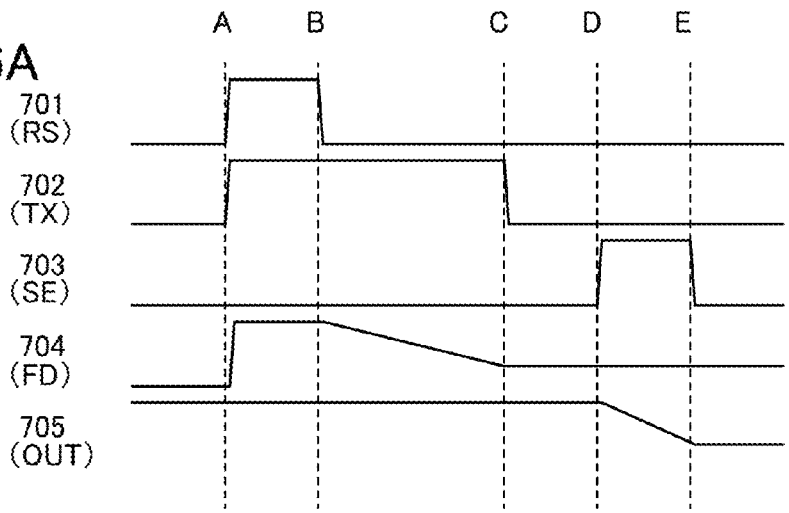
FIGS. 6A to 6C are timing charts showing the operation of a pixel circuit.

An example of the operation of the circuit in FIG. 5A is described using a timing chart shown in FIG. 6A.

In FIG. 6A, a potential of each wiring is denoted as a signal which varies between two levels for simplicity. Because each potential is an analog signal, the potential can, in practice, have various levels in accordance with situations without limitation on two levels. In the drawing, a signal 701 corresponds to the potential of the wiring 311 (RS); a signal 702, the potential of the wiring 312 (TX); a signal 703, the potential of the wiring 313 (SE); a signal 704, the potential of the charge storage portion (FD); and a signal 705, the potential of the wiring 315 (OUT). The potential of the wiring 316 is always at low level, and the potential of the wiring 317 is always at high level.

At time A, the potential of the wiring 311 (signal 701) is at high level and the potential of the wiring 312 (signal 702) is at high level, so that the potential of the charge storage portion (FD) (signal 704) is initialized to the potential of the wiring 317 (high level), and reset operation is started. The potential of the wiring 315 (signal 705) is precharged to high level.

At time B, the potential of the wiring 311 (signal 701) is set at low level, whereby the reset operation is completed to start accumulation operation. Here, a reverse bias is applied to the photodiode 60, whereby the potential of the charge storage portion (FD) (signal 704) starts to decrease due to a reverse current. Since irradiation of the photodiode 60 with light increases the reverse current, the rate of decrease in the potential of the charge storage portion (FD) (signal 704) changes depending on the amount of the light irradiation. In other words, channel resistance between the source and the drain of the transistor 54 changes depending on the amount of light emitted to the photodiode 60.

At time C, the potential of the wiring 312 (signal 702) is set to low level to complete the accumulation operation, so that the potential of the charge storage portion (FD) (signal 704) becomes constant. Here, the potential is determined by the amount of electrical charge generated by the photodiode 60 during the accumulation operation. That is, the potential changes depending on the amount of light emitted to the photodiode 60. Since the transistor 52 and the transistor 55 are each a transistor which includes a channel formation region formed of an oxide semiconductor layer and which has an extremely small off-state current, the potential of the charge storage portion (FD) can be kept constant until a subsequent selection operation (read operation) is performed.

Note that when the potential of the wiring 312 (signal 702) is set at low level, the potential of the charge storage portion (FD) might change owing to parasitic capacitance between the wiring 312 and the charge storage portion (FD). In the case where this potential change is large, the amount of electrical charge generated by the photodiode 60 during the accumulation operation cannot be obtained accurately. Examples of effective methods to reduce the change in the potential include reducing the capacitance between the gate and the source (or between the gate and the drain) of the transistor 52, increasing the gate capacitance of the transistor 54, and providing a storage capacitor to connect the charge storage portion (FD). Note that in this embodiment, the change in the potential can be ignored by these methods.

At time D, the potential of the wiring 313 (signal 703) is set at high level to turn on the transistor 56, whereby selection operation starts and the wiring 314 and the wiring 315 are electrically connected to each other through the transistor 54 and the transistor 56. Also, the potential of the wiring 315 (signal 705) starts to decrease. Note that precharge of the wiring 315 is completed before the time D. Here, the rate at which the potential of the wiring 315 (signal 705) decreases depends on the current between the source and the drain of the transistor 54. That is, the potential of the wiring 315 (signal 705) changes depending on the amount of light emitted to the photodiode 60 during the accumulation operation.

At time E, the potential of the wiring 313 (signal 703) is set at low level to turn off the transistor 56, so that the selection operation is completed and the potential of the wiring 315 (signal 705) becomes a constant value which depends on the amount of light emitted to the photodiode 60. Therefore, the amount of light emitted to the photodiode 60 during the accumulation operation can be determined by measuring the potential of the wiring 315.

Specifically, when the photodiode 60 is irradiated with light with high intensity, the potential of the charge storage portion (FD), that is, the gate voltage of the transistor 54 is low. Therefore, current flowing between the source and the drain of the transistor 54 becomes small; as a result, the potential of the wiring 315 (signal 705) is gradually decreased. Thus, a relatively high potential can be read from the wiring 315.

In contrast, when the photodiode 60 is irradiated with light with low intensity, the potential of the charge storage portion (FD), that is, the gate voltage of the transistor 54 is high. Therefore, the current flowing between the source and the drain of the transistor 54 becomes large; thus, the potential of the wiring 315 (signal 705) rapidly decreases. Thus, a relatively low potential can be read from the wiring 315.

Figure 6B:
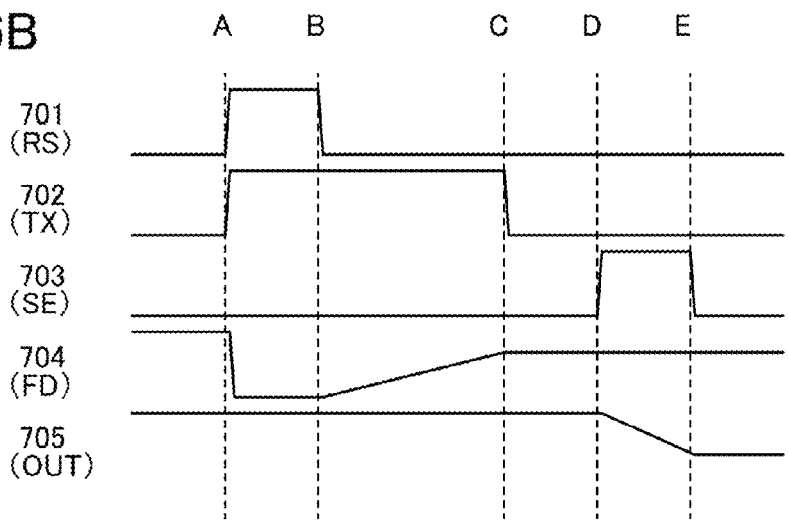

Next, an example of the operation of the circuit in FIG. 5B is described with reference to a timing chart in FIG. 6B. The wiring 316 is always at high level, and the potential of the wiring 317 is always at low level.

At time A, the potential of the wiring 311 (signal 701) is at high level and the potential of the wiring 312 (signal 702) is at high level, so that the potential of the charge storage portion (FD) (signal 704) is initialized to the potential of the wiring 317 (low level), and reset operation is started. The potential of the wiring 315 (signal 705) is precharged to high level.

At time B, the potential of the wiring 311 (signal 701) is set at low level, whereby the reset operation is completed to start accumulation operation. Here, a reverse bias is applied to the photodiode 60, whereby the potential of the charge storage portion (FD) (signal 704) starts to increase due to a reverse current.

The description of the timing chart of FIG. 6A can be referred to for operations at and after the time C. The amount of light emitted to the photodiode 60 during the accumulation operation can be determined by measuring the potential of the wiring 315 at time E.

Figure 7A:
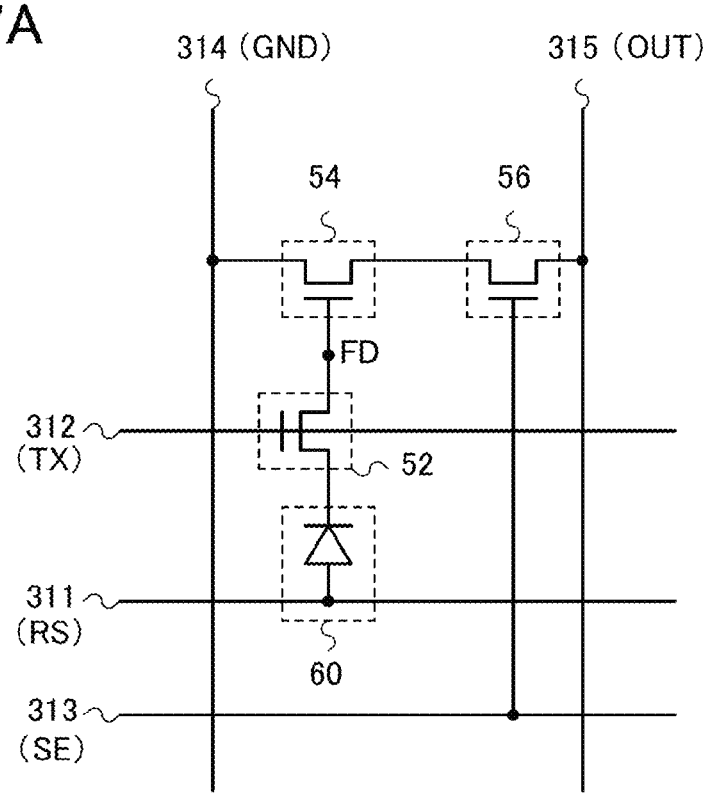
FIGS. 7A and 7B each illustrate a configuration of a pixel circuit.
Figure 7B:
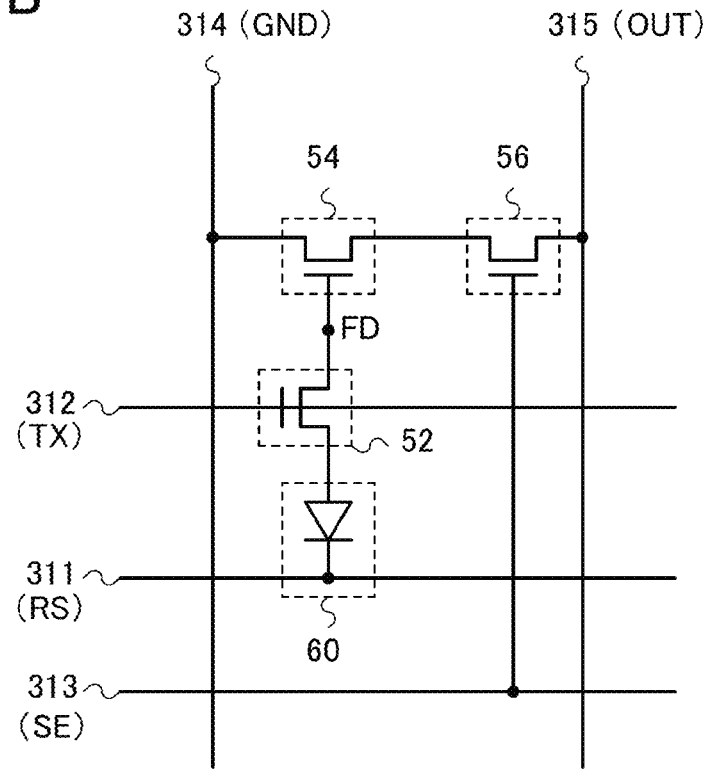

The circuit 91 may have any of configurations illustrated in FIGS. 7A and 7B.

The configuration of a circuit in FIG. 7A is different from that of the circuit in FIG. 5A in that the transistor 55, the wiring 316, and the wiring 317 are not provided, and the wiring 311 (RS) is electrically connected to the anode of the photodiode 60. The other structures are the same as those in the circuit FIG. 5A.

The circuit in FIG. 7B includes the same components as those in the circuit in FIG. 7A but is different in that the anode of the photodiode 60 is electrically connected to one of the source and the drain of the transistor 52 and the cathode of the photodiode 60 is electrically connected to the wiring 311 (RS).

Like the circuit in FIG. 5A, the circuit in FIG. 7A can be operated in accordance with the timing chart shown in FIG. 6A.

At time A, the potential of the wiring 311 (signal 701) is set at high level and the potential of the wiring 312 (signal 702) is set at high level, whereby a forward bias is applied to the photodiode 60 and the potential of the charge storage portion (FD) (signal 704) is set at high level. In other words, the potential of the charge storage portion (FD) is initialized to the potential of the wiring 311 (RS) (high level) and brought into a reset state. The above is the start of the reset operation. The potential of the wiring 315 (signal 705) is precharged to high level.

At time B, the potential of the wiring 311 (signal 701) is set at low level, whereby the reset operation is completed to start accumulation operation. Here, a reverse bias is applied to the photodiode 60, whereby the potential of the charge storage portion (FD) (signal 704) starts to decrease due to a reverse current.

The description of the circuit configuration of FIG. 5A can be referred to for operations at and after time C. The amount of light emitted to the photodiode 60 during the accumulation operation can be determined by measuring the potential of the wiring 315 at time E.

Figure 6C:
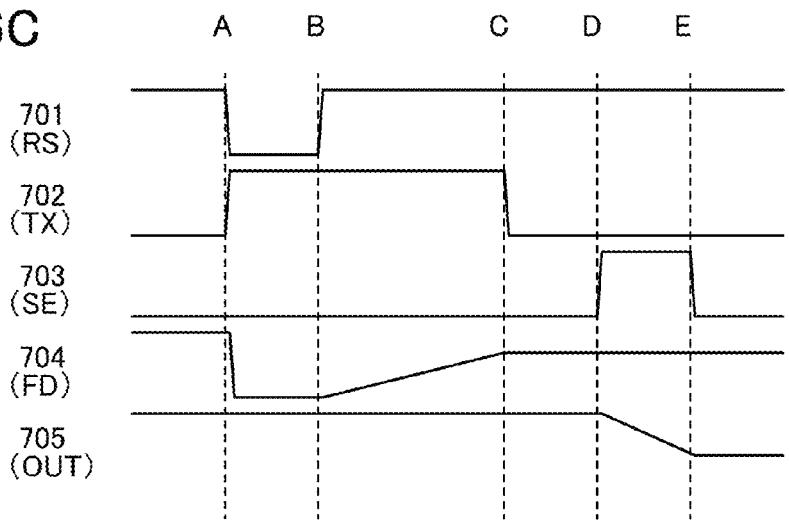

The circuit in FIG. 7B can be operated in accordance with the timing chart shown in FIG. 6C.

At time A, the potential of the wiring 311 (signal 701) is set at low level and the potential of the wiring 312 (signal 702) is set at high level, whereby a forward bias is applied to the photodiode 60 and the potential of the charge storage portion (FD) (signal 704) is set at low level to be in a reset state. The above is the start of the reset operation. The potential of the wiring 315 (signal 705) is precharged to high level.

At time B, the potential of the wiring 311 (signal 701) is set at high level, whereby the reset operation is completed to start accumulation operation. Here, a reverse bias is applied to the photodiode 60, whereby the potential of the charge storage portion (FD) (signal 704) starts to increase due to a reverse current.

The description of the circuit configuration of FIG. 5A can be referred to for operations at and after time C. The amount of light emitted to the photodiode 60 during the accumulation operation can be determined by measuring the potential of the wiring 315 at time E.

Figure 8A:
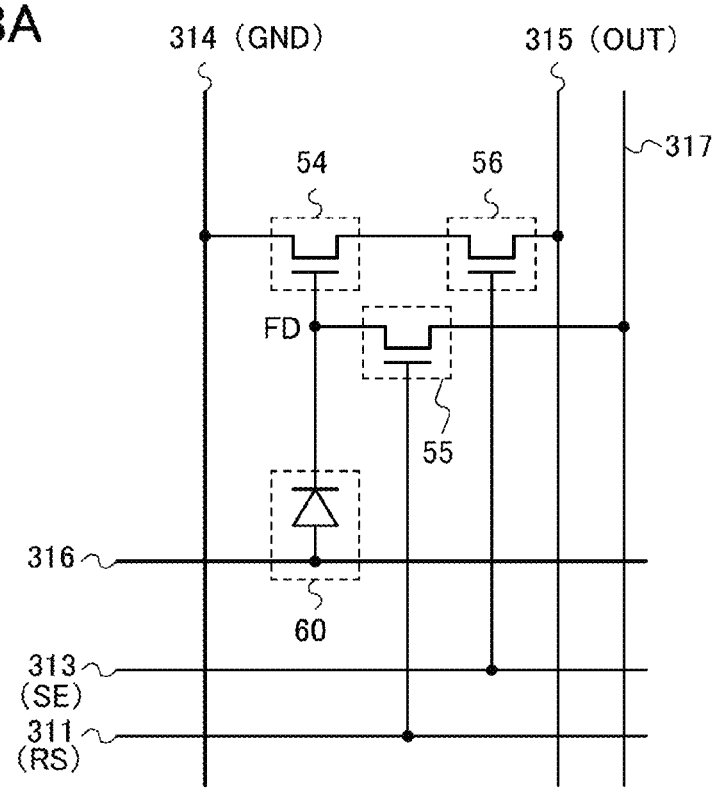
FIGS. 8A and 8B each illustrate a configuration of a pixel circuit.
Figure 8B:
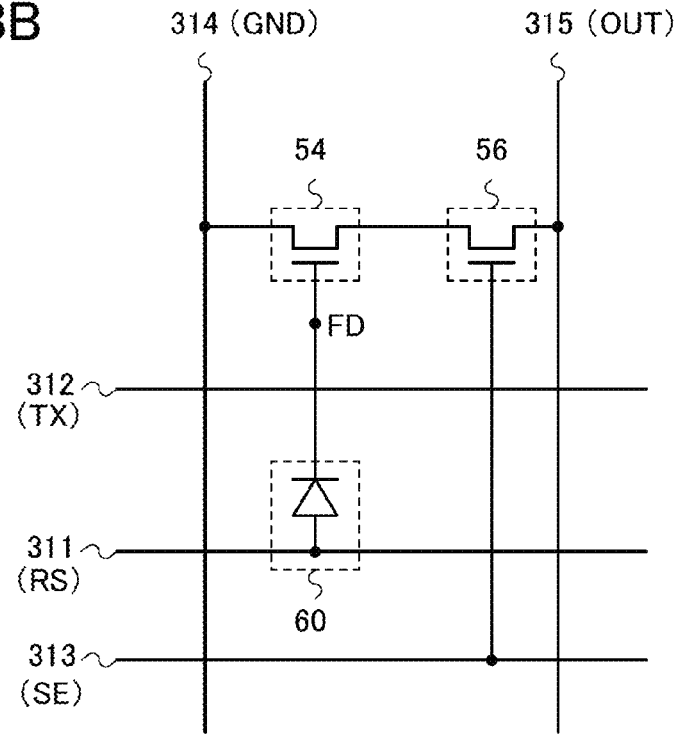

Note that FIGS. 5A and 5B and FIGS. 7A and 7B each show the example in which the transistor 52 is provided; however, one embodiment of the present invention is not limited thereto. As shown in FIGS. 8A and 8B, the transistor 52 may be omitted.

Figure 9A:
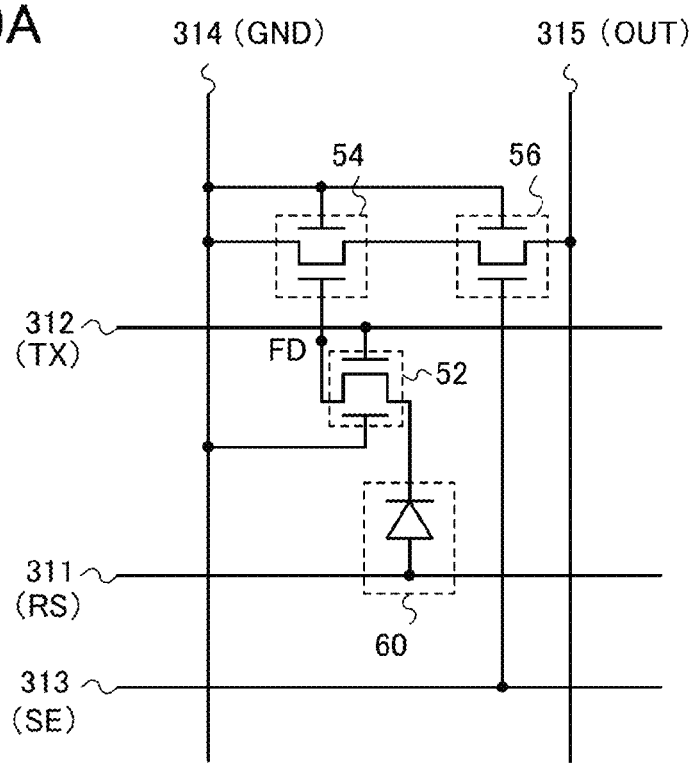
FIGS. 9A and 9B each illustrate a configuration of a pixel circuit.
Figure 9B:
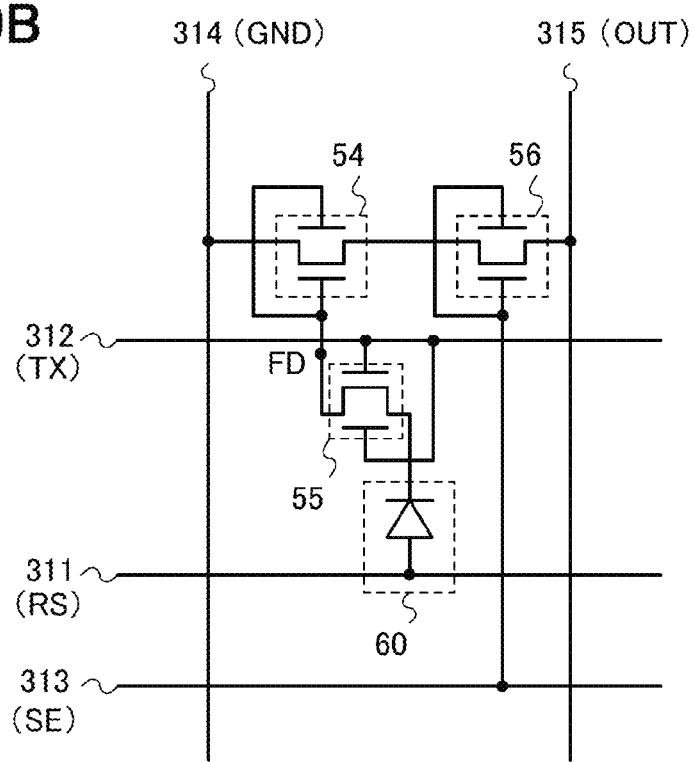

The transistor 52, the transistor 54, and the transistor 56 in the circuit 91 may each have a back gate as illustrated in FIGS. 9A and 9B. FIG. 9A illustrates a configuration of applying a constant potential to the back gates, which enables control of the threshold voltages. FIG. 9B illustrates a configuration in which the back gates are supplied with the same potential as their respective front gates, which enables an increase in on-state current. Although the back gates are electrically connected to the wiring 314 (GND) in FIG. 9A, they may be electrically connected to a different wiring to which a constant potential is supplied. Furthermore, although FIGS. 9A and 9B each illustrate an example in which back gates are provided in the transistors of the circuit in FIG. 7A, the circuits in FIGS. 5A and 5B, FIG. 7B, and FIGS. 8A and 8B may have a similar configuration. Moreover, a configuration of applying the same potential to a front gate and a back gate, a configuration of applying a constant potential to a back gate, and a configuration without a back gate may be arbitrarily combined as necessary for the transistors in one circuit.

Figure 10A:
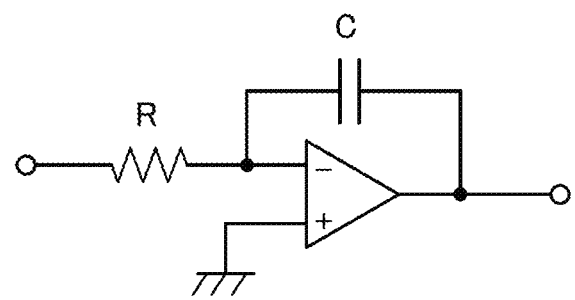
FIGS. 10A to 10C each illustrate an integrator circuit.
Figure 10B:
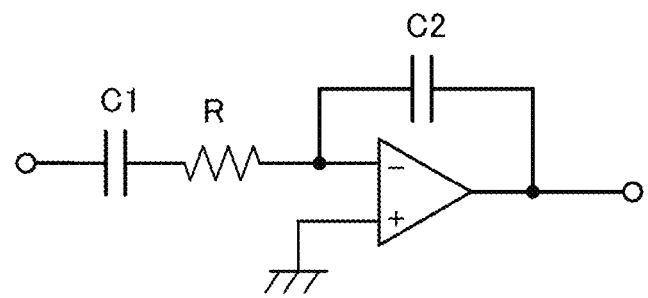
Figure 10C:
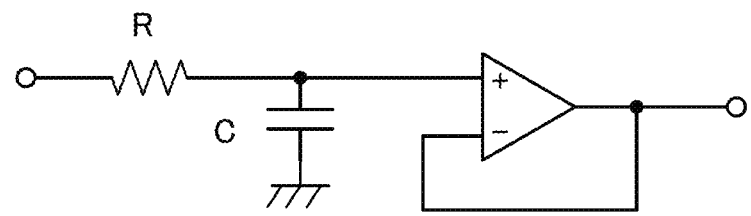

Note that in the circuit example, an integrator circuit illustrated in FIG. 10A, 10B, or 10C may be connected to the wiring 315 (OUT). The circuit enables an S/N ratio of a reading signal to be increased, which makes it possible to sense weaker light, that is, to increase the sensitivity of the imaging device.

FIG. 10A illustrates an integrator circuit using an operational amplifier circuit (also referred to as an op-amp). An inverting input terminal of the operational amplifier circuit is connected to the wiring 315 (OUT) through a resistor R. A non-inverting input terminal of the operational amplifier circuit is grounded. An output terminal of the operational amplifier circuit is connected to the inverting input terminal of the operational amplifier circuit through a capacitor C.

FIG. 10B illustrates an integrator circuit including an operational amplifier circuit having a structure different from that in FIG. 10A. The inverting input terminal of the operational amplifier circuit is connected to the wiring 315 (OUT) through a resistor R and a capacitor C1. The non-inverting input terminal of the operational amplifier circuit is grounded. The output terminal of the operational amplifier circuit is connected to the inverting input terminal of the operational amplifier circuit through a capacitor C2.

FIG. 10C illustrates an integrator circuit using an operational amplifier circuit having a structure different from those in FIGS. 10A and 10B. The non-inverting input terminal of the operational amplifier circuit is connected to the wiring 315 (OUT) through the resistor R. The output terminal of the operational amplifier circuit is connected to the inverting input terminal of the operational amplifier circuit. The resistor R and the capacitor C constitute a CR integrator circuit. The operational amplifier circuit is a unity gain buffer.

This embodiment can be implemented in an appropriate combination with any of the structures described in the other embodiments.

Embodiment 3

In this embodiment, a circuit configuration in which a transistor for initializing the potential of the charge storage portion (FD), a transistor for outputting a signal corresponding to the potential of the charge storage portion (FD), and various wirings (signal lines) are shared by pixels (of plural circuits 91) is described.

Figure 11:
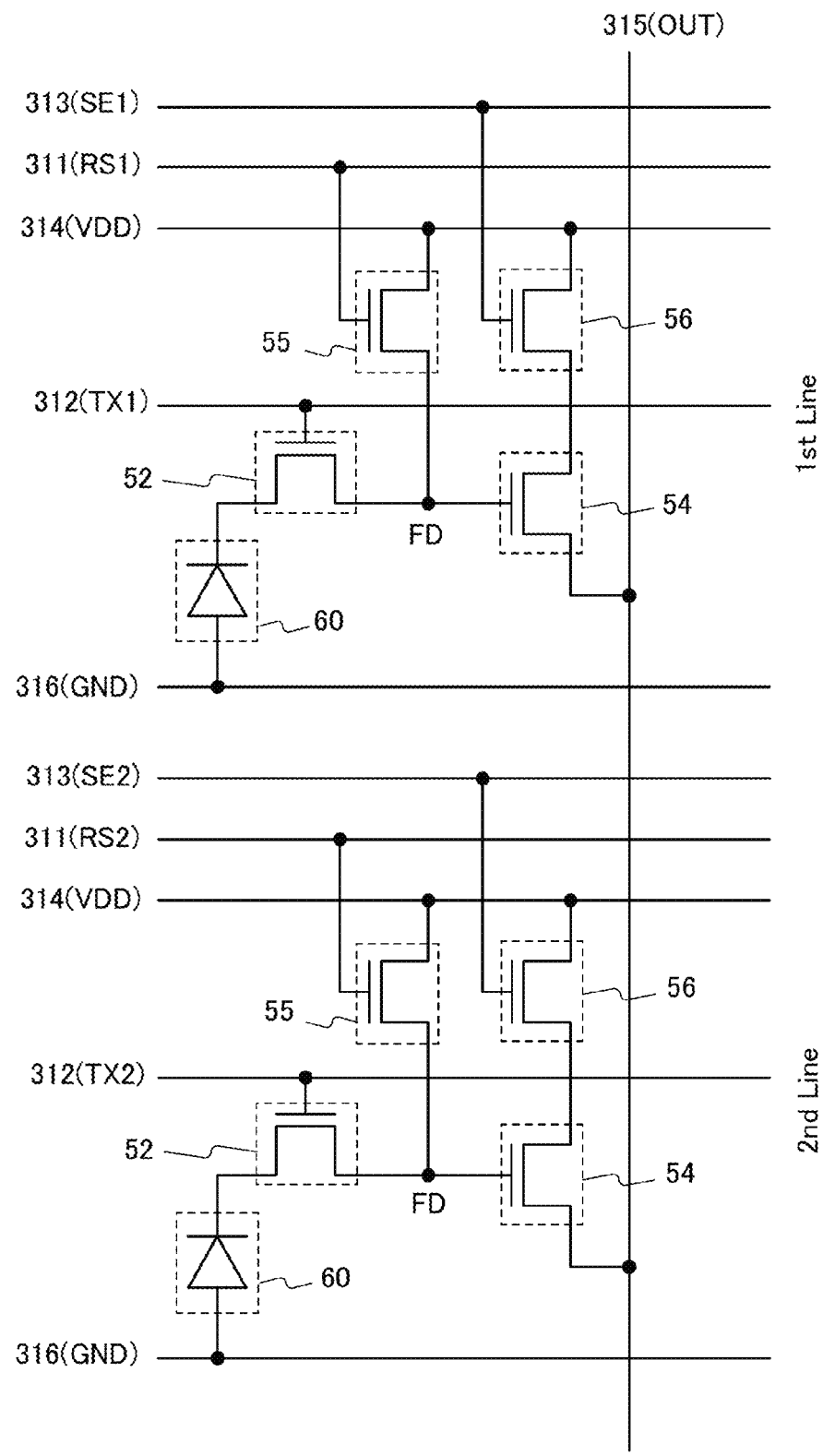
FIG. 11 illustrates a configuration of a pixel circuit.

In a pixel circuit shown in FIG. 11, as in the circuit shown in FIG. 5A, the transistor 52 (functioning as a transfer transistor), the transistor 54 (functioning as an amplifying transistor), the transistor 55 (functioning as a reset transistor), the transistor 56 (functioning as a selection transistor), and the photodiode 60 are provided in each pixel. The wiring 311 (functioning as a signal line for controlling the transistor 55), the wiring 312 (functioning as a signal line for controlling the transistor 52), the wiring 313 (functioning as a signal line for controlling the transistor 56), the wiring 314 (functioning as a high-potential line), the wiring 315 (functioning as a signal line for reading a signal which is output from the transistor 54), and the wiring 316 (functioning as a reference potential line (GND)) are electrically connected to the pixel circuit.

The wiring 314 corresponds to GND and the wiring 317 corresponds to a high-potential line in the circuit shown in FIG. 5A; on the other hand, in the pixel circuit in FIG. 11, since the wiring 314 corresponds to a high-potential line (e.g., VDD) and the other of the source and the drain of the transistor 56 is connected to the wiring 314, the wiring 317 is not provided. The wiring 315 (OUT) is reset to low potential.

As described below, the wiring 314, the wiring 315, and the wiring 316 can be shared by a pixel circuit in a first line and a pixel circuit in a second line, and in addition, the wiring 311 can be shared by the pixel circuits depending on an operation mode.

Figure 12:
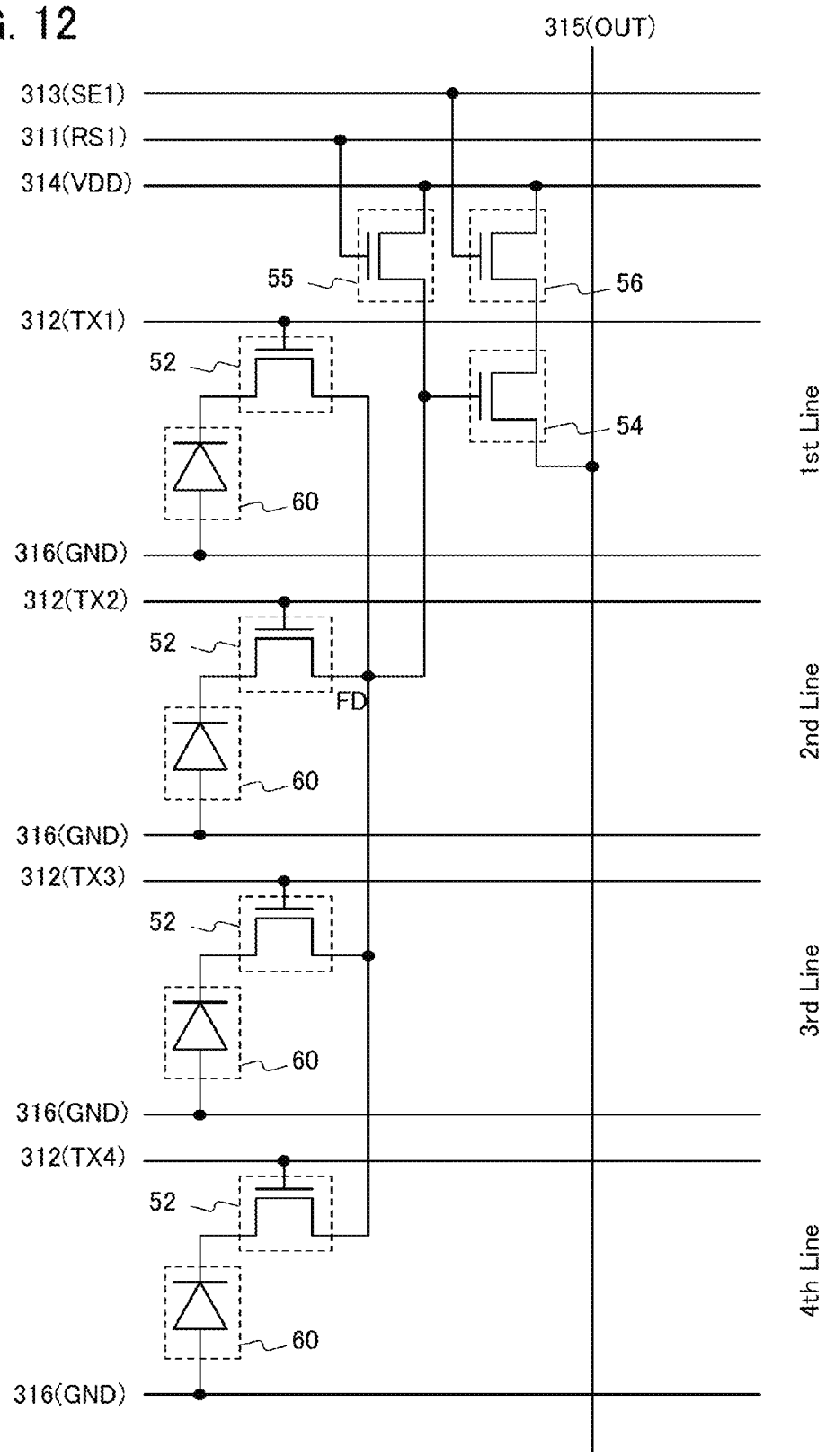
FIG. 12 illustrates a configuration of a pixel circuit.

FIG. 12 shows a vertical-sharing-type configuration of four pixels, in which the transistor 54, the transistor 55, the transistor 56, and the wiring 311 are shared by the vertically adjacent four pixels in first to four lines. A reduction in the numbers of transistors and wirings can miniaturize the circuit due to reduction in the area of a pixel, and can improve a yield in the production. The other of the source and the drain of the transistor 52 in each of the vertically adjacent four pixels, one of the source and the drain of the transistor 55, and the gate of the transistor 54 are electrically connected to the charge storage portion (FD). The transistors 52 of all the pixels are sequentially operated, and accumulation operation and reading operation are repeated, whereby data can be obtained from all the pixels.

Figure 13:
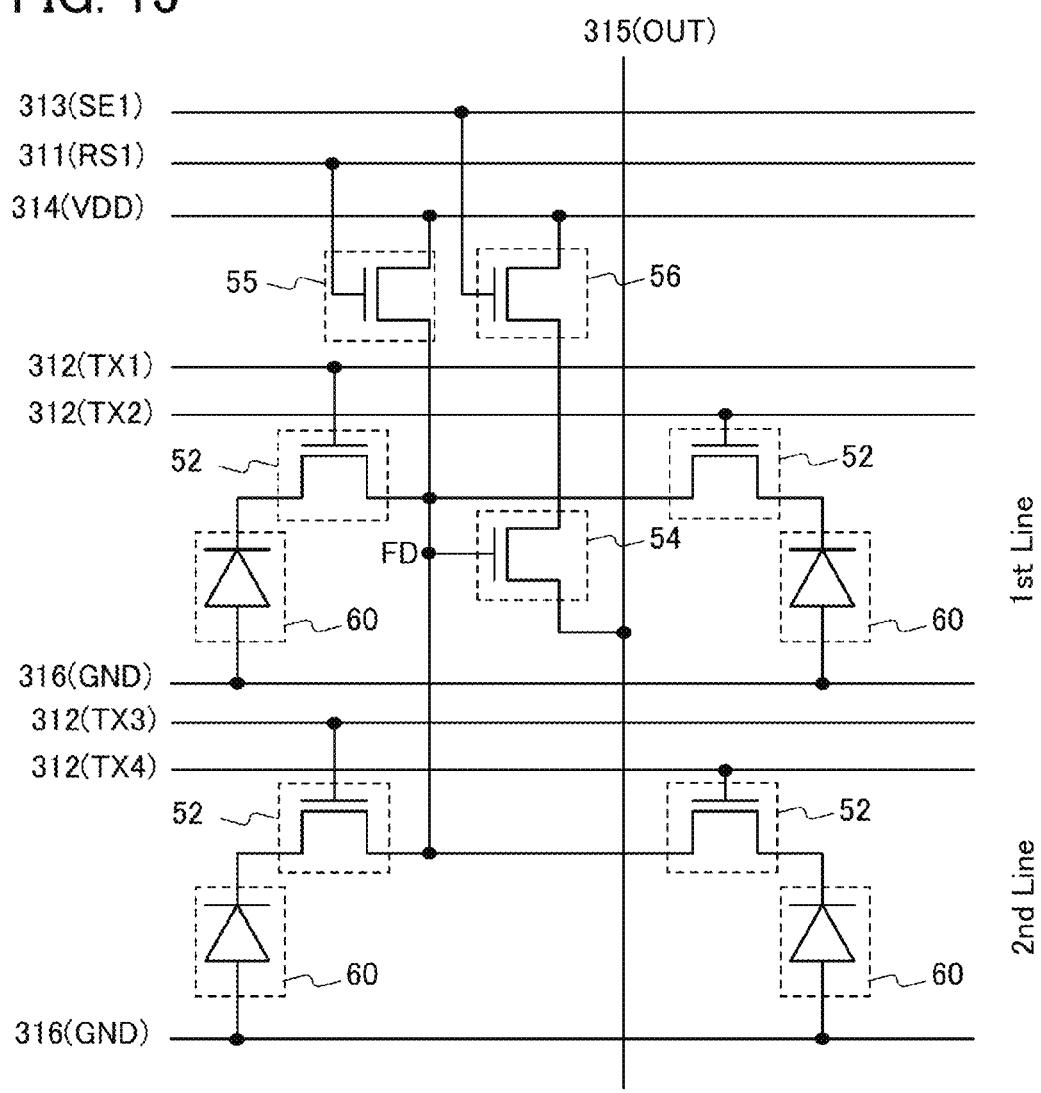
FIG. 13 illustrates a configuration of a pixel circuit.

FIG. 13 shows a horizontal-vertical-sharing-type configuration of four pixels, in which the transistor 54, the transistor 55, the transistor 56, the wiring 313, and the wiring 311 are shared by the horizontally and vertically adjacent four pixels. In a manner similar to that of the configuration of vertically arranged four pixels, a reduction in the numbers of transistors and wirings can miniaturize the circuit due to reduction in the area of a pixel, and can improve an yield in the production. The other of the source and the drain of the transistor 52 in each of the horizontally and vertically adjacent four pixels, one of the source and the drain of the transistor 55, and the gate of the transistor 54 are electrically connected to the charge storage portion (FD). The transistors 52 of all the pixels are sequentially operated, and accumulation operation and reading operation are repeated, whereby data can be obtained from all the pixels.

Figure 14:
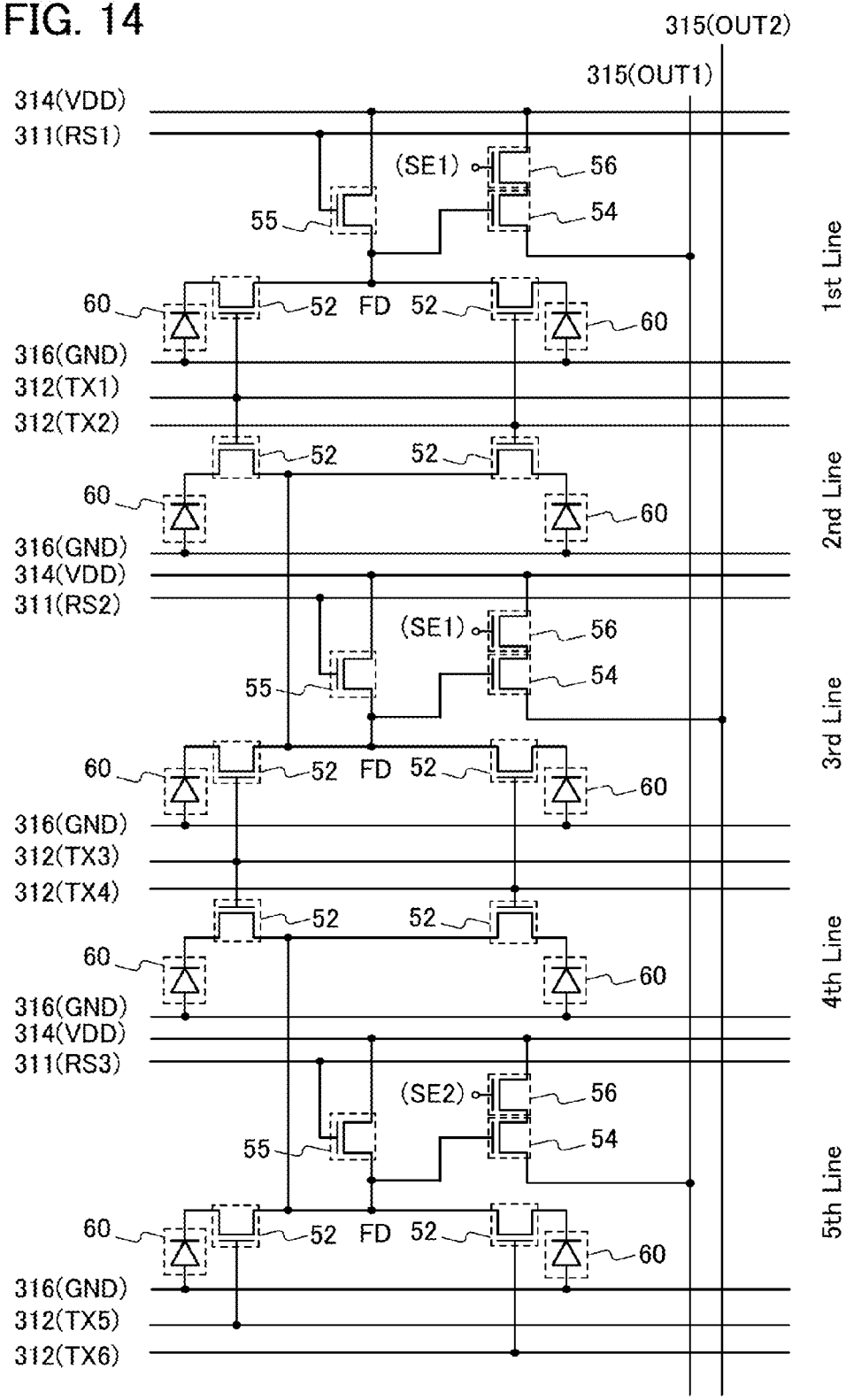
FIG. 14 illustrates a configuration of a pixel circuit.

FIG. 14 shows a configuration, in which the transistor 54, the transistor 55, the transistor 56, the wiring 311, and the wirings 312 and 314 are shared by horizontally and vertically adjacent four pixels. This configuration corresponds to the above-described configuration of horizontally and vertically adjacent four pixels in which the wiring 312 is shared by the four pixels. The other of the source and the drain of the transistor 52 in each of the horizontally and vertically adjacent four pixels (in the first row, two pixels that are adjacent to each other horizontally), one of the source and the drain of the transistor 55, and the gate of the transistor 54 are electrically connected to the charge storage portion (FD). In the circuit configuration, the wiring 312 is shared between two transfer transistors (transistors 52) positioned vertically, so that transistors which operate concurrently are provided in a horizontal direction and a vertical direction.

Note that although different from the configurations in which the transistors and the signal line(s) are shared by the pixels, a configuration of a pixel circuit including a plurality of photodiodes may be employed.

Figure 15A:
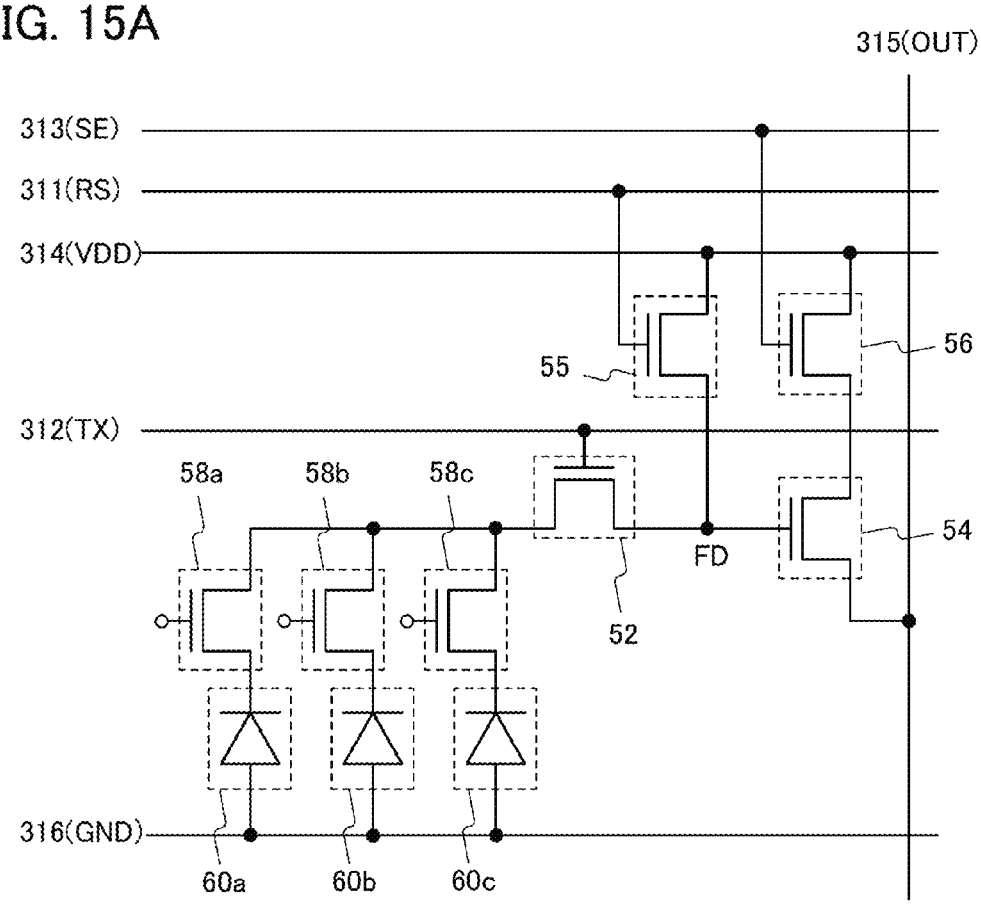
FIGS. 15A to 15D illustrate a configuration of a pixel circuit.
Figure 15B:
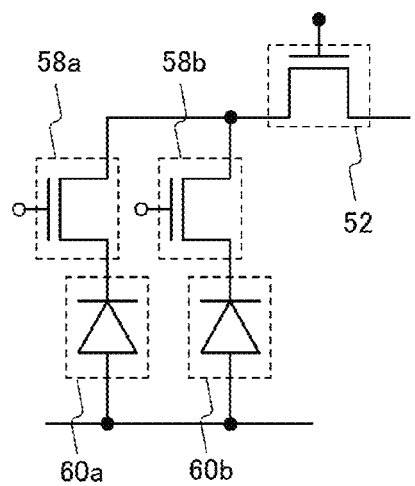

For example, as shown in a pixel circuit in FIG. 15A, photodiodes 60a, 60b, and 60c, transistors 58a, 58b, and 58c, and the like are provided between the wiring 316 and the one of the source and the drain of the transistor 52. The transistors 58a, 58b, and 58c function as switches for selecting the photodiodes 60a, 60b, and 60c which are connected to the transistors 58a, 58b, and 58c, respectively. Although three photodiodes and three transistors functioning as switches are combined in FIG. 15A, the numbers of photodiodes and transistors are not limited thereto. For example, a configuration with two photodiodes and two transistors illustrated in FIG. 15B can be employed. The numbers of photodiodes and transistors may be four or more.

For example, as the photodiodes 60a, 60b, and 60c, photodiodes which differ in sensitivity to illuminance can be used and those suited to image-capturing under each of environments from low illuminance to high illuminance are selected. For example, as a photodiode for high illuminance, a photodiode which is combined with a dimming filter so that output for illuminance has linearity can be used. Note that a plurality of photodiodes may be operated at the same time.

Alternatively, as the photodiodes 60a, 60b, and 60c, photodiodes which differ in sensitivity to a wavelength can be used and those suited to image-capturing in each of wavelengths from ultraviolet rays to far infrared rays are selected. For example, with a combination of a filter which transmits light having a target wavelength range and a photodiode, image-capturing utilizing ultraviolet light, image-capturing utilizing visible light, image-capturing utilizing infrared light, and the like can be separately performed.

The pixel circuit may include a plurality of photodiodes whose light-receiving portions have different areas. In the case of a structure including two photodiodes, for example, the photodiodes can have different light-receiving areas, and the ratio of the light-receiving area of one photodiode to that of the other photodiode can be 1:10, 1:100, or the like. The value of a current output from a photodiode might be saturated owing to the influence of series resistance and the like. In this case, in accordance with Ohm's law, as the current value decreases, linearity with respect to illuminance becomes favorable. Therefore, a photodiode with a large area of the light-receiving portion is normally used for capturing images in order to increase sensitivity, whereas in an environment with high illuminance, a photodiode with a small area of the light-receiving portion is used for capturing images. Thus, the imaging device can have high sensitivity and a wide dynamic range.

Figure 15C:
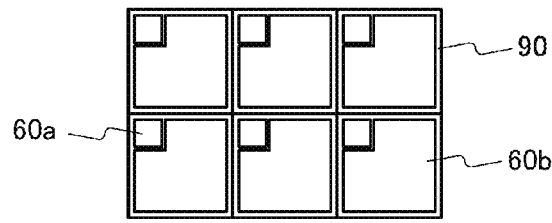
Figure 15D:
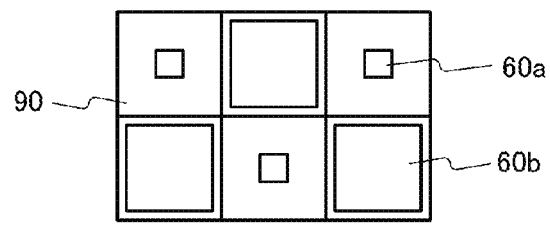

Note that as a pixel structure including photodiodes whose light-receiving portions have different areas, a structure of FIG. 15C in which photodiodes 60a and 60b with different areas are provided in a pixel 90, or a structure of FIG. 15D in which the photodiodes 60a and 60b with different areas are alternately provided for the pixels 90 may be used.

This embodiment can be implemented in an appropriate combination with any of the structures described in the other embodiments.

Embodiment 4

In this embodiment, an example of a driving method of a pixel circuit is described.

As described in Embodiment 2, the operation of the pixel circuit is repetition of the reset operation, the accumulation operation, and the selection operation. As capturing modes in which the whole pixel matrix is controlled, a global shutter system and a rolling shutter system are known.

Figure 16A:
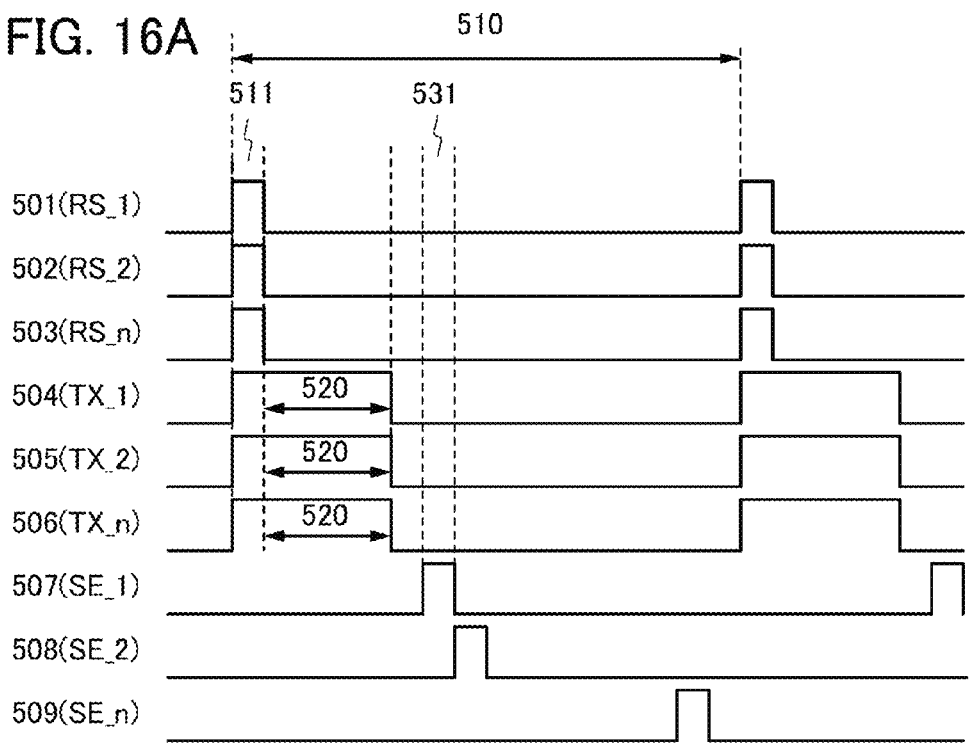
FIGS. 16A and 16B are timing charts illustrating the operations in a global shutter system and a rolling shutter system, respectively.

FIG. 16A shows a timing chart in a global shutter system. FIG. 16A shows operations of a capturing device in which a plurality of pixel circuits illustrated in FIG. 5A are arranged in a matrix. Specifically, FIG. 16A show operations of the pixel circuits from the first row to the n-th row (n is a natural number of three or more). The following description for operation can be applied to any of the circuits in FIG. 5B, FIGS. 7A and 7B, and FIGS. 8A and 8B.

In FIG. 16A, a signal 501, a signal 502, and a signal 503 are input to the wirings 311 (RS) connected to the pixel circuits in the first row, the second row, and the n-th row, respectively. A signal 504, a signal 505, and a signal 506 are input to the wirings 312 (TX) connected to the pixel circuits in the first row, the second row, and the n-th row, respectively. A signal 507, a signal 508, and a signal 509 are input to the wirings 313 (SE) connected to the pixel circuits in the first row, the second row, and the n-th row, respectively.

A period 510 is a period required for one capturing. In a period 511, the pixel circuits in each row perform the reset operation at the same time. In a period 520, the pixel circuits in each row perform the accumulation operation at the same time. The selection operation is sequentially performed in the pixel circuits for each row. For example, in a period 531, the selection operation is performed in the pixel circuits in the first row. As described above, in the global shutter system, the reset operation is performed in all the pixel circuits substantially at the same time, the accumulation operation is performed in all the pixel circuits substantially at the same time, and then the read operation is sequentially performed for each row.

That is, in the global shutter system, since the accumulation operation is performed in all the pixel circuits substantially at the same time, capturing is simultaneously performed in the pixel circuits in all the rows. Therefore, an image with little distortion can be obtained even in the case of a moving object.

Figure 16B:
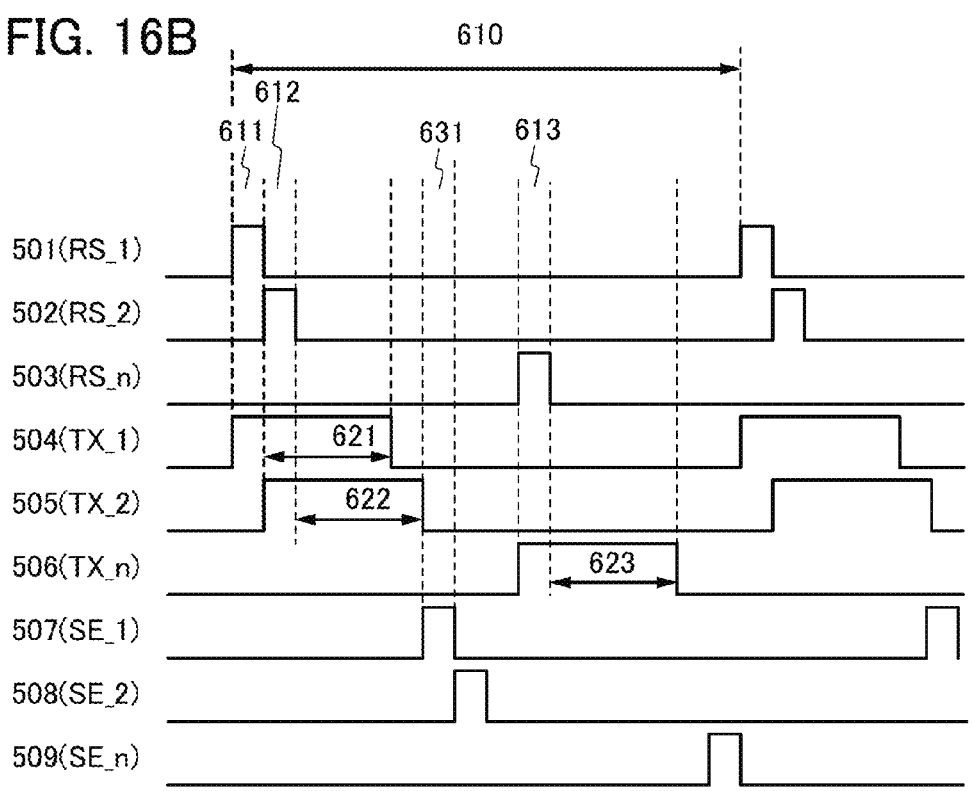

On the other hand, FIG. 16B is a timing chart of the case where a rolling shutter system is used. The description of FIG. 16A can be referred to for the signals 501 to 509. A period 610 is the time taken for one capturing. A period 611, a period 612, and a period 613 are reset periods in the first row, the second row, and the n-th row, respectively. A period 621, a period 622, and a period 623 are accumulation operation periods in the first row, the second row, and the n-th row, respectively. In a period 631, the selection operation is performed in the pixel circuits in the first row. As described above, in the rolling shutter system, the accumulation operation is not performed at the same time in all the pixel circuits but is sequentially performed for each row; thus, capturing is not simultaneously performed in the pixel circuits in all the rows. Therefore, the timing of capturing in the first row is different from that of capturing in the last row, and thus an image with large distortion is obtained in the case of a moving object.

To perform the global shutter system, the potential of the charge storage portion (FD) needs to be kept for a long time until sequential reading of signals from the pixels is terminated. When a transistor including a channel formation region formed of an oxide semiconductor and having an extremely small off-state current is used as the transistor 52 and the like, the potential of the charge storage portion (FD) can be kept for a long time. In the case where a transistor including a channel formation region formed of silicon or the like is used as the transistor 52 and the like, the potential of the charge storage portion (FD) cannot be kept for a long time because of a high off-state current, which makes it difficult to use the global shutter system.

The use of transistors including a channel formation region formed of an oxide semiconductor in the pixel circuits facilitates the global shutter system.

This embodiment can be implemented in an appropriate combination with any of the structures described in the other embodiments.

Embodiment 5

In this embodiment, a transistor including an oxide semiconductor that can be used in one embodiment of the present invention is described with reference to drawings. In the drawings in this embodiment, some components are enlarged, reduced in size, or omitted for easy understanding.

Figure 17A:
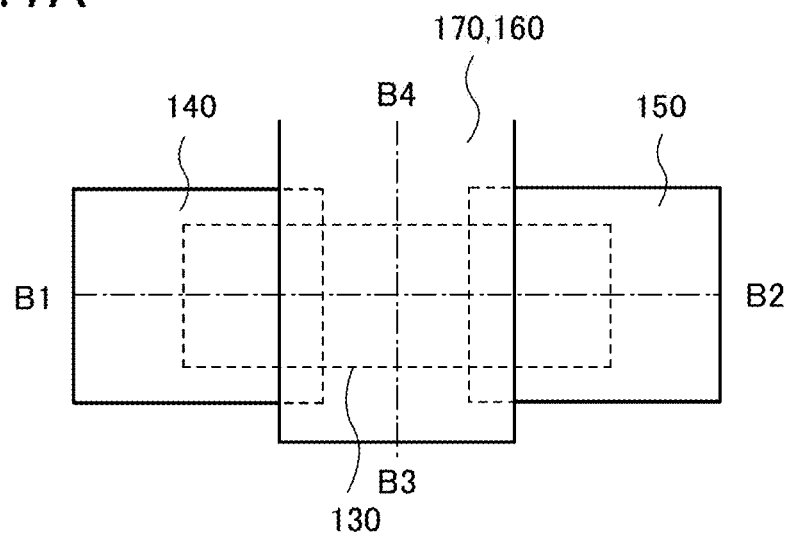
FIGS. 17A and 17B are a top view and a cross-sectional view illustrating a transistor.
Figure 17B:
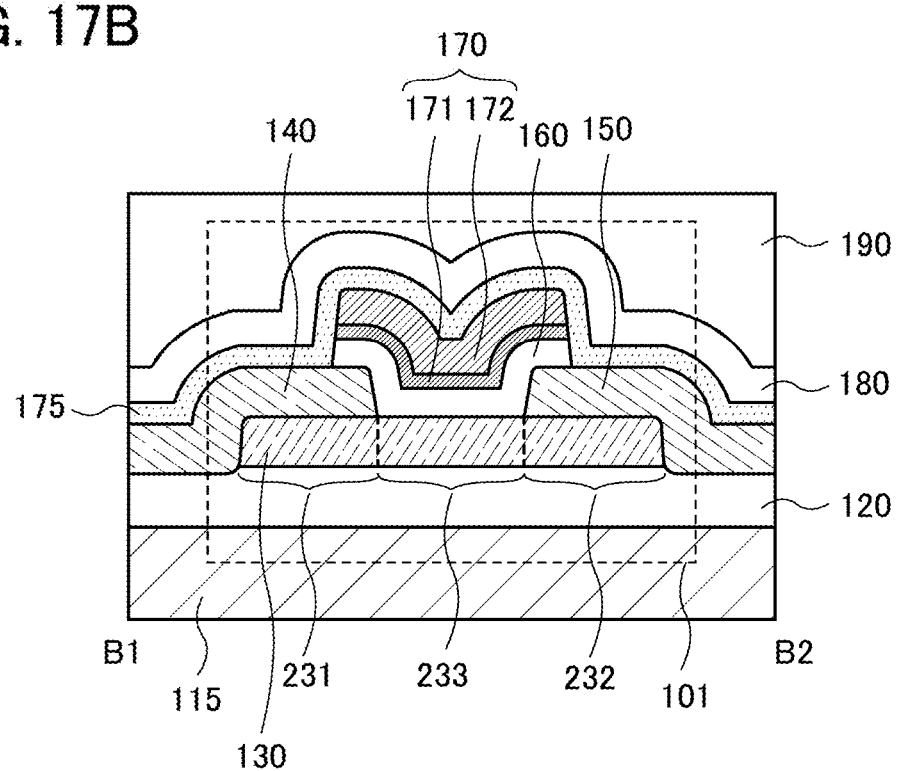
Figure 23A:
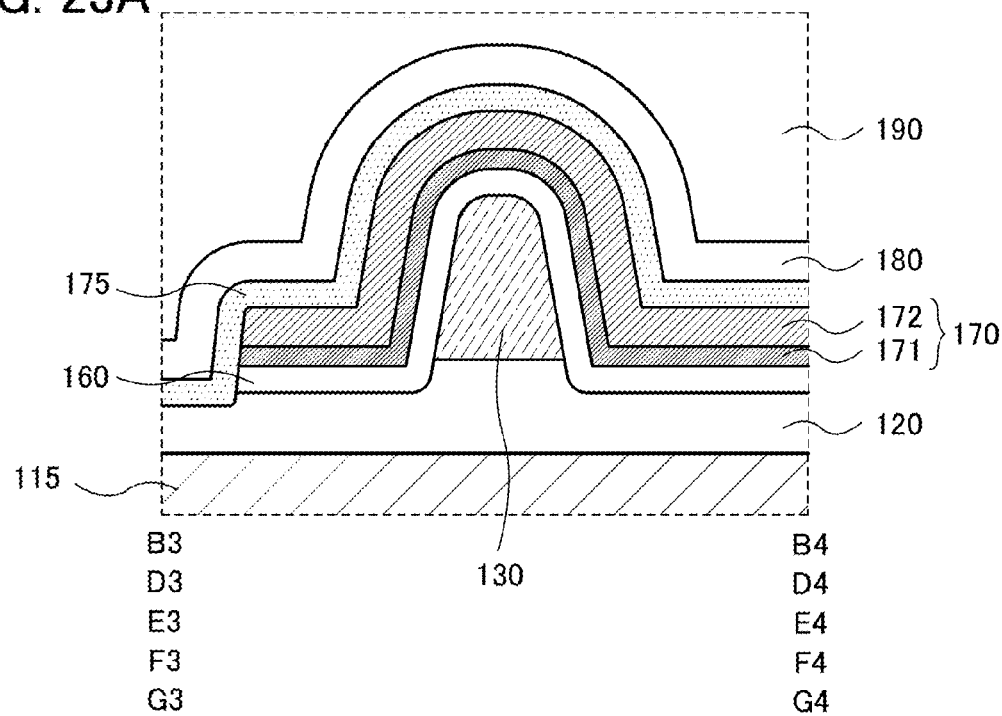
FIGS. 23A and 23B each illustrate a cross section of a transistor in the channel width direction.

FIGS. 17A and 17B are a top view and a cross-sectional view illustrating a transistor 101 of one embodiment of the present invention. A cross section in the direction of a dashed-dotted line B1-B2 in FIG. 17A is illustrated in FIG. 17B. A cross section in the direction of a dashed-dotted line B3-B4 in FIG. 17A is illustrated in FIG. 23A. The direction of the dashed-dotted line B1-B2 may be referred to as a channel length direction, and the direction of the dashed-dotted line B3-B4 may be referred to as a channel width direction.

The transistor 101 includes an insulating layer 120 in contact with a substrate 115; an oxide semiconductor layer 130 in contact with the insulating layer 120; a conductive layer 140 and a conductive layer 150 electrically connected to the oxide semiconductor layer 130; an insulating layer 160 in contact with the oxide semiconductor layer 130, the conductive layer 140, and the conductive layer 150; a conductive layer 170 in contact with the insulating layer 160; an insulating layer 175 in contact with the conductive layer 140, the conductive layer 150, the insulating layer 160, and the conductive layer 170; and an insulating layer 180 in contact with the insulating layer 175. The transistor 101 may also include, for example, an insulating layer 190 (planarization film) in contact with the insulating layer 180 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 17B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layer 140 and the conductive layer 150, the resistance of the region 231 and the region 232 can be reduced.

Specifically, since the oxide semiconductor layer 130 is in contact with the conductive layer 140 and the conductive layer 150, oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the region 231 and the region 232 to n-type regions with low resistance.

Note that functions of a "source" and a "drain" of a transistor are replaced with each other when a transistor of opposite polarity is used or when the direction of current flow is changed in circuit operation, for example. Therefore, the terms "source" and "drain" can be replaced with each other in this specification. In addition, the term "electrode layer" can be replaced with the term "wiring".

The conductive layer 170 includes two layers, a conductive layer 171 and a conductive layer 172, in the drawing, but also may be a single layer or a stack of three or more layers. The same applies to other transistors described in this embodiment.

Each of the conductive layers 140 and 150 is a single layer in the drawing, but also may be a stack of two or more layers. The same applies to other transistors described in this embodiment.

Figure 18A:
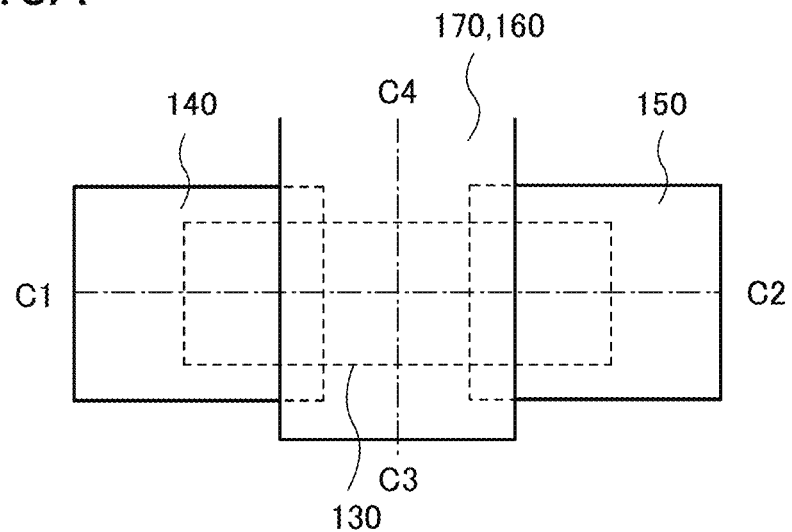
FIGS. 18A and 18B are a top view and a cross-sectional view illustrating a transistor.
Figure 18B:
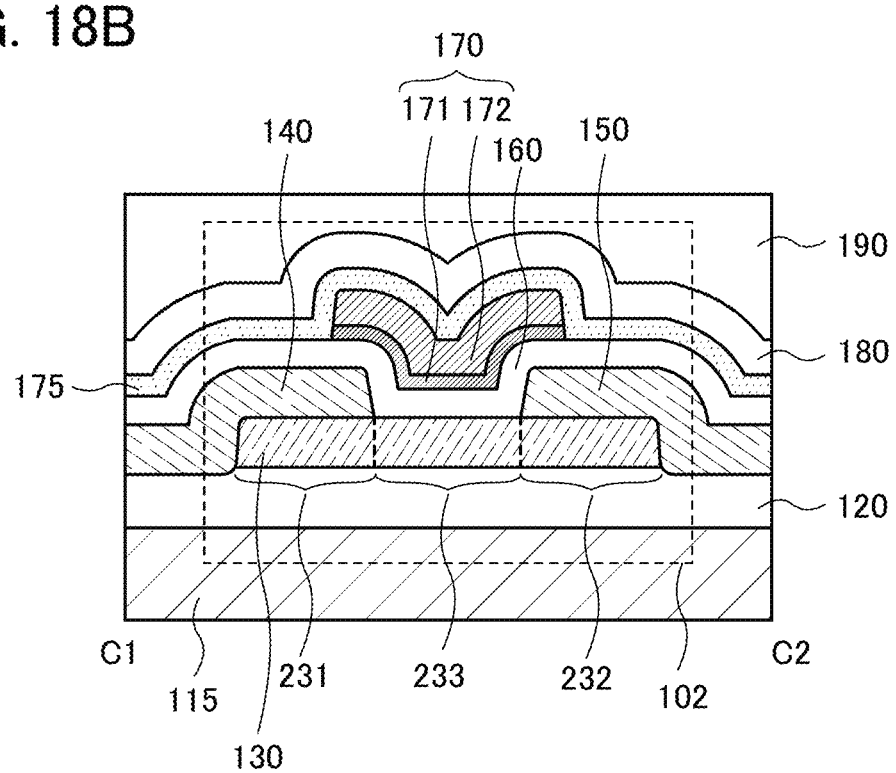
Figure 23B:
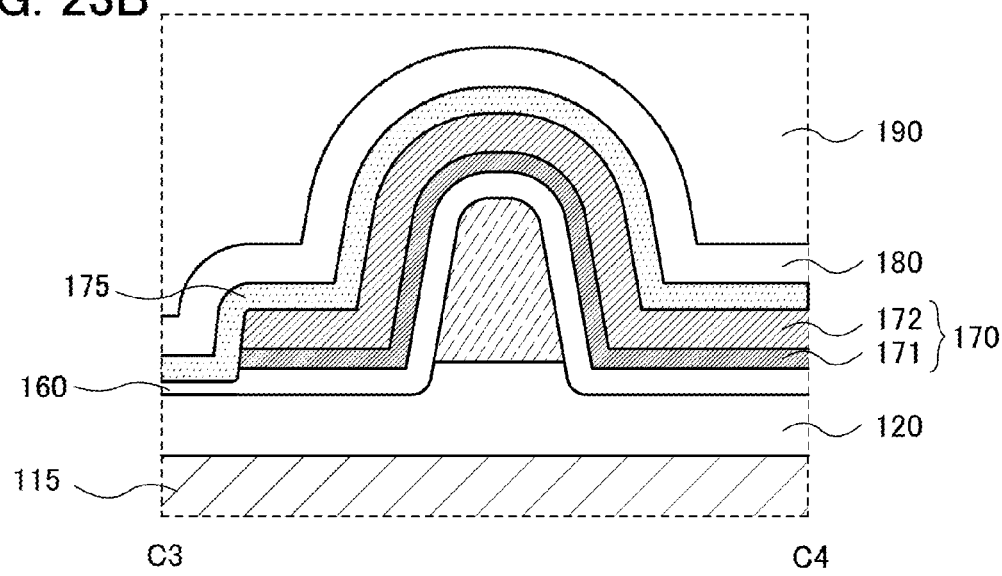
Figure 24A:
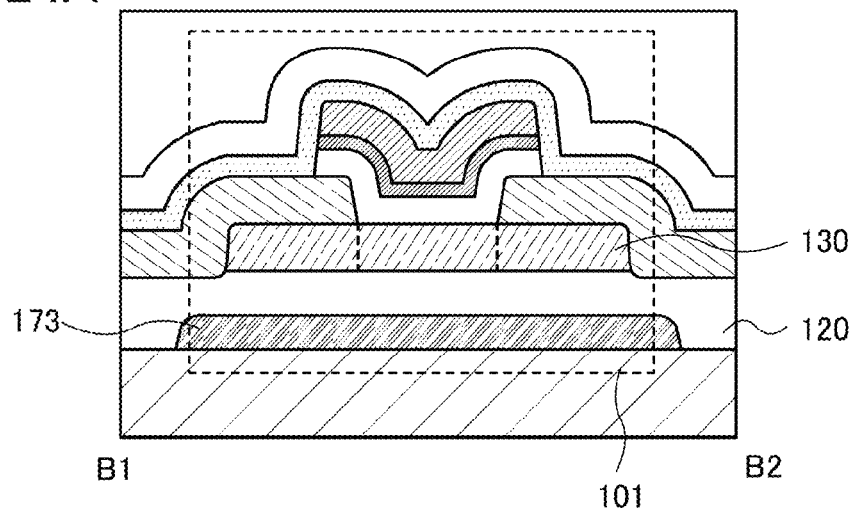
FIGS. 24A to 24C each illustrate a cross section of a transistor in the channel length direction.
Figure 24B:
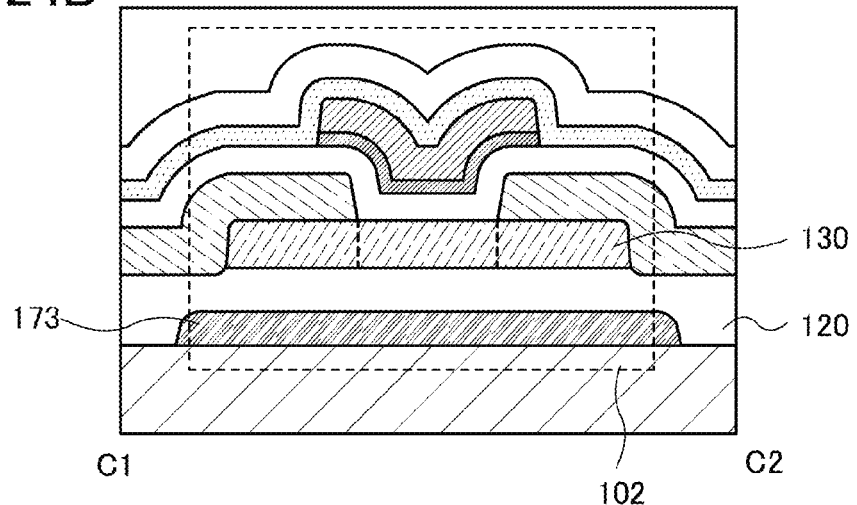
Figure 24C:
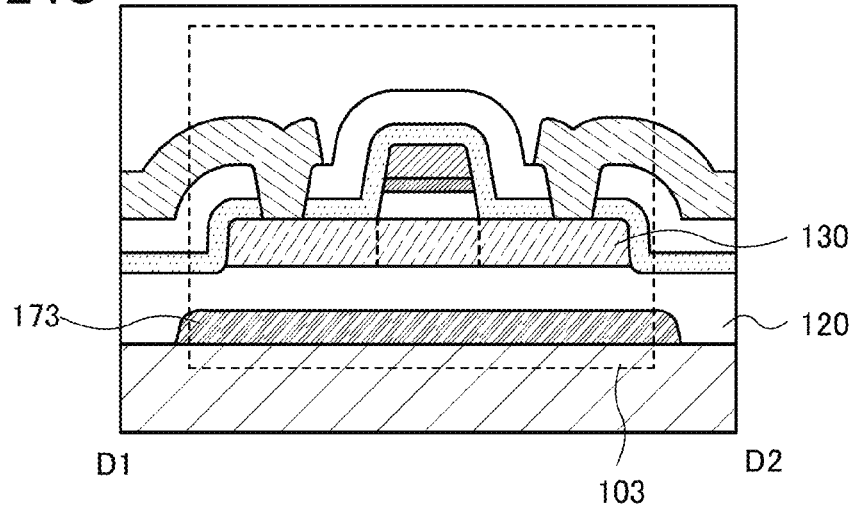
Figure 25A:
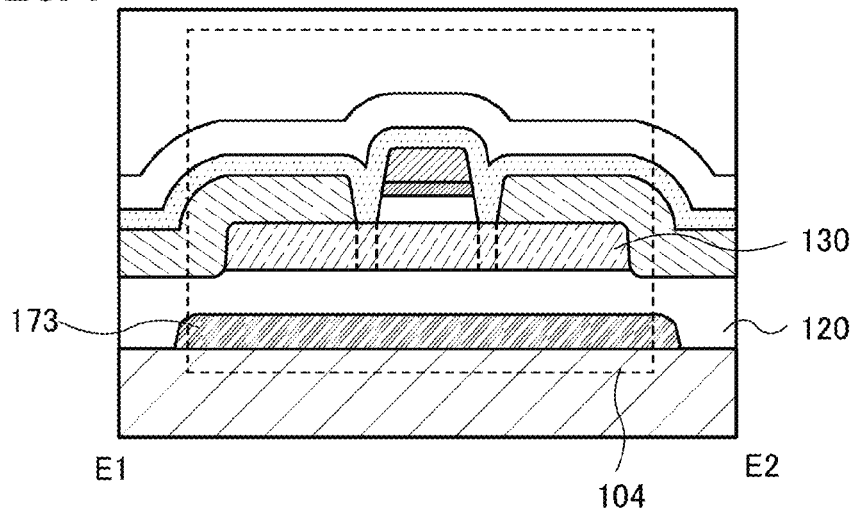
FIGS. 25A to 25C each illustrate a cross section of a transistor in the channel length direction.
Figure 25B:
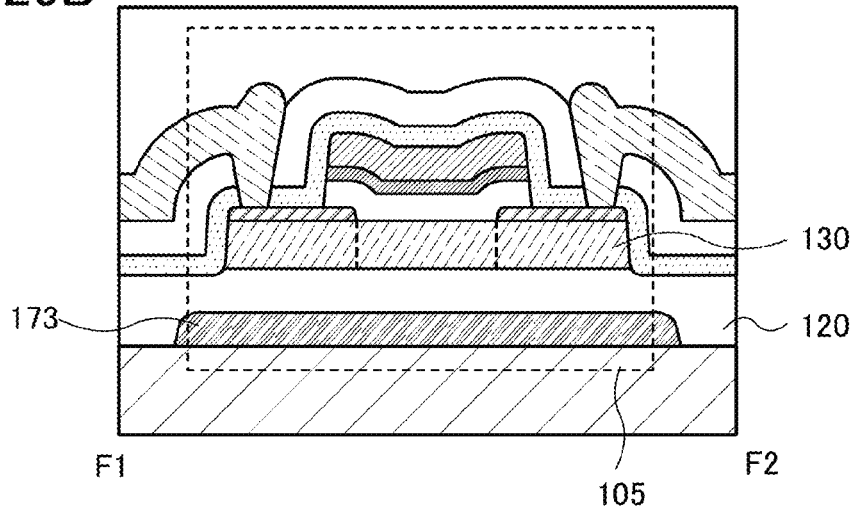
Figure 25C:
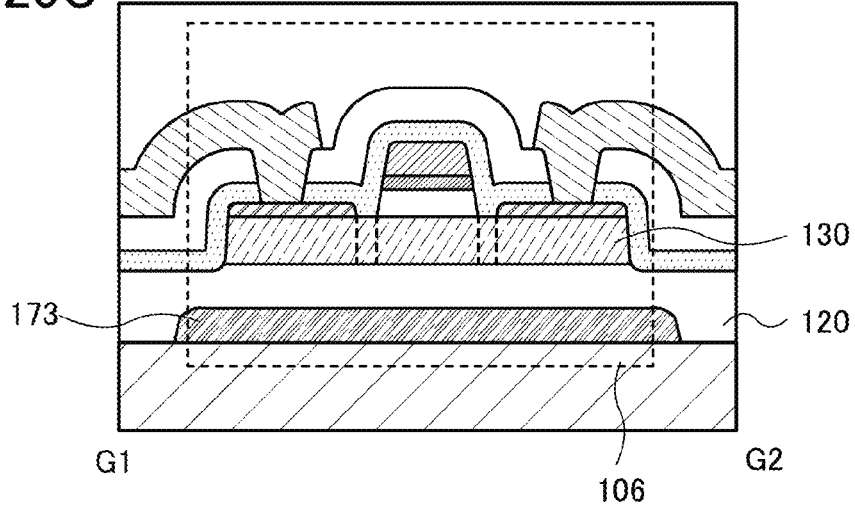

The transistor of one embodiment of the present invention may have a structure illustrated in FIGS. 18A and 18B. FIG. 18A is a top view of a transistor 102. A cross section in the direction of a dashed-dotted line C1-C2 in FIG. 18A is illustrated in FIG. 18B. A cross section in the direction of a dashed-dotted line C3-C4 in FIG. 18A is illustrated in FIG. 23B. The direction of the dashed-dotted line C1-C2 may be referred to as a channel length direction, and the direction of the dashed-dotted line C3-C4 may be referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layer 140 and the conductive layer 150 are covered with the insulating layer 160 and accordingly the resistance between the conductive layer 170 and the conductive layers 140 and 150 is high; therefore, the transistor 102 has a feature of low gate leakage current.

The transistor 101 and the transistor 102 each have a top-gate structure including a region where the conductive layer 170 overlaps each of the conductive layers 140 and 150. To reduce parasitic capacitance, the width of the region in the channel length direction is preferably greater than or equal to 3 nm and less than 300 nm. Meanwhile, since an offset region is not formed in the oxide semiconductor layer 130, a transistor with high on-state current can be easily be formed.

Figure 19A:
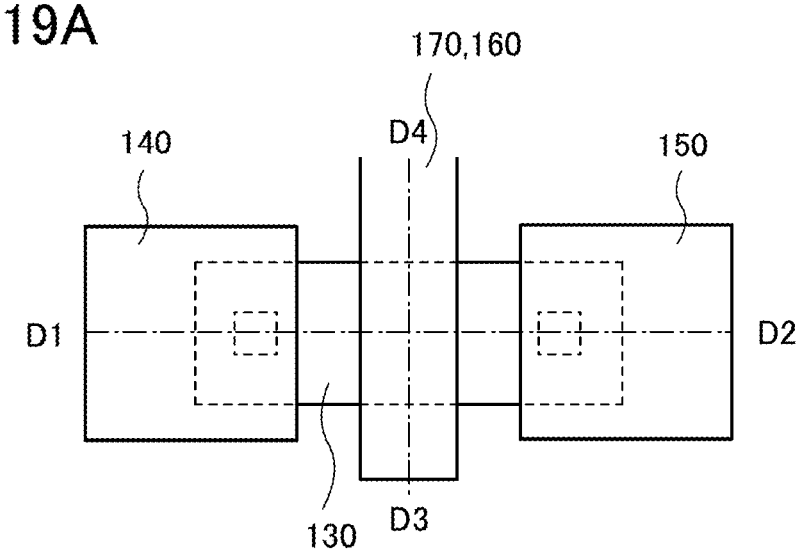
FIGS. 19A and 19B are a top view and a cross-sectional view illustrating a transistor.
Figure 19B:
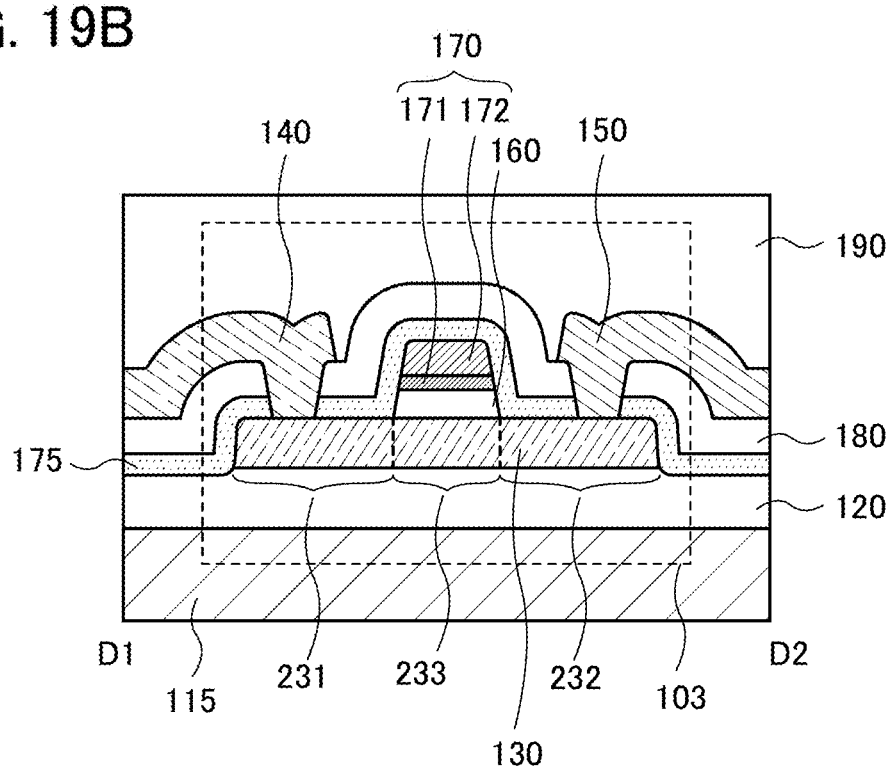

The transistor of one embodiment of the present invention may have a structure illustrated in FIGS. 19A and 19B. FIG. 19A is a top view of a transistor 103. A cross section in the direction of a dashed-dotted line D1-D2 in FIG. 19A is illustrated in FIG. 19B. A cross section in the direction of a dashed-dotted line D3-D4 in FIG. 19A is illustrated in FIG. 23A. The direction of the dashed-dotted line D1-D2 may be referred to as a channel length direction, and the direction of the dashed-dotted line D3-D4 may be referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layer 140 and the conductive layer 150 electrically connected to the oxide semiconductor layer 130 through openings provided in the insulating layer 175 and the insulating layer 180. The transistor 103 may also include, for example, the insulating layer 190 (planarization film) in contact with the insulating layer 180, the conductive layer 140, and the conductive layer 150 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 19B can function as a source region, a drain region, and a channel formation region, respectively. The region 231 and the region 232 are in contact with the insulating layer 175. When an insulating material containing hydrogen is used for the insulating layer 175, for example, the resistance of the region 231 and the region 232 can be reduced.

Specifically, interaction between oxygen vacancy generated in the region 231 and the region 232 in the steps up to the formation of the insulating layer 175 and hydrogen that diffuses into the region 231 and the region 232 from the insulating layer 175 changes the region 231 and the region 232 to n-type regions with low resistance. As the insulating material containing hydrogen, for example, a silicon nitride film, an aluminum nitride film, or the like can be used.

Figure 20A:
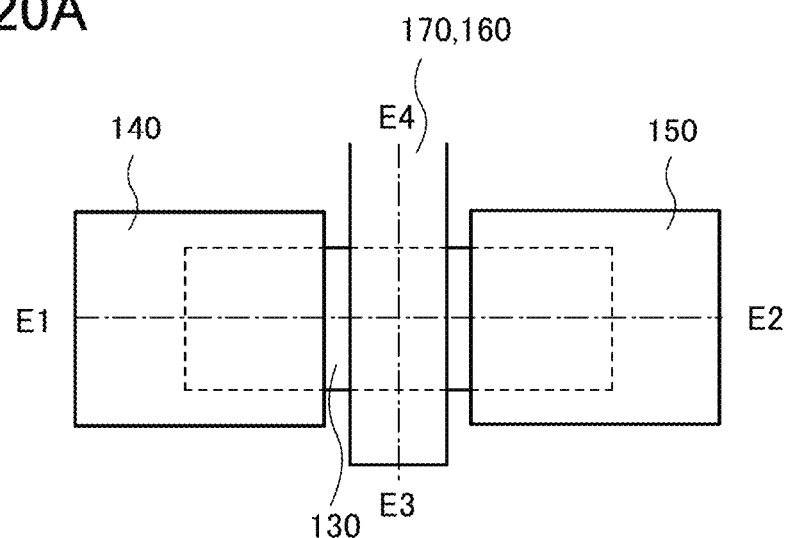
FIGS. 20A and 20B are a top view and a cross-sectional view illustrating a transistor.
Figure 20B:
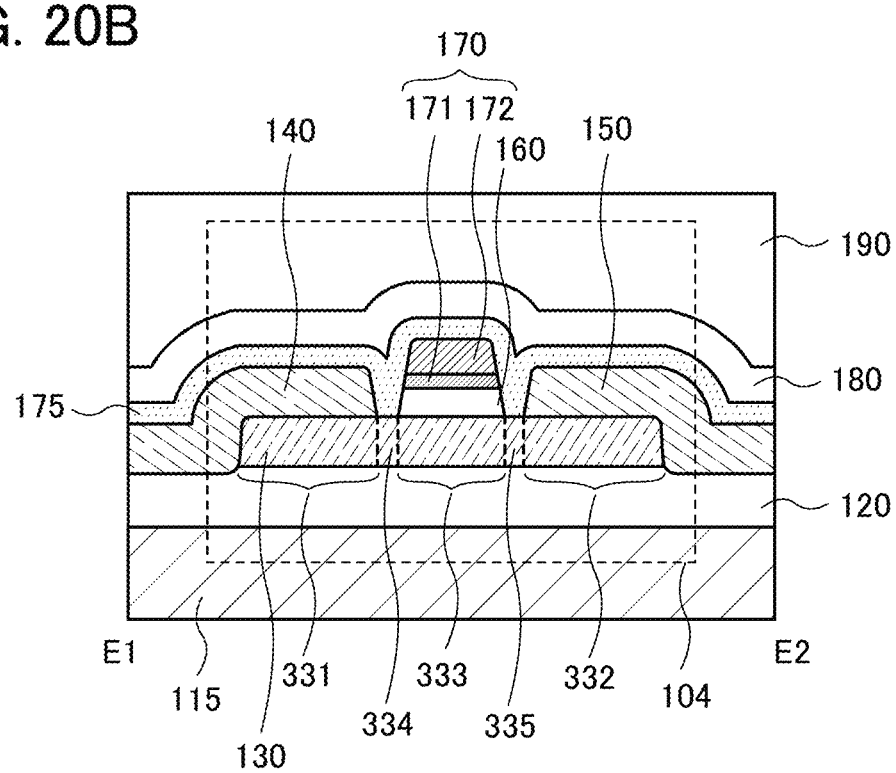

The transistor of one embodiment of the present invention may have a structure illustrated in FIGS. 20A and 20B. FIG. 20A is a top view of a transistor 104. A cross section in the direction of a dashed-dotted line E1-E2 in FIG. 20A is illustrated in FIG. 20B. A cross section in the direction of a dashed-dotted line E3-E4 in FIG. 20A is illustrated in FIG. 23A. The direction of the dashed-dotted line E1-E2 may be referred to as a channel length direction, and the direction of the dashed-dotted line E3-E4 may be referred to as a channel width direction.

The transistor 104 has the same structure as the transistor 103 except that the conductive layer 140 and the conductive layer 150 overlap with and are in contact with end portions of the oxide semiconductor layer 130.

In FIG. 20B, a region 331 and a region 334 can function as a source region, a region 332 and a region 335 can function as a drain region, and a region 333 can function as a channel formation region. The resistance of the region 331 and the region 332 can be reduced in a manner similar to that of the region 231 and the region 232 in the transistor 101. The resistance of the region 334 and the region 335 can be reduced in a manner similar to that of the region 231 and the region 232 in the transistor 103. In the case where the length of the region 334 and the region 335 in the channel length direction is less than or equal to 100 nm, preferably less than or equal to 50 nm, a gate electric field prevents a significant decrease in on-state current; therefore, a reduction in resistance of the region 334 and the region 335 as described above is not necessarily performed.

The transistor 103 and the transistor 104 each have a self-aligned structure not including a region where the conductive layer 170 overlaps each of the conductive layers 140 and 150. A transistor with a self-aligned structure, which has extremely small parasitic capacitance between a gate electrode layer and source and drain electrode layers, is suitable for applications that require high-speed operation.

Figure 21A:
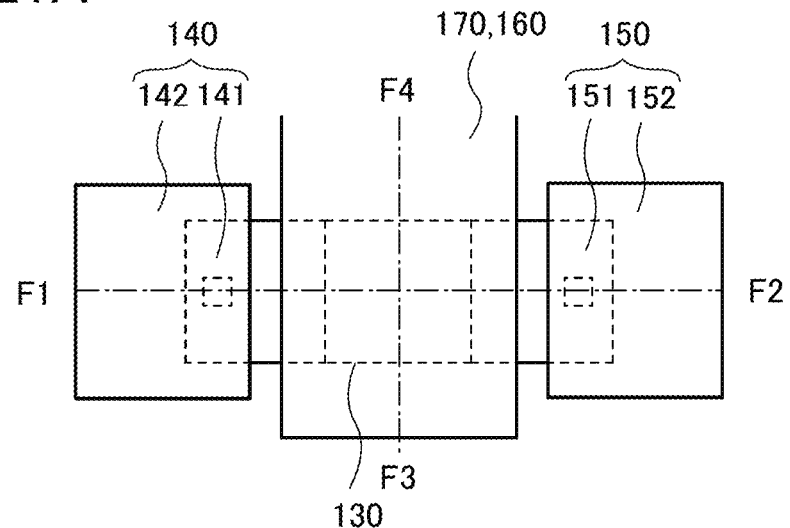
FIGS. 21A and 21B are a top view and a cross-sectional view illustrating a transistor.
Figure 21B:
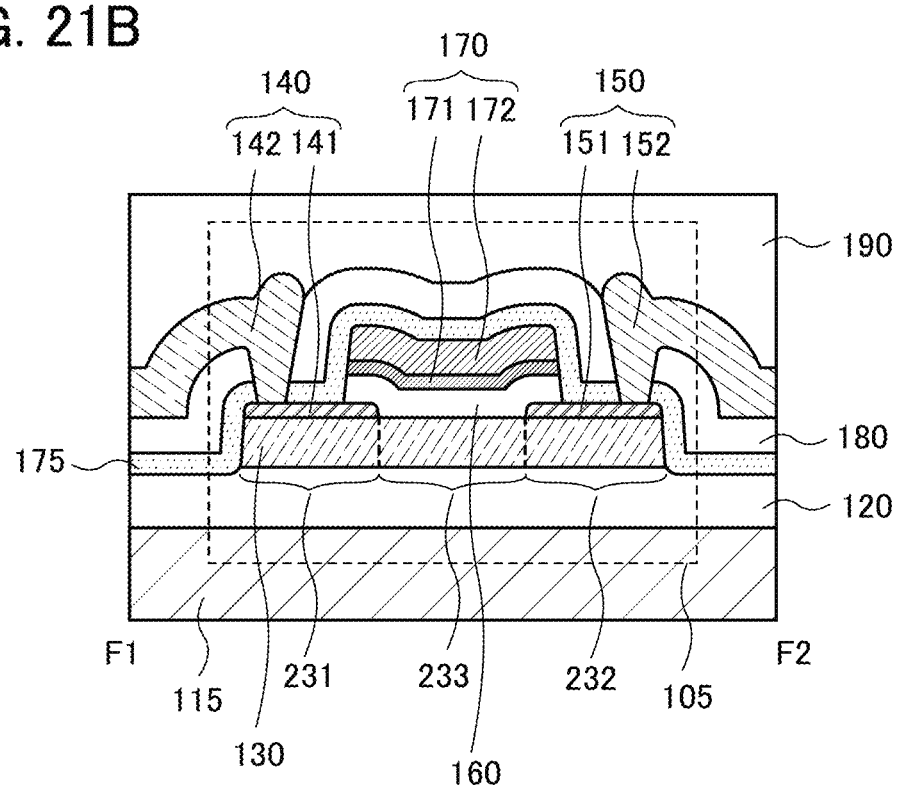

The transistor of one embodiment of the present invention may have a structure illustrated in FIGS. 21A and 21B. FIG. 21A is a top view of a transistor 105. A cross section in the direction of a dashed-dotted line F1-F2 in FIG. 21A is illustrated in FIG. 21B. A cross section in the direction of a dashed-dotted line F3-F4 in FIG. 21A is illustrated in FIG. 23A. The direction of the dashed-dotted line F1-F2 may be referred to as a channel length direction, and the direction of the dashed-dotted line F3-F4 may be referred to as a channel width direction.

The transistor 105 includes the insulating layer 120 in contact with the substrate 115; the oxide semiconductor layer 130 in contact with the insulating layer 120; a conductive layer 141 and a conductive layer 151 electrically connected to the oxide semiconductor layer 130; the insulating layer 160 in contact with the oxide semiconductor layer 130, the conductive layer 141, and the conductive layer 151; the conductive layer 170 in contact with the insulating layer 160; the insulating layer 175 in contact with the oxide semiconductor layer 130, the conductive layer 141, the conductive layer 151, the insulating layer 160, and the conductive layer 170; the insulating layer 180 in contact with the insulating layer 175; and a conductive layer 142 and a conductive layer 152 electrically connected to the conductive layer 141 and the conductive layer 151, respectively, through openings provided in the insulating layer 175 and the insulating layer 180. The transistor 105 may also include, for example, the insulating layer 190 (planarization film) in contact with the insulating layer 180, the conductive layer 142, and the conductive layer 152 as necessary.

Here, the conductive layer 141 and the conductive layer 151 are in contact with the top surface of the oxide semiconductor layer 130 and are not in contact with side surfaces of the oxide semiconductor layer 130.

The transistor 105 has the same structure as the transistor 101 except that the conductive layer 141 and the conductive layer 151 are provided, that openings provided in the insulating layer 175 and the insulating layer 180 are provided, and that the conductive layer 142 and the conductive layer 152 electrically connected to the conductive layer 141 and the conductive layer 151, respectively, through the openings are provided. The conductive layer 140 (the conductive layer 141 and the conductive layer 142) can function as a source electrode layer, and the conductive layer 150 (the conductive layer 151 and the conductive layer 152) can function as a drain electrode layer.

Figure 22A:
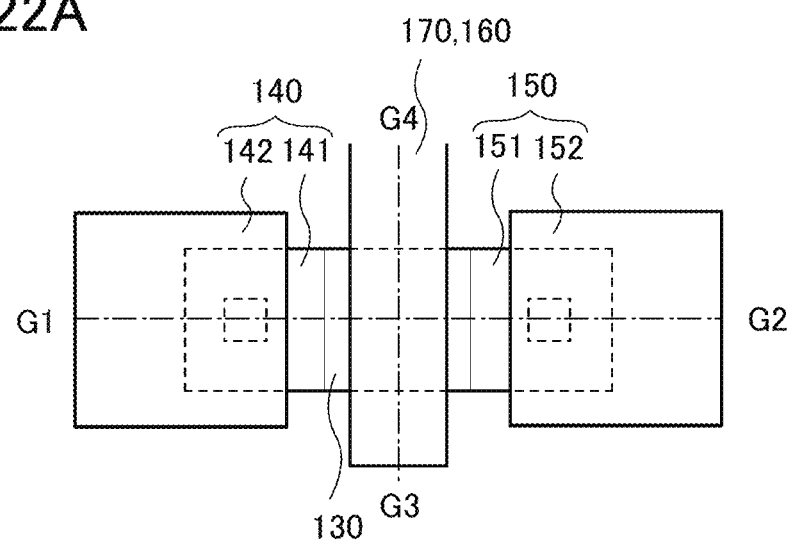
FIGS. 22A and 22B are a top view and a cross-sectional view illustrating a transistor.
Figure 22B:
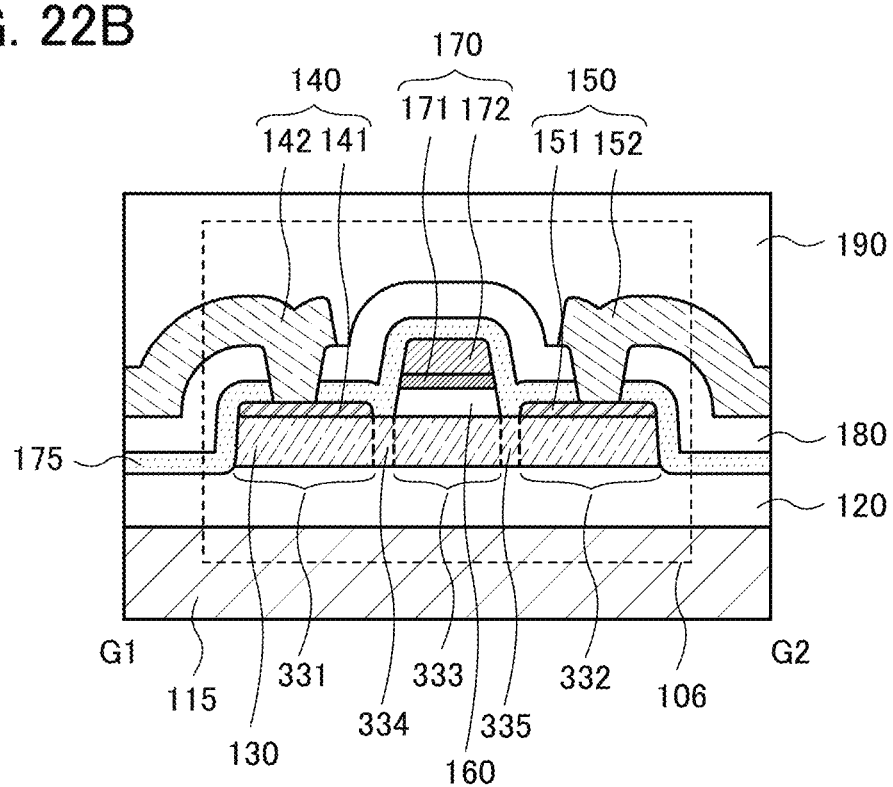

The transistor of one embodiment of the present invention may have a structure illustrated in FIGS. 22A and 22B. FIG. 22A is a top view of a transistor 106. A cross section in the direction of a dashed-dotted line G1-G2 in FIG. 22A is illustrated in FIG. 22B. A cross section in the direction of a dashed-dotted line G3-G4 in FIG. 22A is illustrated in FIG. 23A. The direction of the dashed-dotted line G1-G2 may be referred to as a channel length direction, and the direction of the dashed-dotted line G3-G4 may be referred to as a channel width direction.

The transistor 106 includes the insulating layer 120 in contact with the substrate 115; the oxide semiconductor layer 130 in contact with the insulating layer 120; the conductive layer 141 and the conductive layer 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layer 141, the conductive layer 151, the insulating layer 160, and the conductive layer 170; the insulating layer 180 in contact with the insulating layer 175; and the conductive layer 142 and the conductive layer 152 electrically connected to the conductive layer 141 and the conductive layer 151, respectively, through openings provided in the insulating layer 175 and the insulating layer 180. The transistor 106 may also include, for example, the insulating layer 190 (planarization film) in contact with the insulating layer 180, the conductive layer 142, and the conductive layer 152 as necessary.

Here, the conductive layer 141 and the conductive layer 151 are in contact with the top surface of the oxide semiconductor layer 130 and are not in contact with side surfaces of the oxide semiconductor layer 130.

The transistor 106 has the same structure as the transistor 103 except that the conductive layer 141 and the conductive layer 151 are provided. The conductive layer 140 (the conductive layer 141 and the conductive layer 142) can function as a source electrode layer, and the conductive layer 150 (the conductive layer 151 and the conductive layer 152) can function as a drain electrode layer.

In the structures of the transistor 105 and the transistor 106, the conductive layer 140 and the conductive layer 150 are not in contact with the insulating layer 120. These structures make the insulating layer 120 less likely to be deprived of oxygen by the conductive layer 140 and the conductive layer 150 and facilitate oxygen supply from the insulating layer 120 to the oxide semiconductor layer 130.

Note that an impurity for forming oxygen vacancy to increase conductivity may be added to the region 231 and the region 232 in the transistor 103 and the region 334 and the region 335 in the transistor 104 and the transistor 106. As an impurity for forming oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, an ion implantation method, an ion doping method, a plasma immersion ion implantation method, or the like can be used.

When the above element is added as an impurity element to the oxide semiconductor layer, a bond between a metal element and oxygen in the oxide semiconductor layer is cleaved, whereby oxygen vacancy is formed. Interaction between oxygen vacancy in the oxide semiconductor layer and hydrogen that remains in the oxide semiconductor layer or is added to the oxide semiconductor layer in a later step can increase the conductivity of the oxide semiconductor layer.

When hydrogen is added to an oxide semiconductor in which oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor that is transformed to be conductive.

The oxide conductor is a degenerate semiconductor, and it is suggested that the conduction band edge equals to or substantially equals to the Fermi level. For that reason, an ohmic contact is obtained between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 26A:
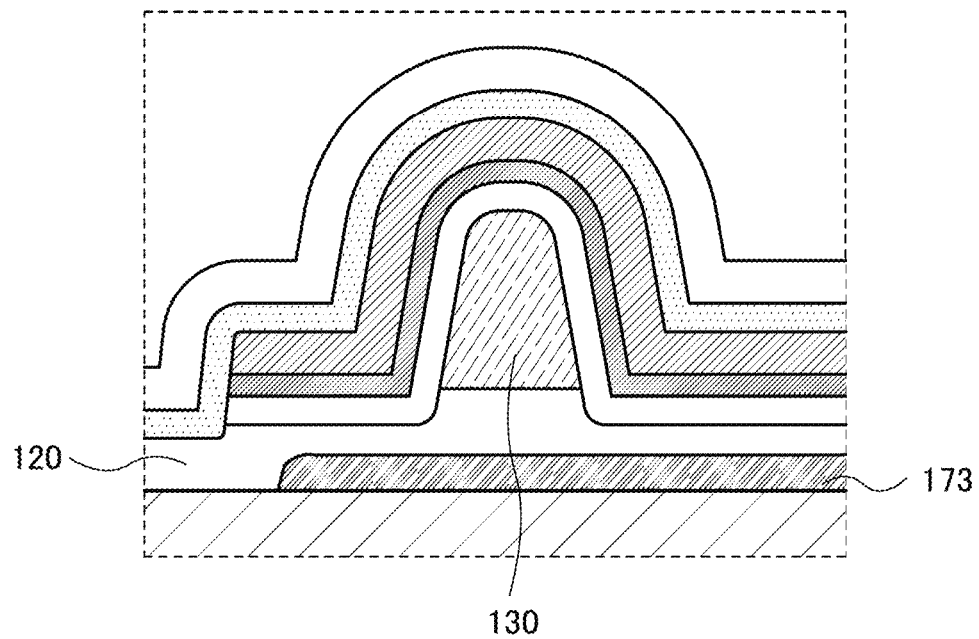
FIGS. 26A and 26B each illustrate a cross section of a transistor in the channel width direction.
Figure 26B:
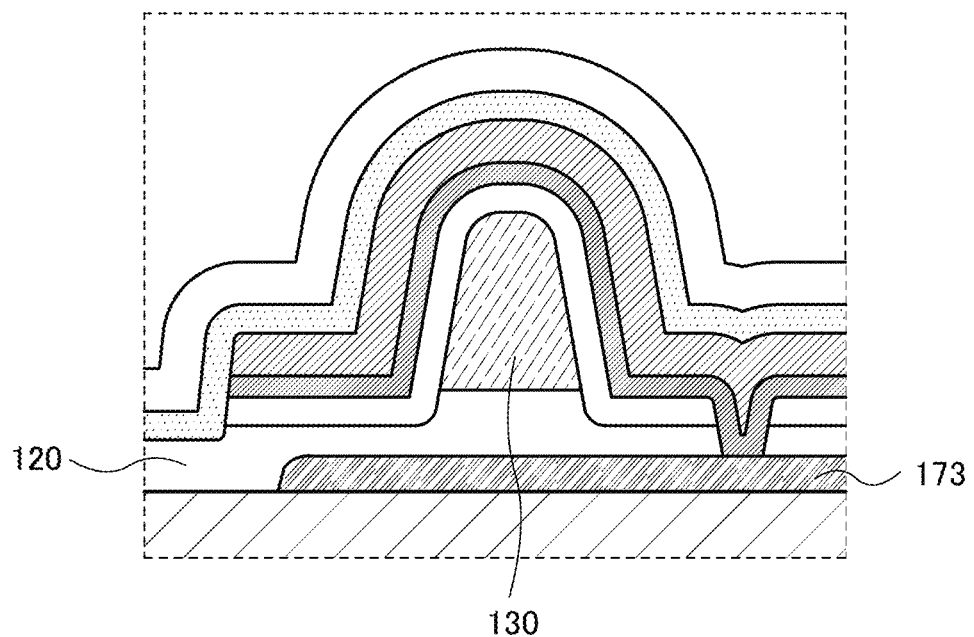

The transistor of one embodiment of the present invention may include a conductive layer 173 between the oxide semiconductor layer 130 and the substrate 115 as illustrated in the cross-sectional views in the channel length direction in FIGS. 24A to 24C and FIGS. 25A to 25C and the cross-sectional views in the channel width direction in FIGS. 26A and 26B. When the conductive layer 173 is used as a second gate electrode layer (back gate), the on-state current can be further increased or the threshold voltage can be controlled. In the cross-sectional views in FIGS. 24A to 24C and FIGS. 25A to 25C, the width of the conductive layer 173 may be shorter than that of the oxide semiconductor layer 130. Moreover, the width of the conductive layer 173 may be shorter than that of the conductive layer 170.

In order to increase the on-state current, for example, the conductive layer 170 and the conductive layer 173 are set to have the same potential, and the transistor is driven as a double-gate transistor. Further, to control the threshold voltage, a fixed potential, which is different from a potential of the conductive layer 170, is supplied to the conductive layer 173. To set the conductive layer 170 and the conductive layer 173 at the same potential, for example, as shown in FIG. 26B, the conductive layer 170 and the conductive layer 173 may be electrically connected to each other through a contact hole.

The transistors 101 to 106 shown in FIGS. 17A and 17B, FIGS. 18A and 18B, FIGS. 19A and 19B, FIGS. 20A and 20B, FIGS. 21A and 21B, and FIGS. 22A and 22B are examples in which the oxide semiconductor layer 130 is a single layer; alternatively, the oxide semiconductor layer 130 may be a stacked layer. The oxide semiconductor layer 130 in the transistors 101 to 106 can be replaced with the oxide semiconductor layer 130 shown in FIGS. 27A to 27C or FIGS. 28A to 28C.

Figure 27A:
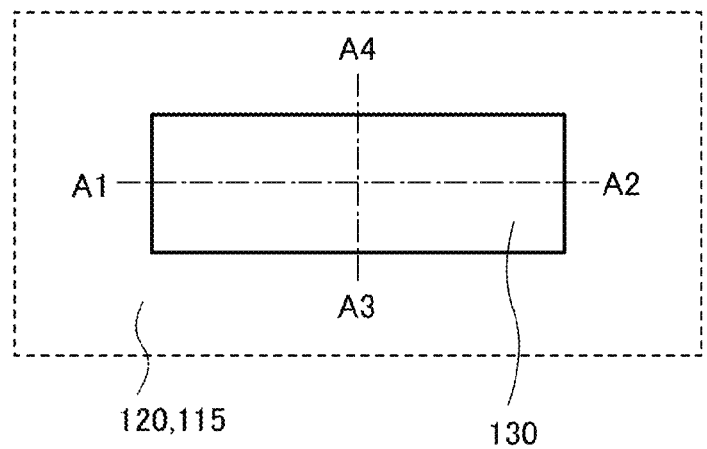
FIGS. 27A to 27C are a top view and cross-sectional views illustrating a semiconductor layer.
Figure 27B:
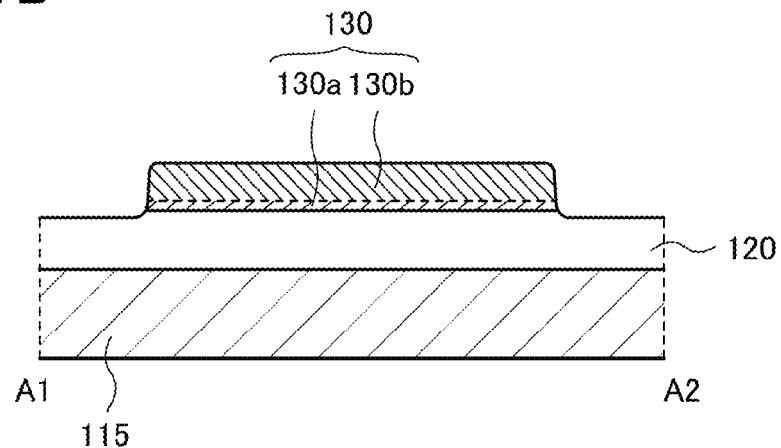
Figure 27C:
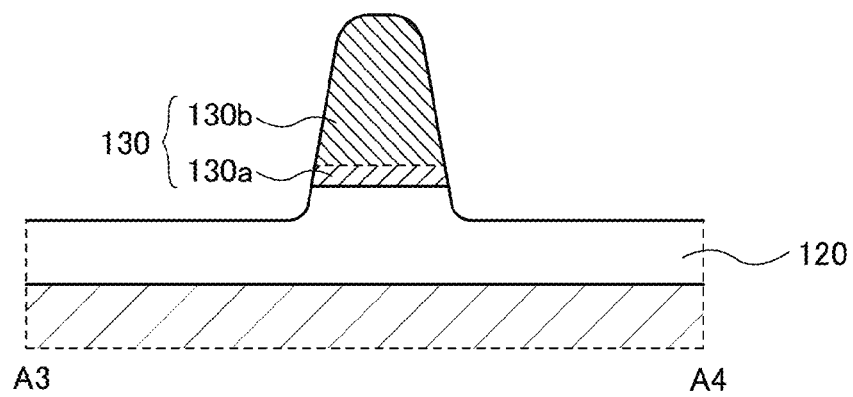

FIGS. 27A to 27C are a top view and cross-sectional views of the oxide semiconductor layer 130 with a two-layer structure. FIG. 27B illustrates a cross section in the direction of a dashed-dotted line A1-A2 in FIG. 27A. FIG. 27C illustrates a cross section in the direction of a dashed-dotted line A3-A4 in FIG. 27A.

Figure 28A:
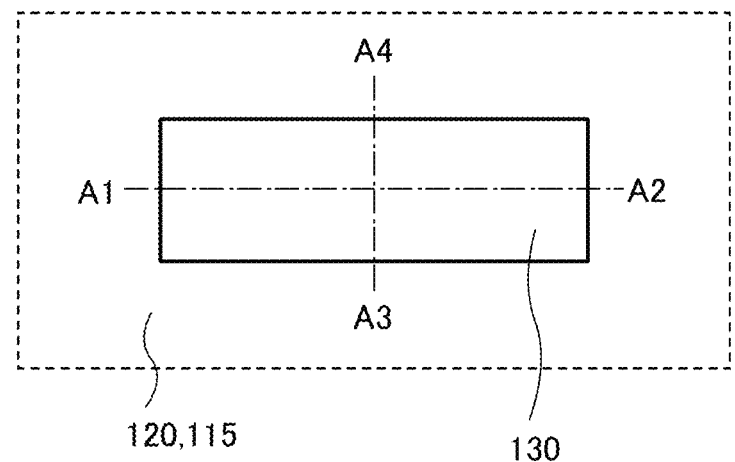
FIGS. 28A to 28C are a top view and cross-sectional views illustrating a semiconductor layer.
Figure 28B:
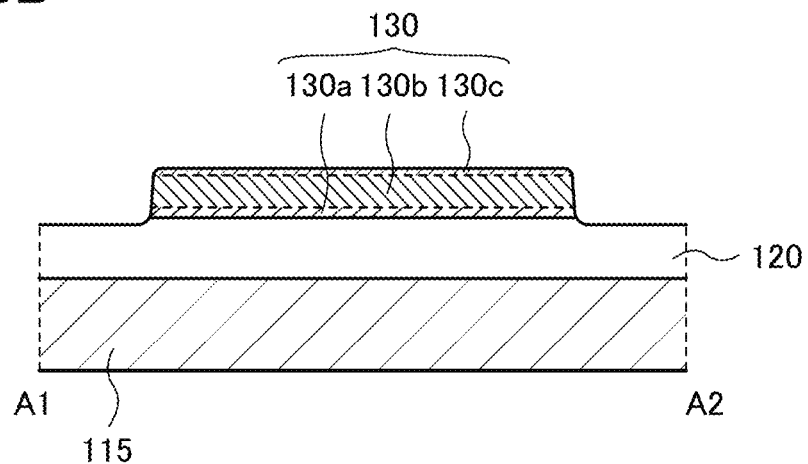
Figure 28C:
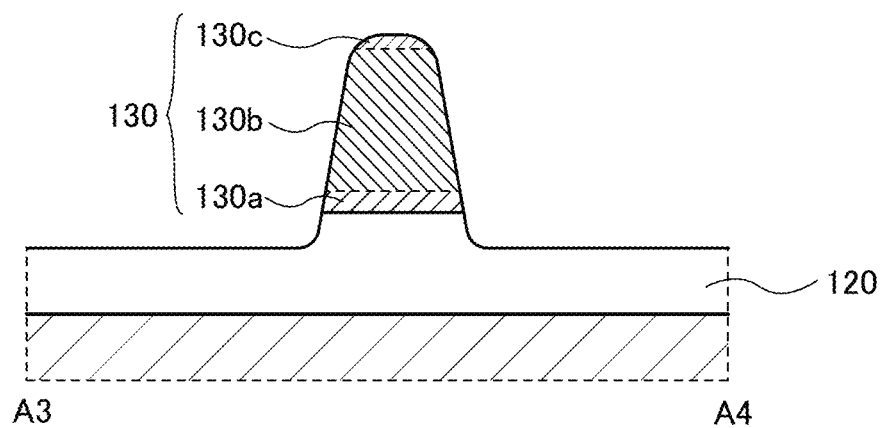

FIGS. 28A to 28C are a top view and cross-sectional views of the oxide semiconductor layer 130 with a three-layer structure. FIG. 28B illustrates a cross section in the direction of a dashed-dotted line A1-A2 in FIG. 28A. FIG. 28C illustrates a cross section in the direction of a dashed-dotted line A3-A4 in FIG. 28A.

Oxide semiconductor layers with different compositions, for example, can be used as an oxide semiconductor layer 130a, an oxide semiconductor layer 130b, and an oxide semiconductor layer 130c.

Figure 29A:
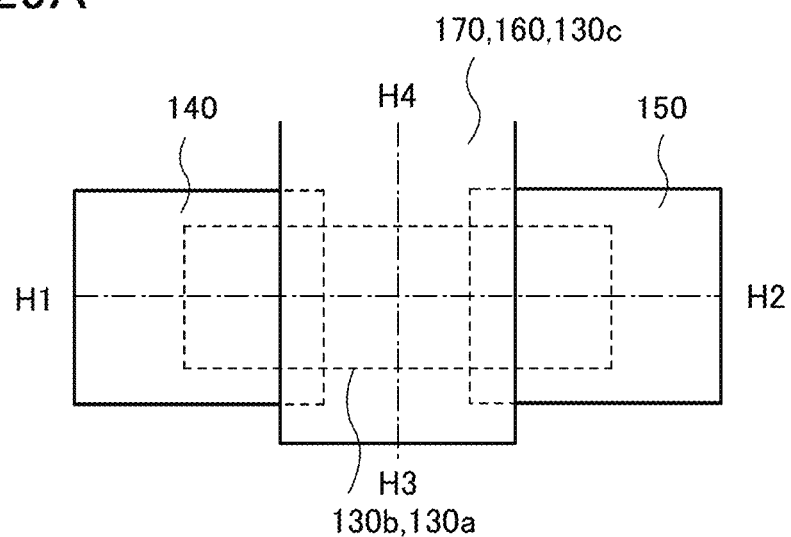
FIGS. 29A and 29B are a top view and a cross-sectional view illustrating a transistor.
Figure 29B:
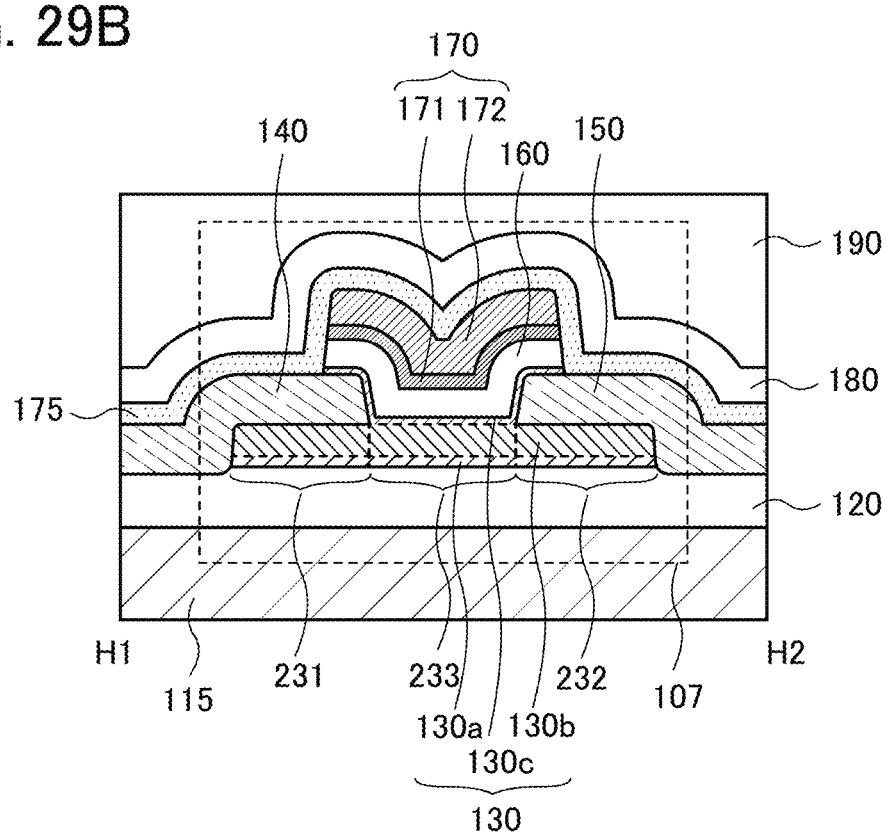
Figure 35A:
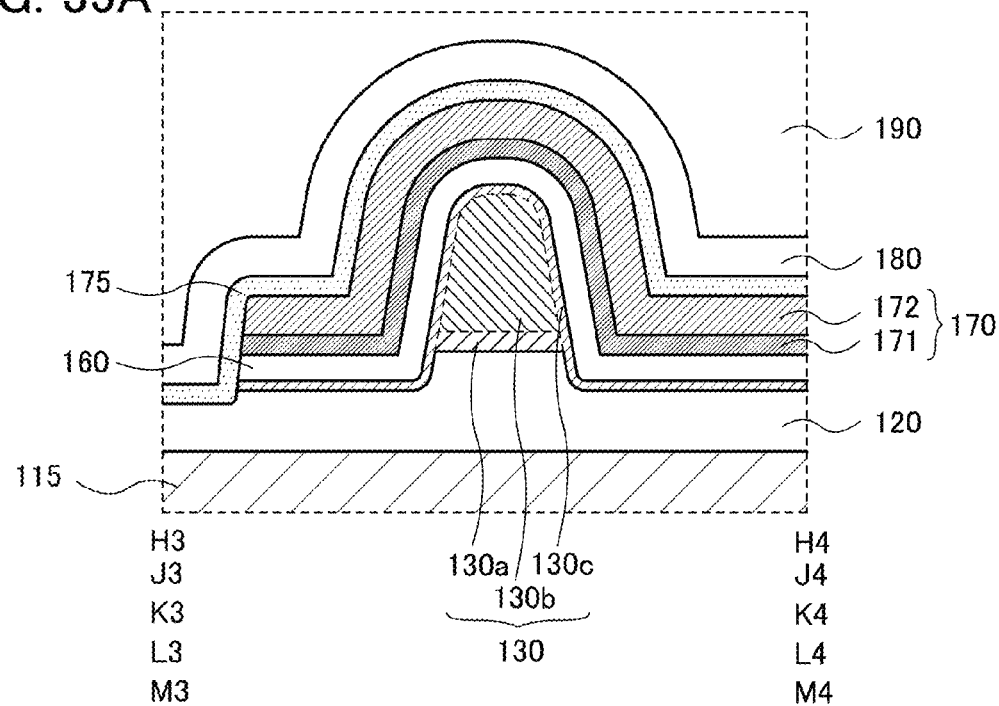
FIGS. 35A and 35B each illustrate a cross section of a transistor in the channel width direction.

The transistor of one embodiment of the present invention may have a structure illustrated in FIGS. 29A and 29B. FIG. 29A is a top view of a transistor 107. A cross section in the direction of a dashed-dotted line H1-H2 in FIG. 29A is illustrated in FIG. 29B. A cross section in the direction of a dashed-dotted line H3-H4 in FIG. 29A is illustrated in FIG. 35A. The direction of the dashed-dotted line H1-H2 may be referred to as a channel length direction, and the direction of the dashed-dotted line H3-H4 may be referred to as a channel width direction.

The transistor 107 includes the insulating layer 120 in contact with the substrate 115; a stack of the oxide semiconductor layer 130a and the oxide semiconductor layer 130b, in contact with the insulating layer 120; the conductive layer 140 and the conductive layer 150 electrically connected to the stack; the oxide semiconductor layer 130c in contact with the stack, the conductive layer 140, and the conductive layer 150; the insulating layer 160 in contact with the oxide semiconductor layer 130c; the conductive layer 170 in contact with the insulating layer 160; the insulating layer 175 in contact with the conductive layer 140, the conductive layer 150, the oxide semiconductor layer 130c, the insulating layer 160, and the conductive layer 170; and the insulating layer 180 in contact with the insulating layer 175. The transistor 107 may also include, for example, the insulating layer 190 (planarization film) in contact with the insulating layer 180 as necessary.

The transistor 107 has the same structure as the transistor 101 except that the oxide semiconductor layer 130 includes two layers (the oxide semiconductor layer 130*a* and the oxide semiconductor layer 130*b*) in the region 231 and the region 232, that the oxide semiconductor layer 130 includes three layers (the oxide semiconductor layer 130*a*, the oxide semiconductor layer 130*b*, and the oxide semiconductor layer 130*c*) in the region 233, and that part of the oxide semiconductor layer (the oxide semiconductor layer 130*c*) exists between the insulating layer 160 and the conductive layers 140 and 150.

Figure 30A:
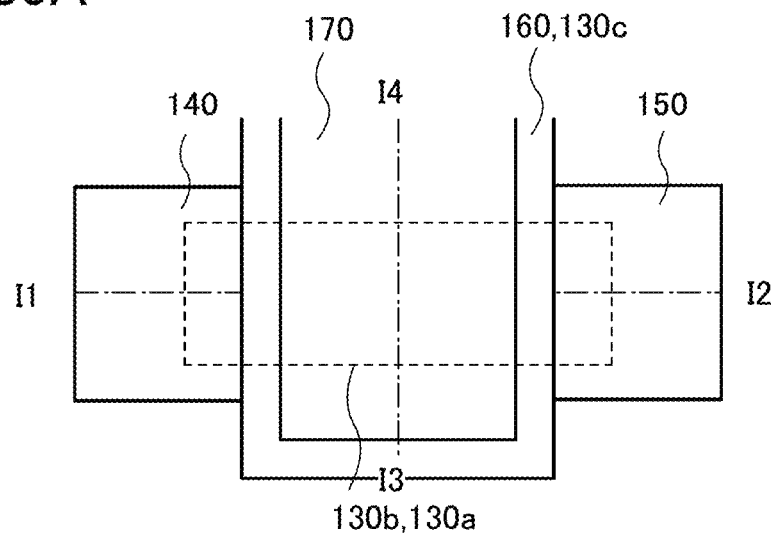
FIGS. 30A and 30B are a top view and a cross-sectional views illustrating a transistor.
Figure 30B:
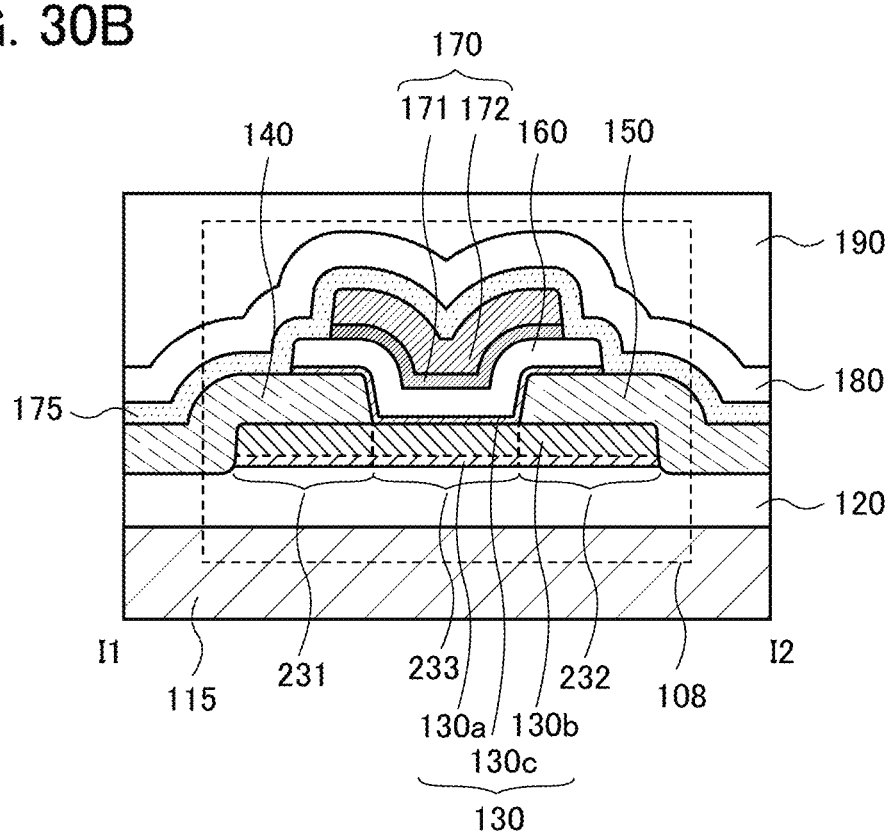
Figure 35B:
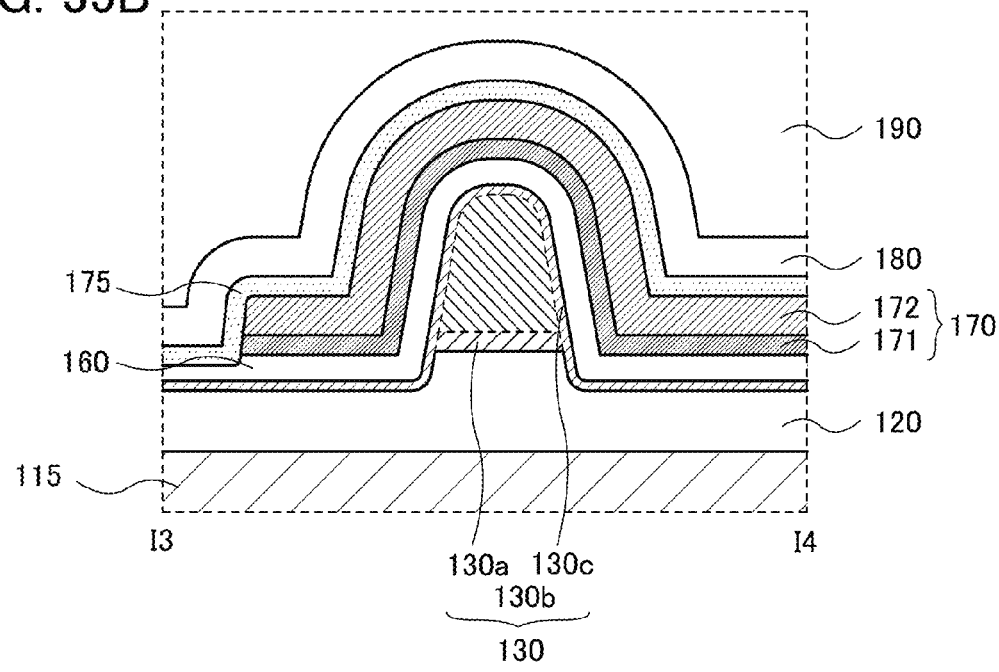
Figure 36A:
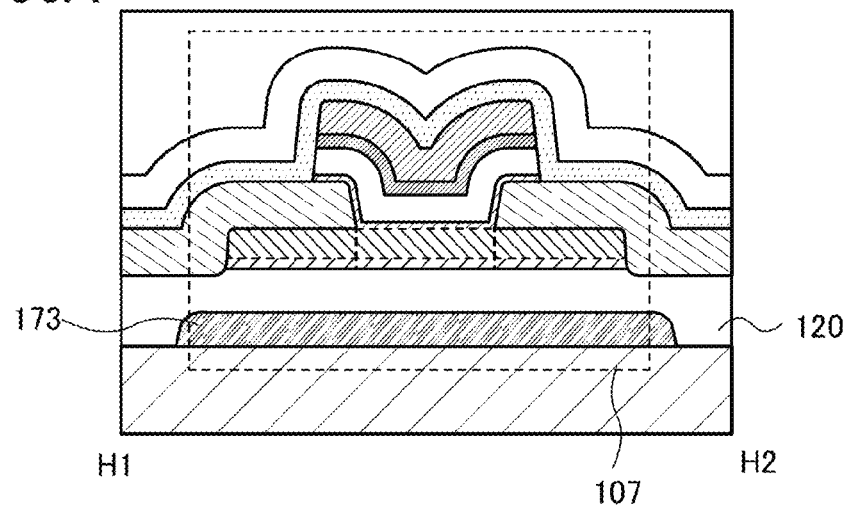
FIGS. 36A to 36C each illustrate a cross section of a transistor in the channel length direction.
Figure 36B:
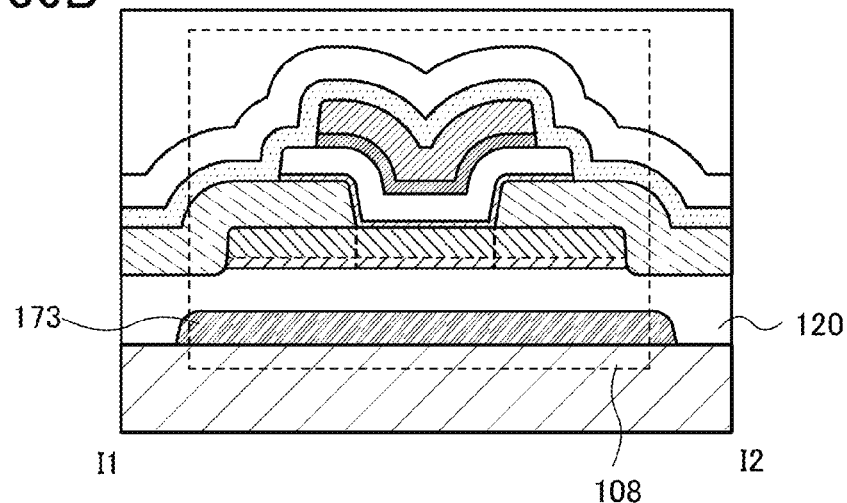
Figure 36C:
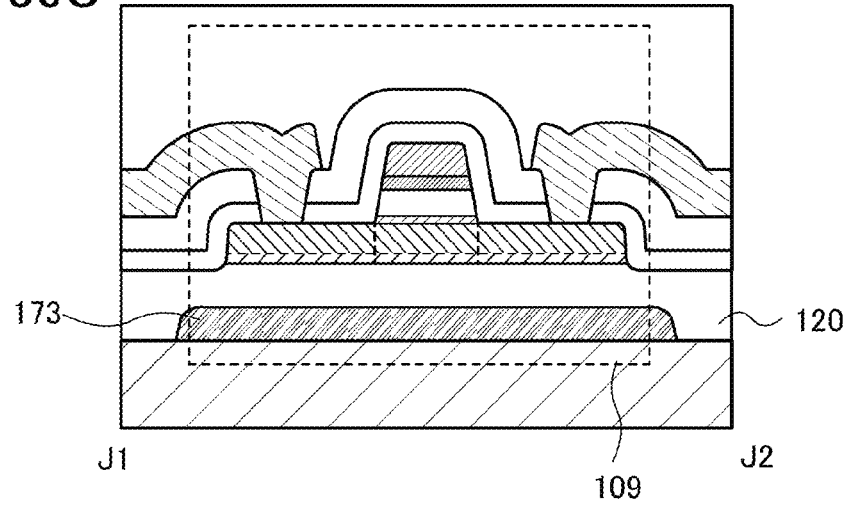
Figure 37A:
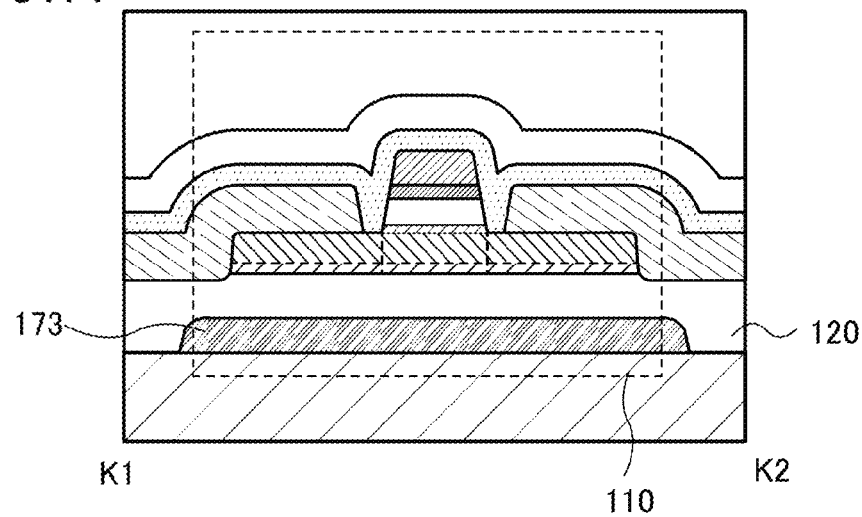
FIGS. 37A to 37C each illustrate a cross section of a transistor in the channel length direction.
Figure 37B:
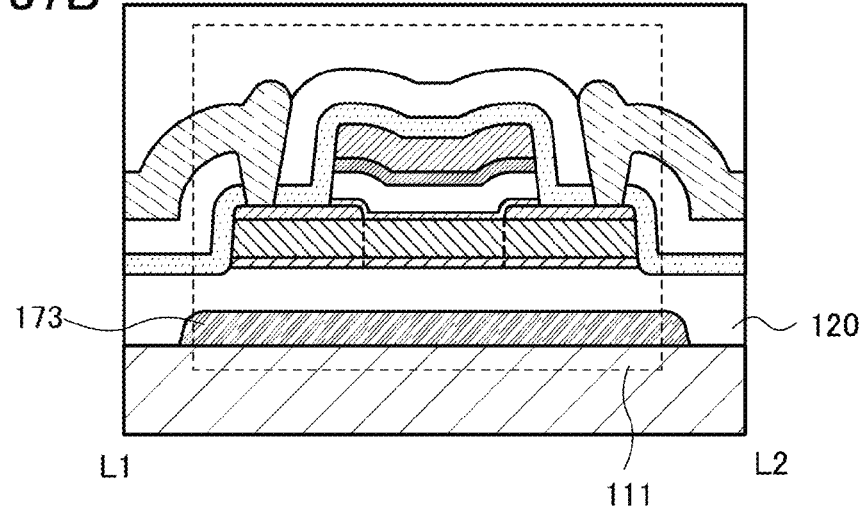
Figure 37C:
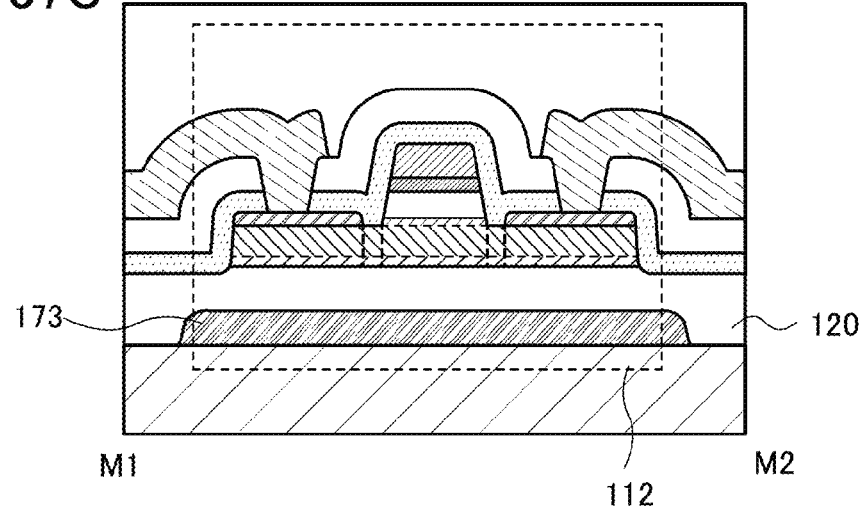

The transistor of one embodiment of the present invention may have a structure illustrated in FIGS. 30A and 30B. FIG. 30A is a top view of a transistor 108. A cross section in the direction of a dashed-dotted line 11-12 in FIG. 30A is illustrated in FIG. 30B. A cross section in the direction of a dashed-dotted line 13-14 in FIG. 30A is illustrated in FIG. 35B. The direction of the dashed-dotted line 11-12 may be referred to as a channel length direction, and the direction of the dashed-dotted line 13-14 may be referred to as a channel width direction.

The transistor 108 is different from the transistor 107 in that end portions of the insulating layer 160 and the oxide semiconductor layer 130*c* are not aligned with the end portion of the conductive layer 170.

Figure 31A:
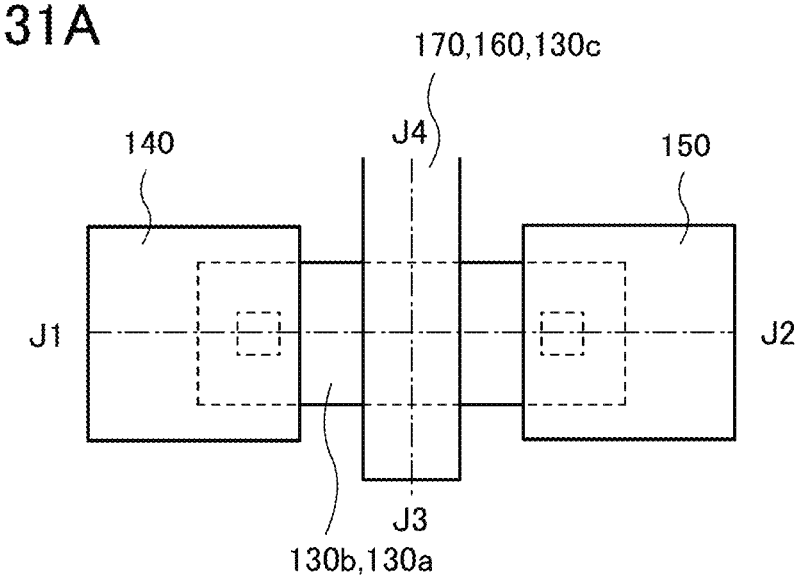
FIGS. 31A and 31B are a top view and a cross-sectional view illustrating a transistor.
Figure 31B:
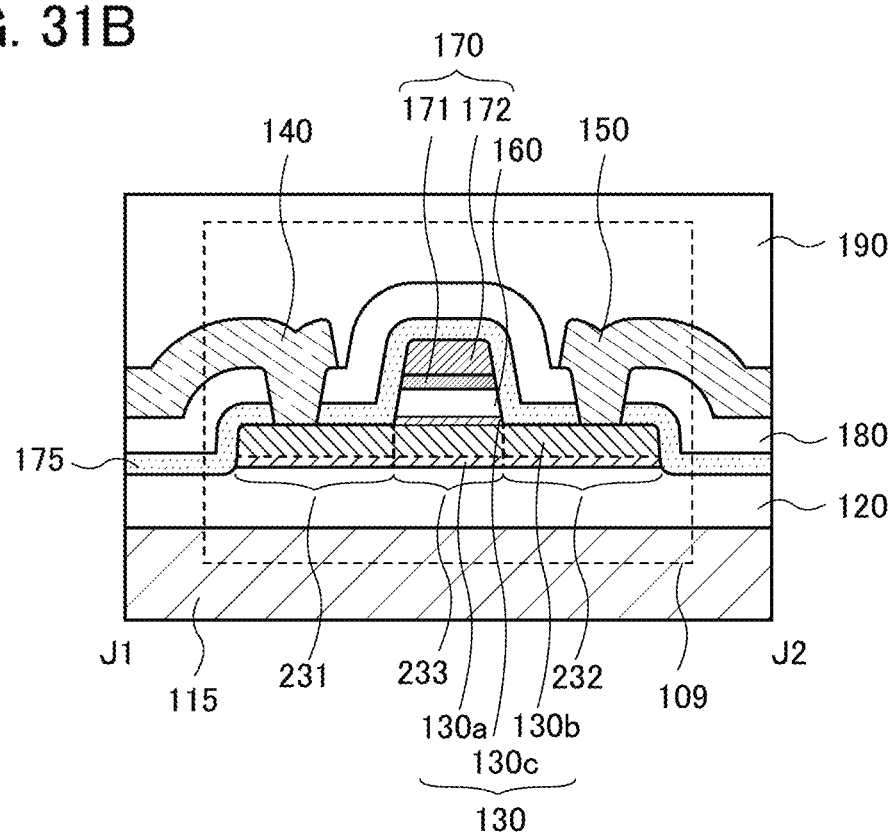

The transistor of one embodiment of the present invention may have a structure illustrated in FIGS. 31A and 31B. FIG. 31A is a top view of a transistor 109. A cross section in the direction of a dashed-dotted line J1-J2 in FIG. 31A is illustrated in FIG. 31B. A cross section in the direction of a dashed-dotted line J3-J4 in FIG. 31A is illustrated in FIG. 35A. The direction of the dashed-dotted line J1-J2 may be referred to as a channel length direction, and the direction of the dashed-dotted line J3-J4 may be referred to as a channel width direction.

The transistor 109 includes the insulating layer 120 in contact with the substrate 115; a stack of the oxide semiconductor layer 130*a* and the oxide semiconductor layer 130*b*, in contact with the insulating layer 120; the oxide semiconductor layer 130*c* in contact with the stack; the insulating layer 160 in contact with the oxide semiconductor layer 130*c*; the conductive layer 170 in contact with the insulating layer 160; the insulating layer 175 covering the stack, the oxide semiconductor layer 130*c*, the insulating layer 160, and the conductive layer 170; the insulating layer 180 in contact with the insulating layer 175; and the conductive layer 140 and the conductive layer 150 electrically connected to the stack through openings provided in the insulating layer 175 and the insulating layer 180. The transistor 109 may also include, for example, the insulating layer 190 (planarization film) in contact with the insulating layer 180, the conductive layer 140, and the conductive layer 150 as necessary.

The transistor 109 has the same structure as the transistor 103 except that the oxide semiconductor layer 130 includes two layers (the oxide semiconductor layer 130*a* and the oxide semiconductor layer 130*b*) in the region 231 and the region 232 and that the oxide semiconductor layer 130 includes three layers (the oxide semiconductor layer 130*a*, the oxide semiconductor layer 130*b*, and the oxide semiconductor layer 130*c*) in the region 233.

Figure 32A:
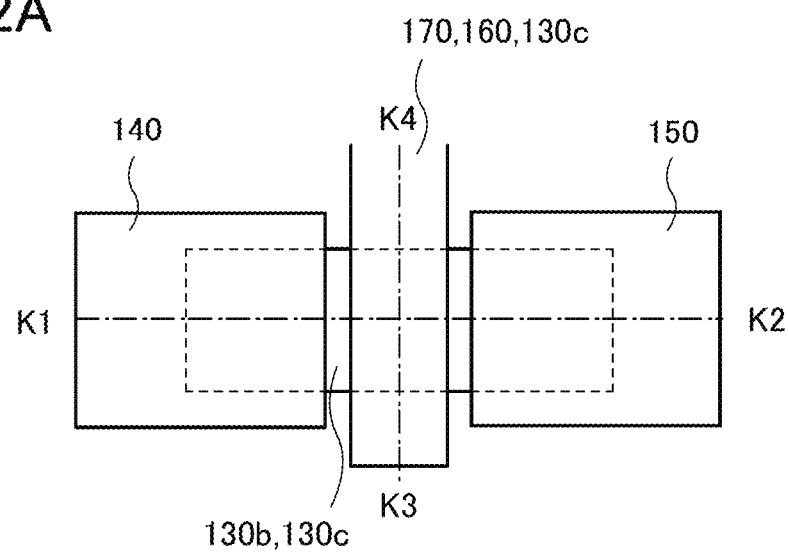
FIGS. 32A and 32B are a top view and a cross-sectional view illustrating a transistor.
Figure 32B:
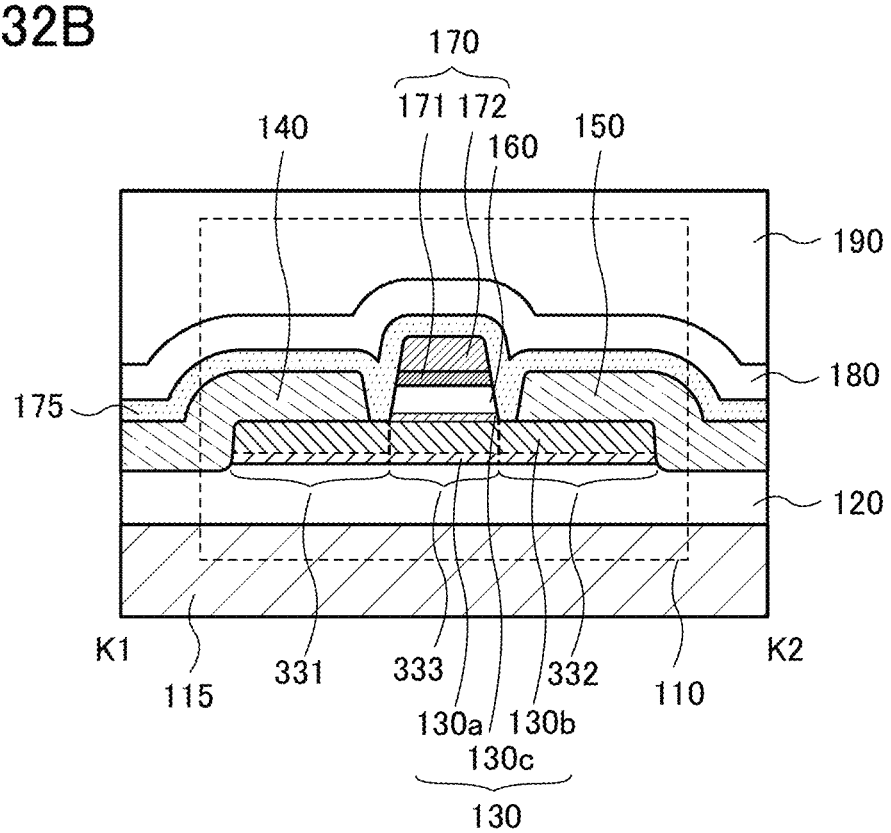

The transistor of one embodiment of the present invention may have a structure illustrated in FIGS. 32A and 32B. FIG. 32A is a top view of a transistor 110. A cross section in the direction of a dashed-dotted line K1-K2 in FIG. 32A is illustrated in FIG. 32B. A cross section in the direction of a dashed-dotted line K3-K4 in FIG. 32A is illustrated in FIG. 35A. The direction of the dashed-dotted line K1-K2 may be referred to as a channel length direction, and the direction of the dashed-dotted line K3-K4 may be referred to as a channel width direction.

The transistor 110 has the same structure as the transistor 104 except that the oxide semiconductor layer 130 includes two layers (the oxide semiconductor layer 130*a* and the oxide semiconductor layer 130*b*) in the region 331 and the region 332 and that the oxide semiconductor layer 130 includes three layers (the oxide semiconductor layer 130*a*, the oxide semiconductor layer 130*b*, and the oxide semiconductor layer 130*c*) in the region 333.

Figure 33A:
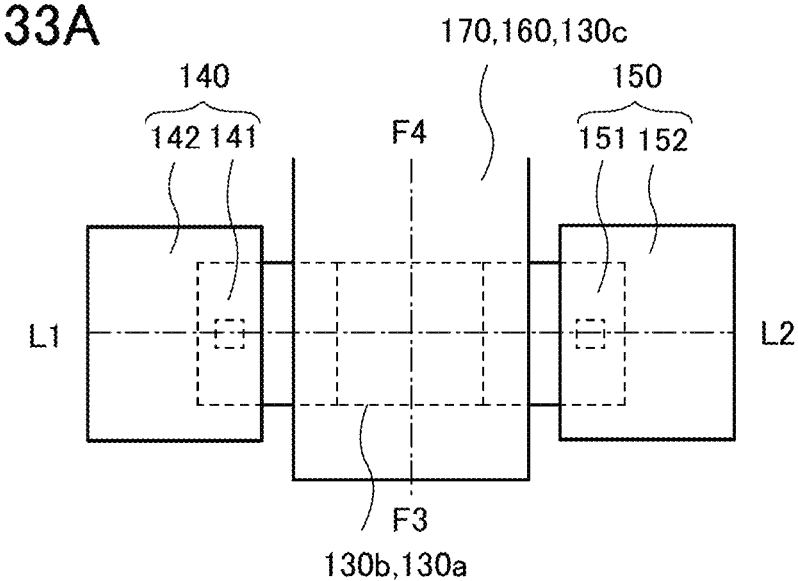
FIGS. 33A and 33B are a top view and a cross-sectional view illustrating a transistor.
Figure 33B:
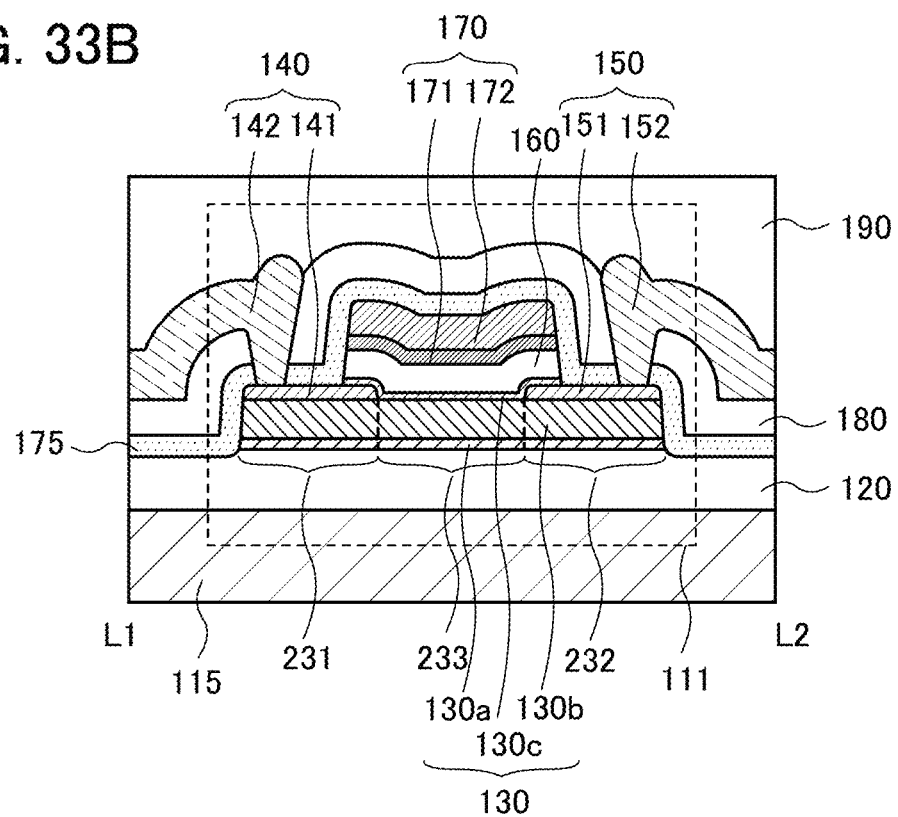

The transistor of one embodiment of the present invention may have a structure illustrated in FIGS. 33A and 33B. FIG. 33A is a top view of a transistor 111. A cross section in the direction of a dashed-dotted line L1-L2 in FIG. 33A is illustrated in FIG. 33B. A cross section in the direction of a dashed-dotted line L3-L4 in FIG. 33A is illustrated in FIG. 35A. The direction of the dashed-dotted line L1-L2 may be referred to as a channel length direction, and the direction of the dashed-dotted line L3-L4 may be referred to as a channel width direction.

The transistor 111 includes the insulating layer 120 in contact with the substrate 115; a stack of the oxide semiconductor layer 130*a* and the oxide semiconductor layer 130*b*, in contact with the insulating layer 120; the conductive layer 141 and the conductive layer 151 electrically connected to the stack; the oxide semiconductor layer 130*c* in contact with the stack, the conductive layer 141, and the conductive layer 151; the insulating layer 160 in contact with the oxide semiconductor layer 130*c*; the conductive layer 170 in contact with the insulating layer 160; the insulating layer 175 in contact with the stack, the conductive layer 141, the conductive layer 151, the oxide semiconductor layer 130*c*, the insulating layer 160, and the conductive layer 170; the insulating layer 180 in contact with the insulating layer 175; and the conductive layer 142 and the conductive layer 152 electrically connected to the conductive layer 141 and the conductive layer 151, respectively, through openings provided in the insulating layer 175 and the insulating layer 180. The transistor 111 may also include, for example, the insulating layer 190 (planarization film) in contact with the insulating layer 180, the conductive layer 142, and the conductive layer 152 as necessary.

The transistor 111 has the same structure as the transistor 105 except that the oxide semiconductor layer 130 includes two layers (the oxide semiconductor layer 130*a* and the oxide semiconductor layer 130*b*) in the region 231 and the region 232, that the oxide semiconductor layer 130 includes three layers (the oxide semiconductor layer 130*a*, the oxide semiconductor layer 130*b*, and the oxide semiconductor layer 130*c*) in the region 233, and that part of the oxide semiconductor layer (the oxide semiconductor layer 130*c*) exists between the insulating layer 160 and the conductive layers 141 and 151.

Figure 34A:
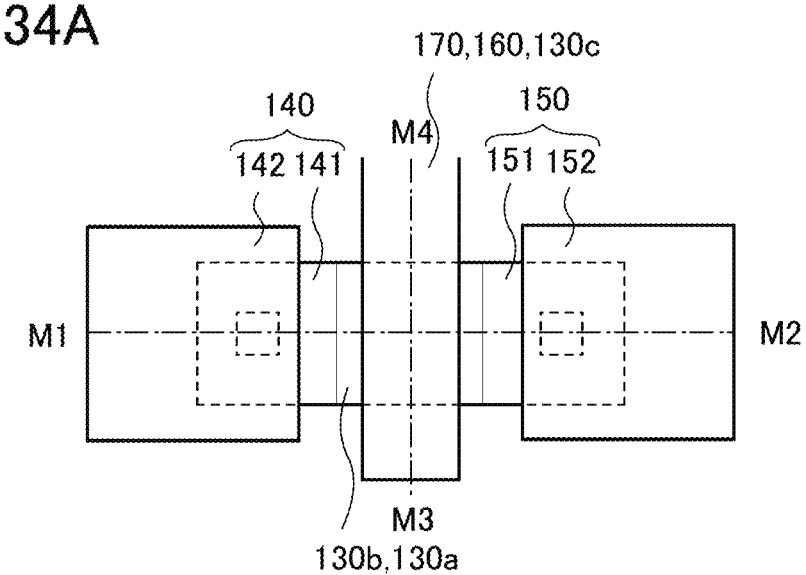
FIGS. 34A and 34B are a top view and a cross sectional view illustrating a transistor.
Figure 34B:
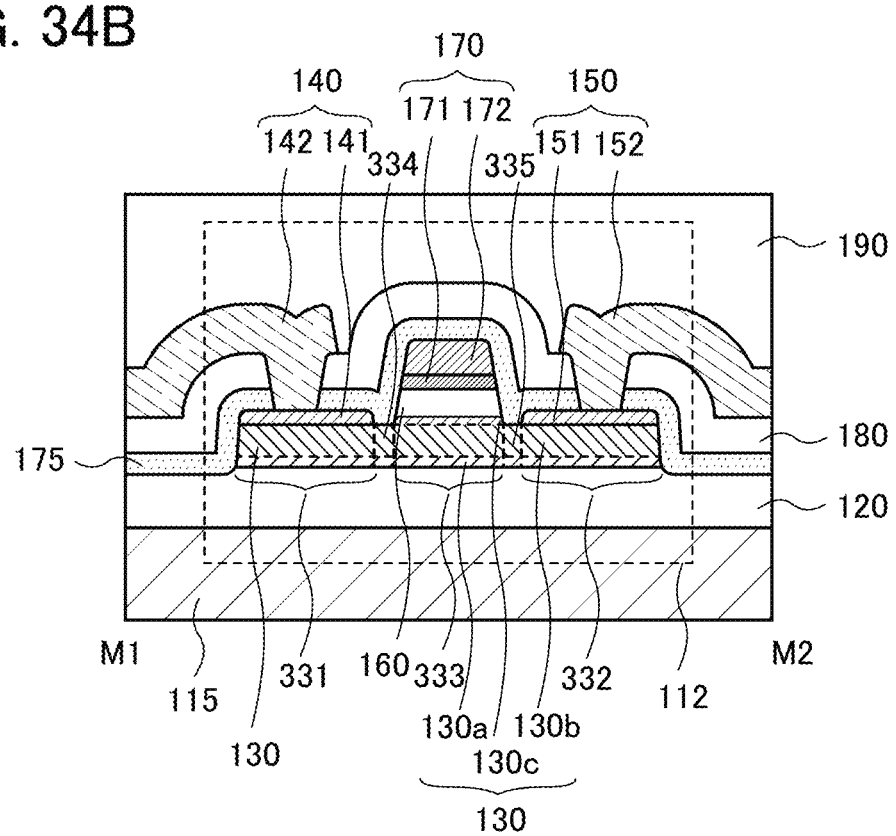

The transistor of one embodiment of the present invention may have a structure illustrated in FIGS. 34A and 34B. FIG. 34A is a top view of a transistor 112. A cross section in the direction of a dashed-dotted line M1-M2 in FIG. 34A is illustrated in FIG. 34B. A cross section in the direction of a dashed-dotted line M3-M4 in FIG. 34A is illustrated in FIG. 35A. The direction of the dashed-dotted line M1-M2 may be referred to as a channel length direction, and the direction of the dashed-dotted line M3-M4 may be referred to as a channel width direction.

The transistor 112 has the same structure as the transistor 106 except that the oxide semiconductor layer 130 includes two layers (the oxide semiconductor layer 130a and the oxide semiconductor layer 130b) in the region 331, the region 332, the region 334, and the region 335 and that the oxide semiconductor layer 130 includes three layers (the oxide semiconductor layer 130a, the oxide semiconductor layer 130b, and the oxide semiconductor layer 130c) in the region 333.

Figure 38A:
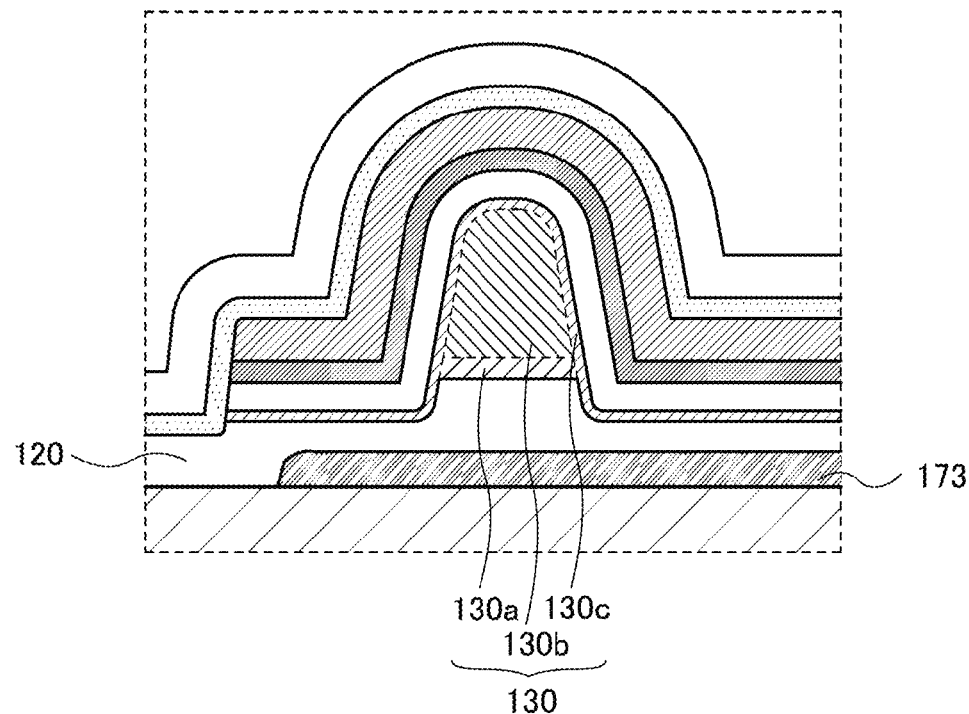
FIGS. 38A and 38B each illustrate a cross section of a transistor in the channel width direction.
Figure 38B:
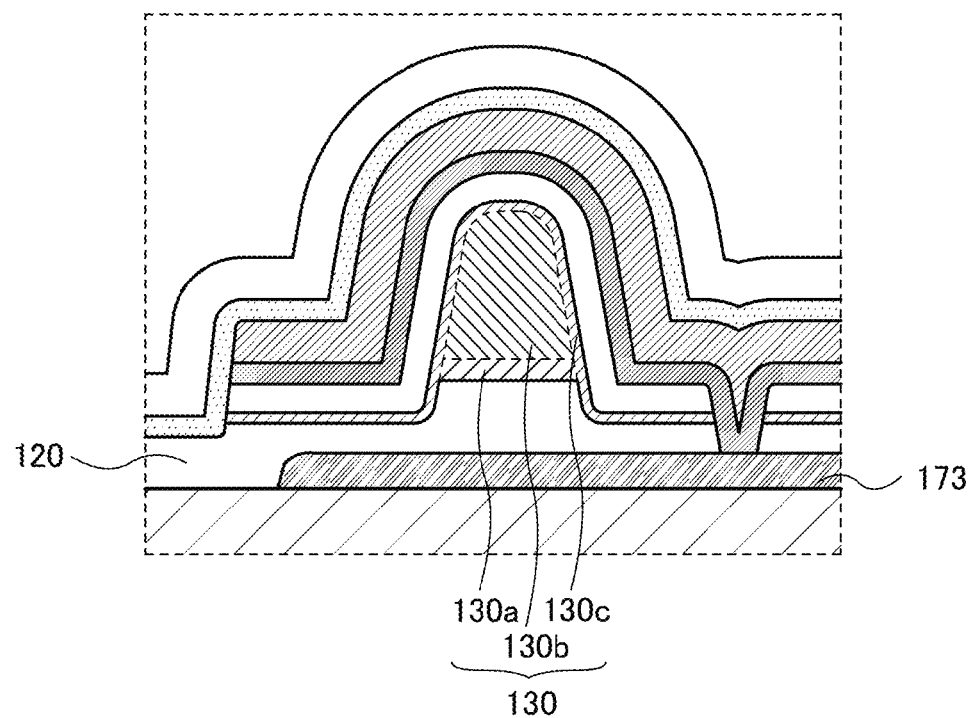

The transistor of one embodiment of the present invention may include the conductive layer 173 between the oxide semiconductor layer 130 and the substrate 115 as illustrated in the cross-sectional views in the channel length direction in FIGS. 36A to 36C and FIGS. 37A to 37C and the cross-sectional views in the channel width direction in FIGS. 38A and 38B. When the conductive layer is used as a second gate electrode layer (back gate), the on-state current can be further increased or the threshold voltage can be controlled. In the cross-sectional views in FIGS. 36A to 36C and FIGS. 37A to 37C, the width of the conductive layer 173 may be shorter than that of the oxide semiconductor layer 130. Moreover, the width of the conductive layer 173 may be shorter than that of the conductive layer 170.

Figure 39A:
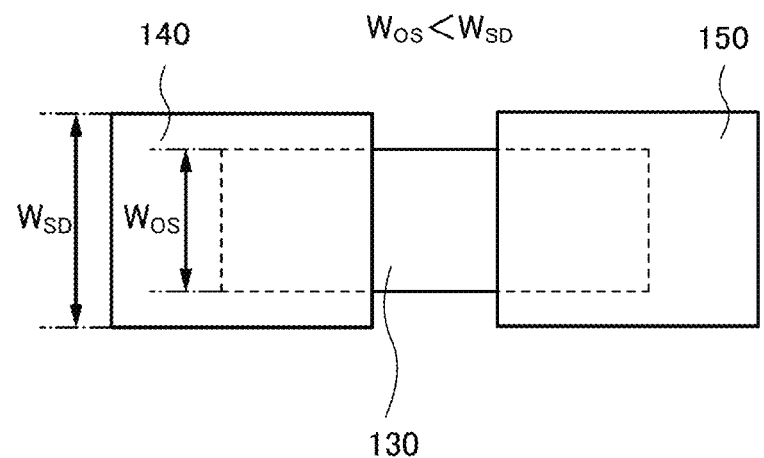
FIGS. 39A and 39B are each a top view illustrating a transistor.
Figure 39B:
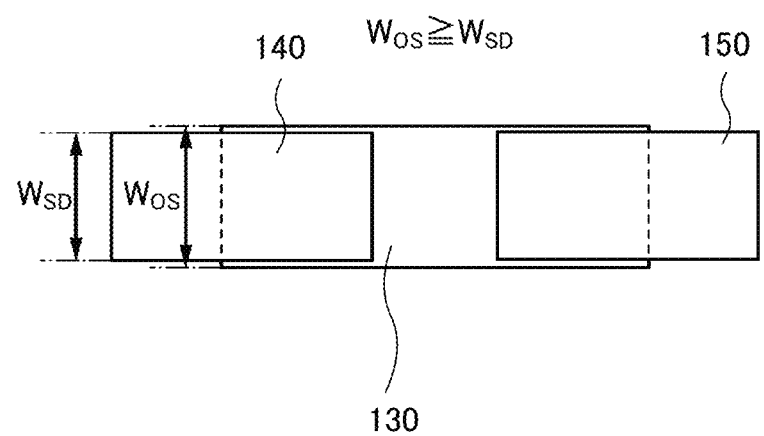

The conductive layer 140 (source electrode layer) and the conductive layer 150 (drain electrode layer) of the transistor of one embodiment of the present invention may have any of structures illustrated in top views of FIGS. 39A and 39B. Note that FIGS. 39A and 39B each illustrate only the oxide semiconductor layer 130, the conductive layer 140, and the conductive layer 150. As illustrated in FIG. 39A, the width ($W_{SD}$) of the conductive layers 140 and 150 may be larger than the width ($W_{OS}$) of the oxide semiconductor layer 130. Alternatively, as illustrated in FIG. 39B, $W_{SD}$ may be smaller than $W_{OS}$. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved.

In the transistor of one embodiment of the present invention (any of the transistors 101 to 112), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layer 130b and the oxide semiconductor layer 130c and the transistor including the oxide semiconductor layer 130a, the oxide semiconductor layer 130b, and the oxide semiconductor layer 130c, selecting appropriate materials for the two or three layers forming the oxide semiconductor layer 130 allows current to flow in the oxide semiconductor layer 130b. Since current flows in the oxide semiconductor layer 130b, the current is hardly influenced by interface scattering, leading to a high on-state current. Note that increasing the thickness of the oxide semiconductor layer 130b can increase the on-state current. The thickness of the oxide semiconductor layer 130b may be, for example, 100 nm to 200 nm.

A semiconductor device using a transistor with any of the above structures can have favorable electrical characteristics.

Note that in this specification, the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a gate electrode covering a side surface of a semiconductor, an effective channel width is greater than an apparent channel width, and its influence cannot be ignored in some cases. For example, in a miniaturized transistor having a gate electrode covering a side surface of a semiconductor, the proportion of a channel region formed in a side surface of a semiconductor is higher than the proportion of a channel region formed in a top surface of a semiconductor in some cases. In that case, an effective channel width is greater than an apparent channel width.

In such a case, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, an apparent channel width is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that a channel length, a channel width, an effective channel width, an apparent channel width, a surrounded channel width, and the like can be determined by analyzing a cross-sectional TEM image and the like.

Note that in the case where electric field mobility, a current value per channel width, and the like of a transistor are calculated, a surrounded channel width may be used for the calculation. In that case, a value might be different from one calculated by using an effective channel width.

This embodiment can be combined as appropriate with any of the other embodiments in this specification.

Embodiment 6

In this embodiment, components of the transistors described in Embodiment 5 are described in detail.

The substrate 115 includes a silicon substrate provided with a transistor and a photodiode; and an insulating layer, a wiring, and a conductor functioning as a contact plug which are provided over the silicon substrate. The substrate 115 corresponds to the first layer 1100 and the second layer 1200 in FIG. 1A. When p-channel transistors are formed using the silicon substrate, a silicon substrate with n⁻-type conductivity is preferably used. It is also possible to use an SOI substrate including an n⁻-type or i-type silicon layer. A surface of the silicon substrate where the transistor is formed preferably has a (110) plane orientation. Forming a p-channel transistor with the (110) plane can increase the mobility.

The insulating layer 120 may have a function of supplying oxygen to the oxide semiconductor layer 130 as well as a function of preventing diffusion of impurities from components included in the substrate 115. For this reason, the insulating layer 120 is preferably an insulating film containing oxygen and further preferably, an insulating film containing oxygen more than its stoichiometric composition. For example, the insulating layer 120 is preferably a film in which the amount of released oxygen estimated in oxygen atoms is $1.0 \times 10^{19}$ atoms/cm³ or more in thermal desorption spectroscopy (TDS) analysis performed such that the surface temperature is higher than or equal to 100° C. and lower than or equal to 700° C., preferably higher than or equal to 100° C. and lower than or equal to 500° C. The insulating layer 120 also has a function as an interlayer insulating film and may be subjected to planarization treatment such as chemical mechanical polishing (CMP) treatment so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film including silicon nitride, silicon nitride oxide, aluminum nitride, aluminum nitride oxide, or the like, or a mixed material of any of these oxides. The insulating layer 120 may be a stack of any of the above materials.

In this embodiment, detailed description is given mainly on the case where the oxide semiconductor layer 130 of the transistor has a three-layer structure in which the oxide semiconductor layer 130a, the oxide semiconductor layer 130b, and the oxide semiconductor layer 130c are stacked in this order from the insulating layer 120 side.

Note that in the case where the oxide semiconductor layer 130 is a single layer, a layer corresponding to the oxide semiconductor layer 130b, which is described in this embodiment, is used.

In the case where the oxide semiconductor layer 130 has a two-layer structure, a stack in which a layer corresponding to the oxide semiconductor layer 130b and a layer corresponding to the oxide semiconductor layer 130c are stacked in this order from the insulating layer 120 side, which is described in this embodiment, is used. In such a case, the oxide semiconductor layer 130b and the oxide semiconductor layer 130c can be replaced with each other.

In the case where the oxide semiconductor layer 130 has a stacked-layer structure of four or more layers, for example, a structure in which another oxide semiconductor layer is added to the three-layer stack of the oxide semiconductor layer 130 described in this embodiment can be employed.

For the oxide semiconductor layer 130b, for example, an oxide semiconductor whose electron affinity (an energy difference between a vacuum level and the conduction band minimum) is higher than those of the oxide semiconductor layer 130a and the oxide semiconductor layer 130c is used. The electron affinity can be obtained by subtracting an energy difference between the conduction band minimum and the valence band maximum (an energy gap) from an energy difference between the vacuum level and the valence band maximum (an ionization potential).

The oxide semiconductor layer 130a and the oxide semiconductor layer 130c each contain one or more kinds of metal elements contained in the oxide semiconductor layer 130b. For example, the oxide semiconductor layer 130a and the oxide semiconductor layer 130c are preferably formed using an oxide semiconductor whose conduction band minimum is closer to a vacuum level than that of the oxide semiconductor layer 130b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 170, a channel is formed in the oxide semiconductor layer 130b whose conduction band minimum is the lowest in the oxide semiconductor layer 130.

Since the oxide semiconductor layer 130a contains one or more kinds of metal elements contained in the oxide semiconductor layer 130b, an interface state is unlikely to be formed at the interface between the oxide semiconductor layer 130b and the oxide semiconductor layer 130a compared with an interface formed by contacting the oxide semiconductor layer 130b with the insulating layer 120. The interface state tends to form a channel; therefore, the threshold voltage of the transistor might be changed. Thus, with the oxide semiconductor layer 130a, fluctuations in electrical characteristics of the transistor, such as a threshold voltage, can be reduced. Further, the reliability of the transistor can be improved.

Since the oxide semiconductor layer 130c contains one or more kinds of metal elements contained in the oxide semiconductor layer 130b, scattering of carriers is unlikely to occur at the interface between the oxide semiconductor layer 130b and the oxide semiconductor layer 130c compared with an interface formed by contacting the oxide semiconductor layer 130b with the gate insulating film (insulating layer 160. Thus, with the oxide semiconductor layer 130c, the field-effect mobility of the transistor can be increased.

For the oxide semiconductor layer 130a and the oxide semiconductor layer 130c, for example, a material containing Al, Ti, Ga, Ge, Y, Zr, Sn, La, Ce, or Hf with a higher atomic ratio than that used for the oxide semiconductor layer 130b can be used. Specifically, an atomic ratio of any of the above metal elements in the oxide semiconductor layer 130a and the oxide semiconductor layer 130c is 1.5 times or more, preferably 2 times or more, further preferably 3 times or more as much as that in the oxide semiconductor layer 130b. Any of the above metal elements is strongly bonded to oxygen and thus has a function of suppressing generation of oxygen vacancy in the oxide semiconductor layer 130a and the oxide semiconductor layer 130c. That is, oxygen vacancy is difficult to be generated in the oxide semiconductor layer 130a and the oxide semiconductor layer 130c than in the oxide semiconductor layer 130b.

An oxide semiconductor that can be used for each of the oxide semiconductor layers 130a, 130b, and 130c preferably contains at least In or Zn. Both In and Zn are preferably contained. In order to reduce fluctuations in electrical characteristics of the transistor including the oxide semiconductor, the oxide semiconductor preferably contains a stabilizer in addition to In and Zn.

As a stabilizer, Ga, Sn, Hf, Al, Zr, and the like can be given. As another stabilizer, lanthanoid such as La, Ce, Pr, Nd, Sm, Eu, Gd, Tb, (Dy, Ho, Er, Tm, Yb, or Lu can be given.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, "In—Ga—Zn oxide" means an oxide containing In, Ga, and Zn as its main components. The In—Ga—Zn oxide may contain another metal element in addition to In, Ga, and Zn. Note that in this specification, a film containing the In—Ga—Zn oxide is also referred to as an IGZO film.

A material represented by $InMO_3(ZnO)_m$ (m>0 is satisfied, and m is not an integer) may be used. Note that M represents one or more metal elements selected from Ga, Y, Zr, La, Ce, and Nd. Alternatively, a material represented by $In_2SnO_5(ZnO)_n$ (n>0, n is an integer) may be used.

When each of the oxide semiconductor layer 130a, the oxide semiconductor layer 130b, and the oxide semiconductor layer 130c is an In-M-Zn oxide containing at least indium, zinc, and M (M is a metal such as Al, Ti, Ga, Ge, Y, Zr, Sn, La, Ce, or Hf), and when the oxide semiconductor layer 130a has an atomic ratio of In to M and Zn which is $x_1:y_1:z_1$, the oxide semiconductor layer 130b has an atomic ratio of In to M and Zn which is $x_2:y_2:z_2$, and the oxide semiconductor layer 130c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. At this time, when $y_2$ is greater than or equal to $x_2$ in the oxide semiconductor layer 130b, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layer 130a and the oxide semiconductor layer 130c are preferably less than 50 atomic % and greater than or equal to 50 atomic %, respectively, further preferably less than 25 atomic % and greater than or equal to 75 atomic %, respectively. In the case where Zn and O are not taken into consideration, the proportion of In and the proportion of M in the oxide semiconductor layer 130b are preferably greater than or equal to 25 atomic % and less than 75 atomic %, respectively, further preferably greater than or equal to 34 atomic % and less than 66 atomic %, respectively.

The indium content in the oxide semiconductor layer 130b is preferably higher than those in the oxide semiconductor layers 130a and 130c. In an oxide semiconductor, the s orbital of heavy metal mainly contributes to carrier transfer, and when the proportion of In in the oxide semiconductor is increased, overlap of the s orbitals is increased. Therefore, an oxide having the proportion of In higher than that of M has higher mobility than an oxide having the proportion of In equal to or lower than that of M. Thus, with the use of an oxide having a high content of indium for the oxide semiconductor layer 130b, a transistor having high field-effect mobility can be obtained.

The thickness of the oxide semiconductor layer 130a is greater than or equal to 3 nm and less than or equal to 100 nm, preferably greater than or equal to 5 nm and less than or equal to 50 nm, further preferably greater than or equal to 5 nm and less than or equal to 25 nm. The thickness of the oxide semiconductor layer 130b is greater than or equal to 3 nm and less than or equal to 200 nm, preferably greater than or equal to 10 nm and less than or equal to 150 nm, further preferably greater than or equal to 15 nm and less than or equal to 100 nm. The thickness of the oxide semiconductor layer 130c is greater than or equal to 1 nm and less than or equal to 50 nm, preferably greater than or equal to 2 nm and less than or equal to 30 nm, further preferably greater than or equal to 3 nm and less than or equal to 15 nm. The oxide semiconductor layer 130b is preferably thicker than the oxide semiconductor layer 130a and the oxide semiconductor layer 130c.

Note that in order that a transistor in which an oxide semiconductor layer serves as a channel has stable electrical characteristics, it is effective to reduce the concentration of impurities in the oxide semiconductor layer to make the oxide semiconductor layer intrinsic (i-type) or substantially intrinsic. The term "substantially intrinsic" refers to the state where an oxide semiconductor layer has a carrier density which is lower than lower than $1\times10^{15}/cm^3$, lower than $1\times10^{13}/cm^3$, lower than $8\times10^{11}/cm^3$, or lower than $1\times10^{8}/cm^3$, and is higher than or equal to $1\times10^{-9}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density. In addition, silicon in the oxide semiconductor layer forms an impurity level. The impurity level serves as a trap and might cause deterioration of electrical characteristics of the transistor. Accordingly, in the oxide semiconductor layer 130a, the oxide semiconductor layer 130b, and the oxide semiconductor layer 130c and at interfaces between these layers, the impurity concentration is preferably reduced.

In order to form an intrinsic or substantially intrinsic oxide semiconductor layer, the oxide semiconductor layer is arranged to have a region in which the concentration of silicon estimated by secondary ion mass spectrometry (SIMS) is lower than $1\times10^{19}$ atoms/cm$^3$, preferably lower than $5\times10^{18}$ atoms/cm$^3$, further preferably lower than $1\times10^{18}$ atoms/cm$^3$. Further, the oxide semiconductor layer is arranged to have a region in which the concentration of hydrogen is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. Further, the concentration of nitrogen is controlled to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Increase in concentration of silicon or carbon might reduce the crystallinity of the oxide semiconductor layer. In order to avoid the reduction of the crystallinity of the oxide semiconductor layer, for example, the oxide semiconductor layer is arranged to have a region in which the concentration of silicon is lower than $1 \times 10^{19}$ atoms/cm$^3$, preferably lower than $5 \times 10^{18}$ atoms/cm$^3$, further preferably lower than $1 \times 10^{18}$ atoms/cm$^3$. Further, the oxide semiconductor layer is arranged to have a region in which the concentration of carbon is lower than $1 \times 10^{19}$ atoms/cm$^3$, preferably lower than $5 \times 10^{18}$ atoms/cm$^3$, further preferably lower than $1 \times 10^{18}$ atoms/cm$^3$, for example.

As described above, a transistor in which a highly purified oxide semiconductor film is used for a channel formation region has an extremely low off-state current. For example, in the case where the voltage between the source and the drain is set to approximately 0.1 V, 5 V, or 10 V, the off-state current per channel width of the transistor can be as low as several yoctoamperes per micrometer to several zeptoamperes per micrometer.

Note that as the gate insulating film of the transistor, an insulating film containing silicon is used in many cases; thus, it is preferable that, as in the transistor of one embodiment of the present invention, a region of the oxide semiconductor layer, which serves as a channel, not be in contact with the gate insulating film for the above-described reason. In the case where a channel is formed at the interface between the gate insulating film and the oxide semiconductor layer, scattering of carriers occurs at the interface, whereby the field-effect mobility of the transistor is reduced. From the view of the above, it is preferable that the region of the oxide semiconductor layer, which serves as a channel, be separated from the gate insulating film.

Accordingly, with the oxide semiconductor layer 130 having a stacked-layer structure including the oxide semiconductor layer 130a, the oxide semiconductor layer 130b, and the oxide semiconductor layer 130c, a channel can be formed in the oxide semiconductor layer 130b; thus, the transistor can have a high field-effect mobility and stable electrical characteristics.

In a band structure, the conduction band minimums of the oxide semiconductor layer 130a, the oxide semiconductor layer 130b, and the oxide semiconductor layer 130c are continuous. This can be understood also from the fact that the compositions of the oxide semiconductor layer 130a, the oxide semiconductor layer 130b, and the oxide semiconductor layer 130c are close to one another and oxygen is easily diffused among the oxide semiconductor layer 130a, the oxide semiconductor layer 130b, and the oxide semiconductor layer 130c. Thus, the oxide semiconductor layer 130a, the oxide semiconductor layer 130b, and the oxide semiconductor layer 130c have a continuous physical property although they have different compositions and form a stack. In the drawings, interfaces between the oxide semiconductor layers of the stack are indicated by dotted lines.

The oxide semiconductor layer 130 in which layers containing the same main components are stacked is formed to have not only a simple stacked-layer structure of the layers but also a continuous energy band (here, in particular, a well structure having a U shape in which the conduction band minimums are continuous (U-shape well)). In other words, the stacked-layer structure is formed such that there exists no impurity that forms a defect level such as a trap center or a recombination center at each interface. If impurities exist between the stacked oxide semiconductor layers, the continuity of the energy band is lost and carriers disappear by a trap or recombination at the interface.

For example, an In—Ga—Zn oxide whose atomic ratio of In to Ga and Zn is 1:3:2, 1:3:3, 1:3:4, 1:3:6, 1:4:5, 1:6:4, or 1:9:6 can be used for the oxide semiconductor layer 130a and the oxide semiconductor layer 130c. An In—Ga—Zn oxide whose atomic ratio of In to Ga and Zn is 1:1:1, 2:1:3, 5:5:6, or 3:1:2 can be used for the oxide semiconductor layer 130b. In each of the oxide semiconductor layers 130a, 130b, and 130c, the proportion of each atom in the atomic ratio varies within a range of ±20% as an error.

The oxide semiconductor layer 130b of the oxide semiconductor layer 130 serves as a well, so that a channel is formed in the oxide semiconductor layer 130b. Note that since the conduction band minimums are continuous, the oxide semiconductor layer 130 can also be referred to as a U-shaped well. A channel formed to have such a structure can also be referred to as a buried channel.

Note that trap levels due to impurities or defects might be formed in the vicinity of the interface between an insulating layer such as a silicon oxide film and each of the oxide semiconductor layer 130a and the oxide semiconductor layer 130c. The oxide semiconductor layer 130b can be distanced away from the trap levels owing to existence of the oxide semiconductor layer 130a and the oxide semiconductor layer 130c.

However, when the energy differences between the conduction band minimum of the oxide semiconductor layer 130b and the conduction band minimum of each of the oxide semiconductor layer 130a and the oxide semiconductor layer 130c are small, an electron in the oxide semiconductor layer 130b might reach the trap level by passing over the energy differences. When the electron is trapped in the trap level, a negative charge is generated at the interface with the insulating layer, whereby the threshold voltage of the transistor is shifted in the positive direction.

The oxide semiconductor layer 130a, the oxide semiconductor layer 130b, and the oxide semiconductor layer 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, Sc, and alloys of any of these metal materials can be used. Typically, it is preferable to use Ti, which is particularly easily bonded to oxygen, or W, which has a high melting point and thus allows subsequent process temperatures to be relatively high. It is also possible to use a stack of any of the above materials and Cu or an alloy such as Cu—Mn, which has low resistance. Note that in the transistors 105, 106, 111, and 112, for example, it is possible to use W for the conductive layer 141 and the conductive layer 151 and use a stack of Ti and Al for the conductive layer 142 and the conductive layer 152.

The above materials are capable of abstracting oxygen from an oxide semiconductor layer. Therefore, in a region of the oxide semiconductor layer that is in contact with any of the above materials, oxygen is released from the oxide semiconductor layer and oxygen vacancy is formed. Hydrogen slightly contained in the layer and the oxygen vacancy are bonded to each other, whereby the region is changed to an n-type region. Accordingly, the n-type region can serve as a source or a drain of the transistor.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain La, nitrogen, or Zr as an impurity.

An example of a stacked-layer structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constant than silicon oxide and silicon oxynitride. Therefore, the thickness can be increased as compared with silicon oxide; thus, leakage current due to tunnel current can be reduced. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

A surface over which the hafnium oxide having a crystal structure is formed might have interface states due to defects. The interface states might function as trap centers. Therefore, in the case where the hafnium oxide is provided close to the channel region of the transistor, the electrical characteristics of the transistor might deteriorate owing to the interface states. In order to reduce the influence of the interface state, it is preferable to separate the channel region of the transistor and the hafnium oxide from each other by providing another film therebetween. The film has a buffer function. The film having a buffer function may be included in the insulating layer 160 or included in the oxide semiconductor film. That is, the film having a buffer function can be formed using silicon oxide, silicon oxynitride, an oxide semiconductor, or the like. The film having a buffer function is formed using, for example, a semiconductor or an insulator having a larger energy gap than a semiconductor to be the channel region. Alternatively, the film having a buffer function is formed using, for example, a semiconductor or an insulator having lower electron affinity than a semiconductor to be the channel region. Further alternatively, the film having a buffer function is formed using, for example, a semiconductor or an insulator having higher ionization energy than a semiconductor to be the channel region.

Meanwhile, charge is trapped by the interface states (trap centers) of the hafnium oxide having a crystal structure, whereby the threshold voltage of the transistor may be controlled. In order to make the electric charge exist stably, for example, a semiconductor or an insulator having a larger energy gap than hafnium oxide may be provided between the channel region and the hafnium oxide. Alternatively, a semiconductor or an insulator having smaller electron affinity than the hafnium oxide is provided. The film having a buffer function may be formed using a semiconductor or an insulator having higher ionization energy than hafnium oxide. Use of such a semiconductor or an insulator inhibits discharge of the charge trapped by the interface states, so that the charge can be retained for a long time.

Examples of such an insulator include silicon oxide and silicon oxynitride. An electric charge can be trapped at the interface state in the insulating layer 160 by transferring electron from the oxide semiconductor layer 130 toward the gate electrode layer (conductive layer 170). As a specific example, the potential of the gate electrode layer (conductive layer 170) is kept higher than the potential of the source electrode or the drain electrode under high temperature conditions (e.g., a temperature higher than or equal to 125° C. and lower than or equal to 450° C., typically higher than or equal to 150° C. and lower than or equal to 300° C.) for one second or longer, typically for one minute or longer.

The threshold voltage of a transistor in which a predetermined amount of electrons are trapped in interface states in the insulating layer 160 or the like shifts in the positive direction. The amount of electrons to be trapped (the amount of change in threshold voltage) can be controlled by adjusting a voltage of the gate electrode layer (conductive layer 170) or time in which the voltage is applied. Note that a location in which charge is trapped is not necessarily limited to the inside of the insulating layer 160 as long as charge can be trapped therein. A stacked-layer film having a similar structure may be used for another insulating layer.

The insulating layer 120 and the insulating layer 160 in contact with the oxide semiconductor layer 130 may include a region with a low density of states caused by nitrogen oxide. As the oxide insulating layer with a low density of states of a nitrogen oxide, a silicon oxynitride film that releases less nitrogen oxide, an aluminum oxynitride film that releases less nitrogen oxide, or the like can be used.

Note that a silicon oxynitride film that releases less nitrogen oxide is a film which releases ammonia more than nitrogen oxide in TDS analysis; the amount of released ammonia is typically greater than or equal to $1 \times 10^{18}$/cm$^3$ and less than or equal to $5 \times 10^{19}$/cm$^3$. Note that the amount of released ammonia is that released by heat treatment at the film surface temperature higher than or equal to 50° C. and lower than or equal to 650° C., preferably higher than or equal to 50° C. and lower than or equal to 550° C.

By using the above oxide insulating layer for the insulating layer 120 and the insulating layer 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, W, or the like can be used. It is also possible to use an alloy or a conductive nitride of any of these materials. It is also possible to use a stack of a plurality of materials selected from these materials, alloys of these materials, and conductive nitrides of these materials. Typically, tungsten, a stack of tungsten and titanium nitride, a stack of tungsten and tantalum nitride, or the like can be used. It is also possible to use Cu or an alloy such as Cu—Mn, which has low resistance, or a stack of any of the above materials and Cu or an alloy such as Cu—Mn. In this embodiment, tantalum nitride is used for the conductive layer 171 and tungsten is used for the conductive layer 172 to form the conductive layer 170.

As the insulating layer 175, a silicon nitride film, an aluminum nitride film, or the like containing hydrogen can be used. In the transistors 103, 104, 106, 109, 110, and 112 described in Embodiment 2, using an insulating film containing hydrogen as the insulating layer 175 allows the oxide semiconductor layer to be partly changed to n-type. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 2. The aluminum oxide film has a high blocking effect of preventing permeation of both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120. Further, oxygen contained in the aluminum oxide film can be diffused into the oxide semiconductor layer.

The insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancy formed in the channel formation region can be filled with the oxygen. In this manner, stable electrical characteristics of the transistor can be achieved.

High integration of a semiconductor device requires miniaturization of a transistor. However, it is known that miniaturization of a transistor causes degradation of the electric characteristics of the transistor. When a channel width is decreased, the on-state current is decreased.

In the transistors 107 to 112 of embodiments of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor of one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and an effective channel width is increased, leading to a further increase in the on-state current.

Furthermore, in the transistor of one embodiment of the present invention in which the oxide semiconductor layer 130 has a two-layer structure or a three-layer structure, since the oxide semiconductor layer 130b where a channel is formed is provided over the oxide semiconductor layer 130a, the formation of an interface state is effectively inhibited. In the transistor of one embodiment of the present invention in which the oxide semiconductor layer 130 has a three-layer structure, since the oxide semiconductor layer 130b is positioned at the middle of the three-layer structure, the influence of an impurity that enters from upper and lower layers on the oxide semiconductor layer 130b is effectively eliminated as well. Therefore, the transistor can achieve not only the increase in the on-state current of the transistor but also stabilization of the threshold voltage and a reduction in the S value (subthreshold value). Thus, Icut (current when gate voltage VG is 0 V) can be reduced and power consumption can be reduced. Further, since the threshold voltage of the transistor is stabilized, long-term reliability of the semiconductor device can be improved. In addition, the transistor of one embodiment of the present invention is suitable for a highly integrated semiconductor device because deterioration of electrical characteristics due to miniaturization is reduced.

This embodiment can be combined with any of the other embodiments in this specification as appropriate.

Embodiment 7

In this embodiment, methods for manufacturing the transistors 101 and 107 described in Embodiment 5 are described.

First, an example of a method for manufacturing a silicon transistor included in the substrate 115 is described. An n$^-$-type single crystal silicon substrate is used as a silicon substrate, and an element formation region isolated with an insulating layer (also referred to as a field oxide film) is formed on the surface. An element separation region is formed by local oxidation of silicon (LOCOS), shallow trench isolation (STI), or the like.

Here, the substrate is not limited to the single crystal silicon substrate. A silicon on insulator (SOI) substrate or the like can be used as well.

Next, a gate insulating film is formed so as to cover the element formation region. For example, a silicon oxide film is formed by oxidation of a surface of the element formation region by heat treatment. After the silicon oxide film is formed, a surface of the silicon oxide film may be nitrided by nitriding treatment.

Next, a conductive film is formed so as to cover the gate insulating film. The conductive film can be formed using an element selected from Ta, W, Ti, Mo, Al, Cu, Cr, Nb, and the like, or an alloy material or a compound material containing such an element as a main component. Alternatively, a metal nitride film obtained by nitridation of any of these elements can be used. Alternatively, a semiconductor material typified by polycrystalline silicon doped with an impurity element such as phosphorus can be used.

Then, the conductive film is selectively etched, whereby a gate electrode layer is formed over the gate insulating film.

Next, an insulating film such as a silicon oxide film or a silicon nitride film is formed to cover the gate electrode layer and etch back is performed, whereby sidewalls are formed on side surfaces of the gate electrode layer.

Next, a resist mask is selectively formed so as to cover regions except the element formation region, and an impurity element is added with the use of the resist mask and the gate electrode layer as masks, whereby pt-type impurity regions are formed. Here, in order to form a p-channel transistor, an impurity element imparting p-type conductivity such as B or Ga can be used as the impurity element.

Then, in order to form a photodiode, a resist mask is selectively formed. Here, in order to form a cathode of the photodiode over a surface of the single crystal silicon substrate which is the same as a surface where the transistor is formed, an n$^+$-type shallow impurity region is formed by introduction of P or As that are impurity elements imparting n-type conductivity. A pt-type deep impurity region may be formed in order to electrically connect an anode of the photodiode and a wiring. Note that the anode (the pt-type shallow impurity region) of the photodiode is formed over a surface of the single crystal silicon substrate opposite to the surface where the cathode of the photodiode is formed in a later step.

Here, as illustrated in FIG. 1A, an opening is formed in a region in contact with the side surface of the photodiode by etching, and an insulating layer is provided in the opening. The insulating layer can be a silicon oxide layer, a silicon nitride layer, or the like formed by a deposition method such as a chemical vapor deposition (CVD) method, a thermal oxidation method, or the like.

Through the above steps, a p-channel transistor including an active region in the silicon substrate and the photodiode are completed. A passivation film such as a silicon nitride film is preferably formed over the transistor.

Next, an interlayer insulating film is formed using a silicon oxide film or the like over the silicon substrate where the transistor is formed, and conductors and wiring layers are formed. In addition, as described in Embodiment 1, an insulating layer made of aluminum oxide or the like for preventing diffusion of hydrogen is formed. The substrate 115 includes the silicon substrate where the transistor and the photodiode are formed, and the interlayer insulating layer, the wiring layers, the conductors and the like formed over the silicon substrate.

A method for manufacturing the transistor 102 is described with reference to FIGS. 40A to 40C and FIGS. 41A to 41C. A cross section of the transistor in the channel length direction is shown on the left side, and a cross section of the transistor in the channel width direction is shown on the right side. The cross-sectional views in the channel width direction are enlarged views; therefore, components on the left side and those on the right side differ in apparent thickness.

The case where the oxide semiconductor layer 130 has a three-layer structure of the oxide semiconductor layer 130a, the oxide semiconductor layer 130b, and the oxide semiconductor layer 130c is described as an example. In the case where the oxide semiconductor layer 130 has a two-layer structure, the oxide semiconductor layer 130a and the oxide semiconductor layer 130b are used. In the case where the oxide semiconductor layer 130 has a single-layer structure, the oxide semiconductor layer 130b is used.

First, the insulating layer 120 is formed over the substrate 115. Embodiment 6 can be referred to for description of the kinds of the substrate 115 and a material used for the insulating layer 120. The insulating layer 120 can be formed by a sputtering method, a CVD method, a molecular beam epitaxy (MBE) method, or the like.

Oxygen may be added to the insulating layer 120 by an ion implantation method, an ion doping method, a plasma immersion ion implantation method, plasma treatment, or the like. Adding oxygen enables the insulating layer 120 to supply oxygen much easily to the oxide semiconductor layer 130.

In the case where a surface of the substrate 115 is made of an insulator and there is no influence of impurity diffusion to the oxide semiconductor layer 130 to be formed later, the insulating layer 120 is not necessarily provided.

Figure 40A:
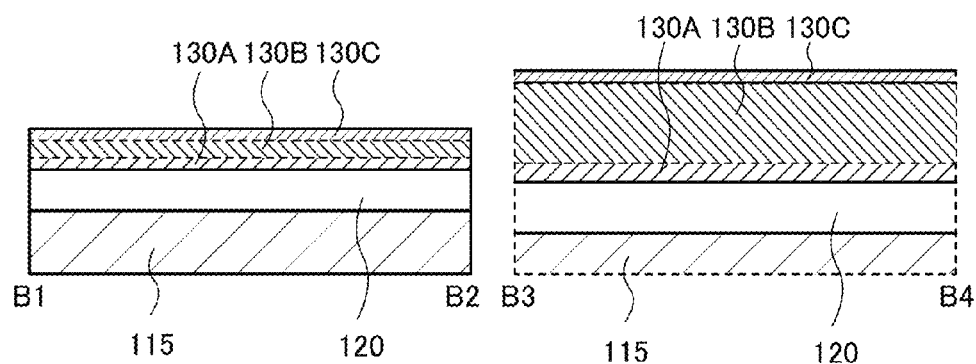
FIGS. 40A to 40C illustrate a method for manufacturing a transistor.

Next, an oxide semiconductor film 130A to be the oxide semiconductor layer 130a, an oxide semiconductor film 130B to be the oxide semiconductor layer 130b, and an oxide semiconductor film 130C to be the oxide semiconductor layer 130c are formed over the insulating layer 120 by a sputtering method, a CVD method, an MBE method, or the like (see FIG. 40A).

In the case where the oxide semiconductor layer 130 has a stacked-layer structure, oxide semiconductor films are preferably formed successively without exposure to the air with the use of a multi-chamber deposition apparatus (e.g., a sputtering apparatus) including a load lock chamber. It is preferable that each chamber of the sputtering apparatus be able to be evacuated to a high vacuum (approximately $5 \times 10^{-7}$ Pa to $1 \times 10^{-4}$ Pa) by an adsorption vacuum evacuation pump such as a cryopump and that the chamber be able to heat a substrate to 100° C. or higher, preferably 500° C. or higher, so that water and the like acting as impurities of an oxide semiconductor are removed as much as possible. A combination of a turbo molecular pump and a cold trap is preferably used to prevent back-flow of a gas containing a carbon component, moisture, or the like from an exhaust system into the chamber. A combination of a turbo molecular pump and a cryopump may be used as an exhaust system.

Not only high vacuum evacuation of the chamber but also high purity of a sputtering gas is preferred to obtain a highly purified intrinsic oxide semiconductor. An oxygen gas or an argon gas used for a sputtering gas is highly purified to have a dew point of −40° C. or lower, preferably −80° C. or lower, further preferably −100° C. or lower, whereby entry of moisture or the like into the oxide semiconductor film can be prevented as much as possible.

For the oxide semiconductor film 130A, the oxide semiconductor film 130B, and the oxide semiconductor film 130C, any of the materials described in Embodiment 6 can be used. In the case where a sputtering method is used for deposition, the materials described in Embodiment 6 can be used as a target.

Note that as described in detail in Embodiment 6, a material that has an electron affinity higher than that of the oxide semiconductor film 130A and that of the oxide semiconductor film 130C is used for the oxide semiconductor film 130B.

Note that the oxide semiconductor films are preferably formed by a sputtering method. As a sputtering method, an RF sputtering method, a DC sputtering method, an AC sputtering method, or the like can be used.

After the oxide semiconductor film 130C is formed, first heat treatment may be performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or at a reduced pressure. Alternatively, the first heat treatment may be performed in such a manner that heat treatment is performed in an inert gas atmosphere, and then another heat treatment is performed in an atmosphere containing an oxidizing gas at 10 ppm or more, in order to compensate released oxygen. The first heat treatment can increase the crystallinity of the oxide semiconductor film 130A, the oxide semiconductor film 130B, and the oxide semiconductor film 130C and remove impurities such as water and hydrogen from the insulating layer 120, the oxide semiconductor film 130A, the oxide semiconductor film 130B, and the oxide semiconductor film 130C. Note that the first heat treatment may be performed after etching for forming the oxide semiconductor layer 130a, the oxide semiconductor layer 130b, and the oxide semiconductor layer 130c described later.

Next, a first conductive layer is formed over the oxide semiconductor film 130A. The first conductive layer can be, for example, formed by the following method.

First, a first conductive film is formed over the oxide semiconductor film 130A. As the first conductive film, a single layer or a stacked layer can be formed using a material selected from Al, Cr, Cu, Ta, Ti, Mo, W, Ni, Mn, Nd, and Sc and alloys of any of these metal materials.

Next, a resist film is formed over the first conductive film and the resist film is exposed to light by electron beam exposure, liquid immersion exposure, or EUV exposure and developed, so that a first resist mask is formed. An organic coating film is preferably formed as an adherence agent between the first conductive film and the resist film. Alternatively, the first resist mask may be formed by nanoimprint lithography.

Then, the first conductive film is selectively etched using the first resist mask, and the first resist mask is subjected to ashing; thus, the conductive layer is formed.

Figure 40B:
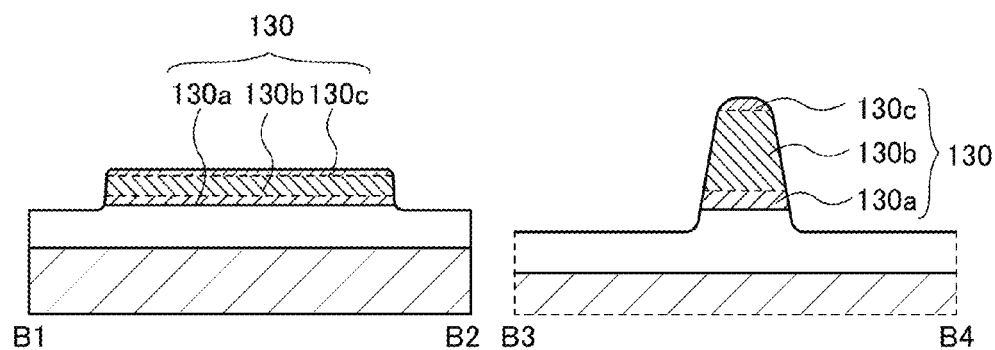
Figure 40C:
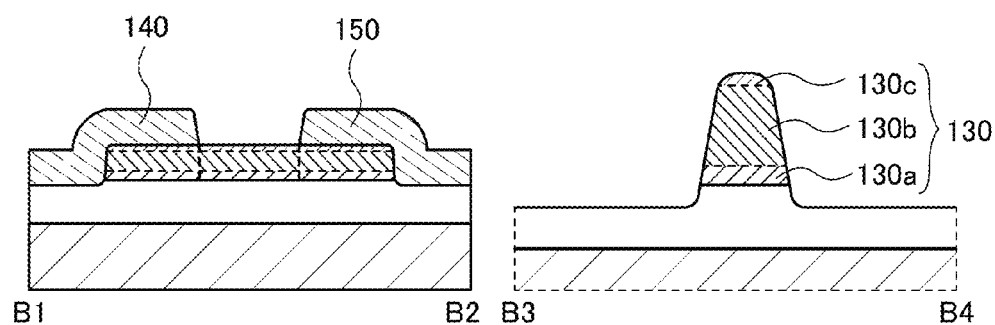

Next, the oxide semiconductor film 130A, the oxide semiconductor film 130B, and the oxide semiconductor film 130C are selectively etched using the conductive layer as a hard mask, and the conductive layer is removed; thus, the oxide semiconductor layer 130 including a stack of the oxide semiconductor layer 130a, the oxide semiconductor layer 130b, and the oxide semiconductor layer 130c is formed (see FIG. 40B). It is also possible to form the oxide semiconductor layer 130 using the first resist mask without forming the conductive layer. Here, oxygen ions may be implanted into the oxide semiconductor layer 130.

Next, a second conductive film is formed to cover the oxide semiconductor layer 130. The second conductive film can be formed using a material that can be used for the conductive layer 140 and the conductive layer 150 described in Embodiment 6. A sputtering method, a CVD method, an MBE method, or the like can be used for the formation of the second conductive film.

Then, a second resist mask is formed over portions to be a source region and a drain region. Then, part of the second conductive film is etched, whereby the conductive layer 140 and the conductive layer 150 are formed (see FIG. 40C).

Next, an insulating film 160A serving as a gate insulating film is formed over the oxide semiconductor layer 130, the conductive layer 140, and the conductive layer 150. The insulating film 160A can be formed using a material that can be used for the insulating layer 160 described in Embodiment 6. A sputtering method, a CVD method, an MBE method, or the like can be used for the formation of the insulating film 160A.

After that, second heat treatment may be performed. The second heat treatment can be performed in a condition similar to that of the first heat treatment. The second heat treatment enables oxygen implanted into the oxide semiconductor layer 130 to diffuse into the entire oxide semiconductor layer 130. Note that it is possible to obtain this effect by third heat treatment without performing the second heat treatment.

Then, a third conductive film 171A and a fourth conductive film 172A to be the conductive layer 170 are formed over the insulating film 160A. The third conductive film 171A and the fourth conductive film 172A can be formed using materials that can be used for the conductive layer 171 and the conductive layer 172 described in Embodiment 6. A sputtering method, a CVD method, an MBE method, or the like can be used for the formation of the third conductive film 171A and the fourth conductive film 172A.

Figure 41A:
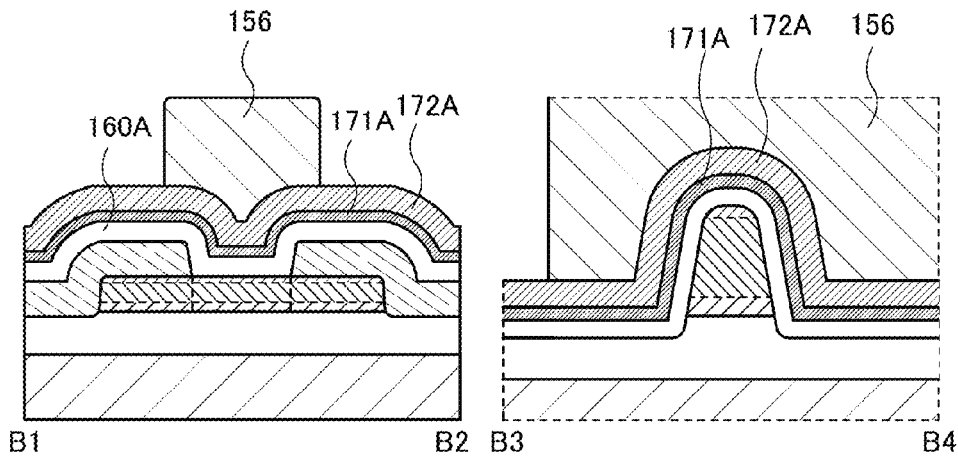
FIGS. 41A to 41C illustrate a method for manufacturing a transistor.
Figure 41B:
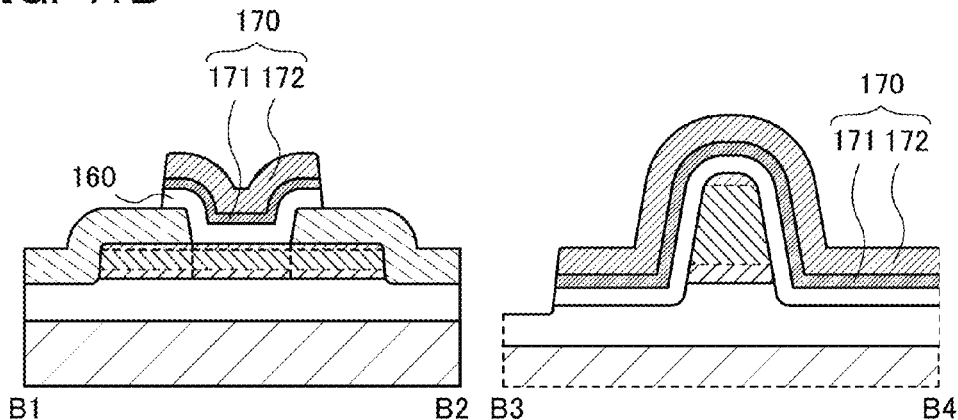

Next, a third resist mask 156 is formed over the fourth conductive film 172A (see FIG. 41A). The third conductive film 171A, the fourth conductive film 172A, and the insulating film 160A are selectively etched using the third resist mask 156, whereby the conductive layer 170 including the conductive layer 171 and the conductive layer 172 and the insulating layer 160 are formed (see FIG. 41B).

After that, the insulating layer 175 is formed over the oxide semiconductor layer 130, the conductive layer 140, the conductive layer 150, the insulating layer 160, and the conductive layer 170. Embodiment 6 can be referred to for a material used for the insulating layer 175. In the transistor 101, an aluminum oxide film is preferably used. The insulating layer 175 can be formed by a sputtering method, a CVD method, an MBE method, or the like.

Figure 41C:
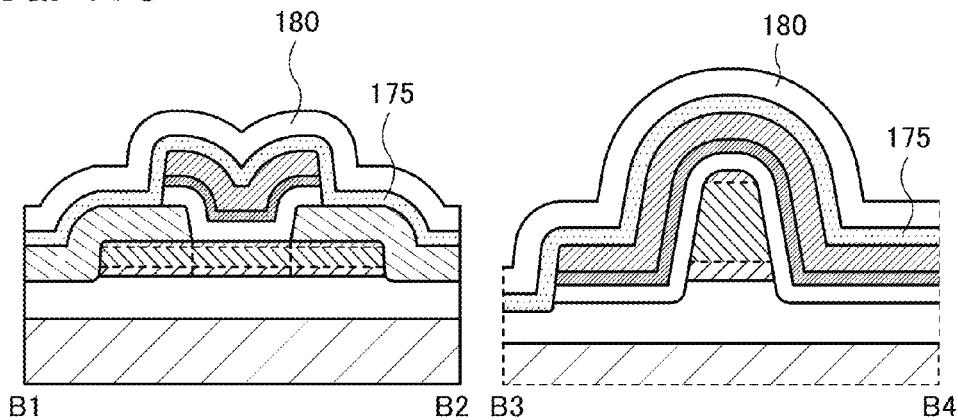

Next, the insulating layer 180 is formed over the insulating layer 175 (see FIG. 41C). Embodiment 6 can be referred to for a material used for the insulating layer 180. The insulating layer 180 can be formed by a sputtering method, a CVD method, an MBE method, or the like.

Oxygen may be added to the insulating layer 175 and/or the insulating layer 180 by an ion implantation method, an ion doping method, a plasma immersion ion implantation method, plasma treatment, or the like. Adding oxygen enables the insulating layer 175 and/or the insulating layer 180 to supply oxygen much easily to the oxide semiconductor layer 130.

Next, third heat treatment may be performed. The third heat treatment can be performed in a condition similar to that of the first heat treatment. By the third heat treatment, excess oxygen is easily released from the insulating layer 120, the insulating layer 175, and the insulating layer 180, so that oxygen vacancy in the oxide semiconductor layer 130 can be reduced.

Next, a method for manufacturing the transistor 107 is described. Note that detailed description of steps similar to those for manufacturing the transistor 101 described above is omitted.

Figure 42A:
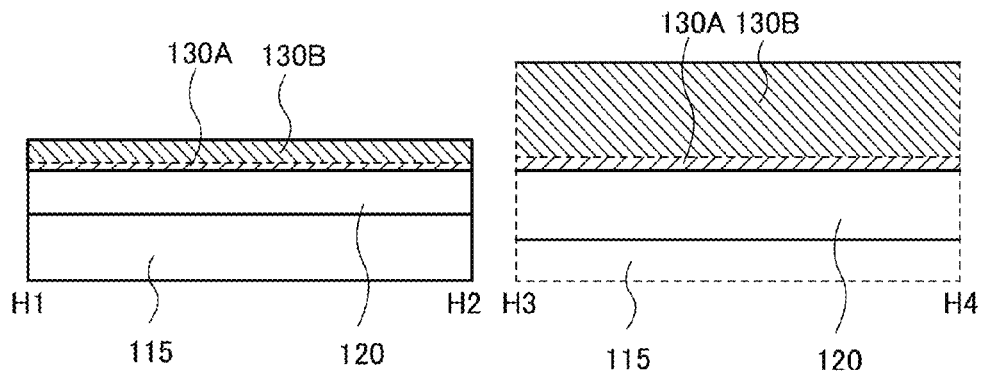
FIGS. 42A to 42C illustrate a method for manufacturing a transistor.

The insulating layer 120 is formed over the substrate 115, and the oxide semiconductor film 130A to be the oxide semiconductor layer 130a and the oxide semiconductor film 130B to be the oxide semiconductor layer 130b are formed over the insulating layer by a sputtering method, a CVD method, an MBE method, or the like (see FIG. 42A).

Figure 42B:
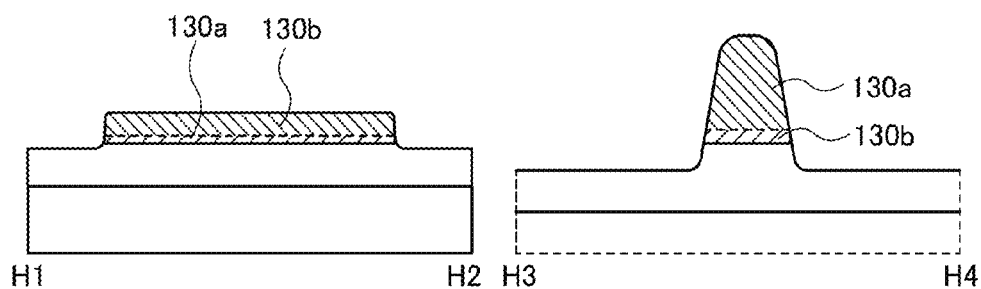

Next, the first conductive film is formed over the oxide semiconductor film 130B, and the conductive layer is formed using the first resist mask in the above-described manner. Then, the oxide semiconductor film 130A and the oxide semiconductor film 130B are selectively etched using the conductive layer as a hard mask, and the conductive layer is removed, whereby a stack of the oxide semiconductor layer 130a and the oxide semiconductor layer 130b is formed (see FIG. 42B). It is also possible to form the stack using the first resist mask without forming the hard mask. Here, oxygen ions may be implanted into the oxide semiconductor layer 130.

Figure 42C:
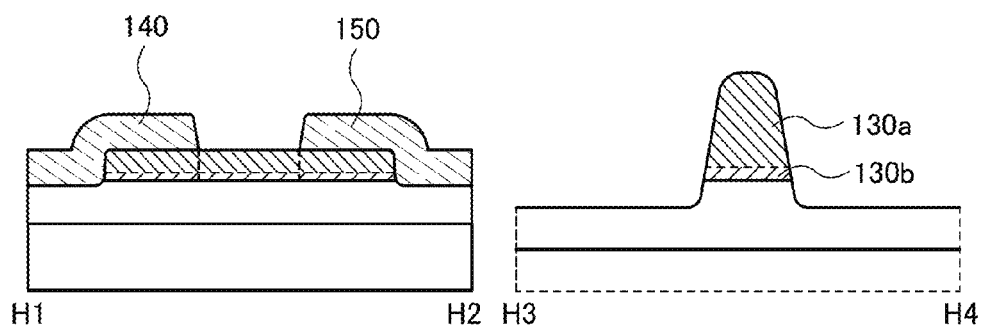

Next, a second conductive film is formed to cover the stack. Then, a second resist mask is formed over portions to be a source region and a drain region, and part of the second conductive film is etched using the second resist mask, whereby the conductive layer 140 and the conductive layer 150 are formed (see FIG. 42C).

After that, the oxide semiconductor film 130C to be the oxide semiconductor layer 130c is formed over the stack of the oxide semiconductor layer 130a and the oxide semiconductor layer 130b, the conductive layer 140, and the conductive layer 150. Furthermore, the insulating film 160A serving as a gate insulating film, the third conductive film 171A and the fourth conductive film 172A serving as the conductive layer 170 are formed over the oxide semiconductor film 130C.

Figure 43A:
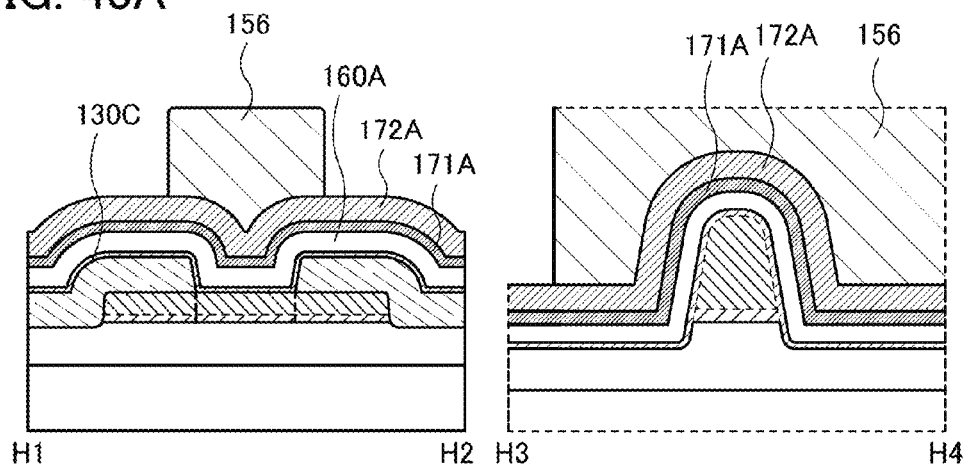
FIGS. 43A to 43C illustrate a method for manufacturing a transistor.
Figure 43B:
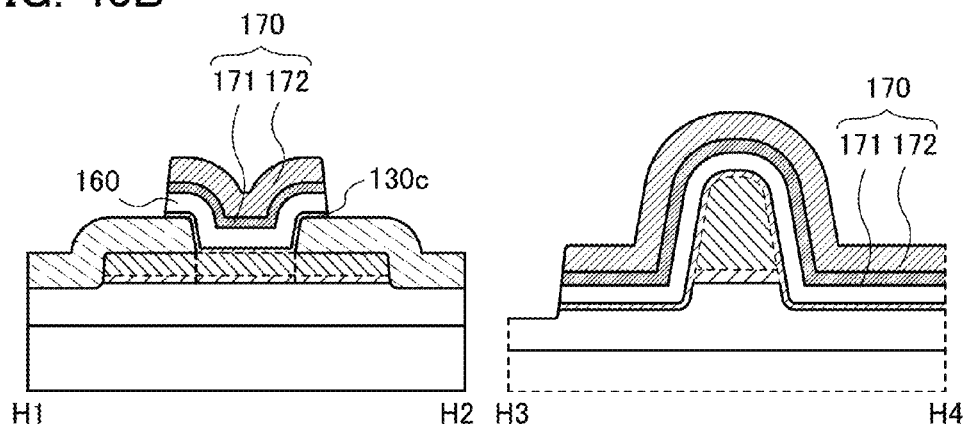

Then, the third resist mask 156 is formed over the fourth conductive film 172A (see FIG. 43A). The third conductive film 171A, the fourth conductive film 172A, the insulating film 160A, and the oxide semiconductor film 130C are selectively etched using the resist mask, whereby the conductive layer 170 including the conductive layer 171 and the conductive layer 172, the insulating layer 160, and the oxide semiconductor layer 130c are formed (see FIG. 43B). Note that if the insulating film 160A and the oxide semiconductor film 130C are etched using a fourth resist mask, the transistor 108 can be manufactured.

Figure 43C:
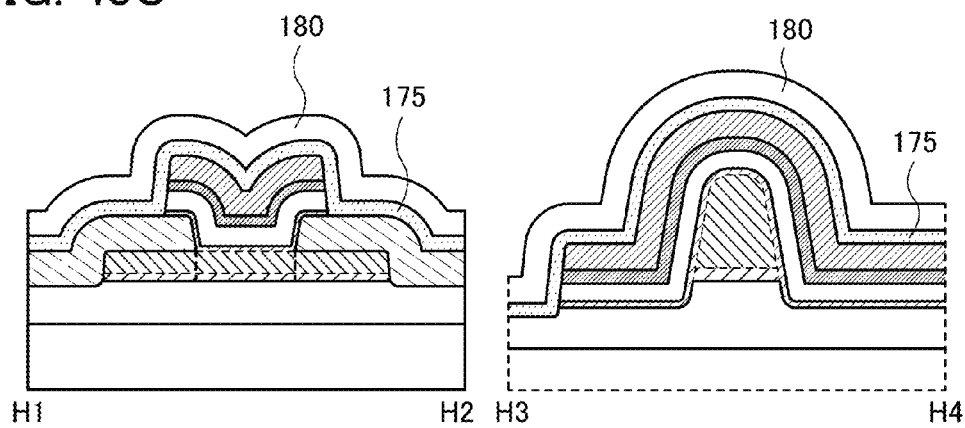

Next, the insulating layer 175 and the insulating layer 180 are formed over the insulating layer 120, the oxide semiconductor layer 130 (the oxide semiconductor layer 130a, the oxide semiconductor layer 130b, and the oxide semiconductor layer 130c), the conductive layer 140, the conductive layer 150, the insulating layer 160, and the conductive layer 170 (see FIG. 43C).

Through the above steps, the transistor 107 can be manufactured.

Although the variety of films such as the metal films, the semiconductor films, and the inorganic insulating films which are described in this embodiment typically can be formed by a sputtering method or a plasma CVD method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in the chamber is set to an atmospheric pressure or a reduced pressure, and reaction is caused in the vicinity of the substrate or over the substrate.

Deposition by an ALD method is performed in such a manner that the pressure in a chamber is set to an atmospheric pressure or a reduced pressure, source gases for reaction are introduced into the chamber and reacted, and then the sequence of the gas introduction is repeated. An inert gas (e.g., argon or nitrogen) may be introduced as a carrier gas with the source gases. For example, two or more kinds of source gases may be sequentially supplied to the chamber. In this case, after the reaction of a first source gas, an inert gas is introduced, and then a second source gas is introduced so that the source gases are not mixed. Alternatively, the first source gas may be exhausted by vacuum evacuation instead of the introduction of the inert gas, and then the second source gas may be introduced. The first source gas is adsorbed on the surface of the substrate and reacted to form a first layer; then the second source gas introduced thereafter is absorbed and reacted; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the gas introduction; therefore, an ALD method makes it possible to accurately adjust a thickness and thus is suitable for manufacturing a minute FET.

The variety of films such as the metal film, the semiconductor film, and the inorganic insulating film which have been disclosed in the embodiments can be formed by a thermal CVD method such as a MOCVD method or an ALD method. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source material gas which is obtained by vaporizing liquid containing a solvent and a hafnium precursor (hafnium alkoxide and a hafnium amide such as hafnium tetrakis(dimethylamide) hafnium (TDMAH, $Hf[N(CH_3)_2]_4$) and tetrakis(ethylmethylamide)hafnium) are used For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing ALD, hexachlorodisilane is adsorbed on a surface where a film is to be formed and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced to form an initial tungsten film, and then a $WF_6$ gas and an $H_2$ gas are sequentially introduced, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced to form an In—O layer, a $Ga(CH_3)_3$ gas and an $O_3$ gas are sequentially introduced to form a GaO layer, and then a $Zn(CH_3)_2$ gas and an $O_3$ gas are sequentially introduced to form a ZnO layer. Note that the order of these layers is not limited to this example. A mixed compound layer such as an In—Ga—O layer, an In—Zn—O layer, or a Ga—Zn—O layer may be formed by using these gases. Note that although an $H_2O$ gas which is obtained by bubbling with an inert gas such as Ar may be used instead of an $O_3$ gas, it is preferable to use an $O_3$ gas, which does not contain H.

This embodiment can be combined with any of the other embodiments in this specification as appropriate.

Embodiment 8

A structure of an oxide semiconductor film which can be used for one embodiment of the present invention is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

An oxide semiconductor film is classified roughly into a non-single-crystal oxide semiconductor film and a single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, that is, a grain boundary is not observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer has a morphology reflecting unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the high-resolution plan TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancy in the oxide semiconductor film serves as a carrier trap or serves as a carrier generation source when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, a grain boundary are not always found clearly in the nc-OS film.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in an electron diffraction pattern (also referred to as a selected-area electron diffraction pattern) of the nc-OS film obtained by using an electron beam having a probe diameter (e.g., 50 nm or larger) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, circumferentially distributed spots can be observed. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void can be observed. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found sometimes. In contrast, crystallization by a slight amount of electron beam used for TEM observation is scarcely observed in the nc-OS film having good quality.

Note that the crystal part size in the amorphous-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

Note that an oxide semiconductor film may be a stacked film including two or more films of an amorphous oxide semiconductor film, an amorphous-like OS film, a microcrystalline oxide semiconductor film, and a CAAC-OS film, for example.

The structure described in this embodiment can be used in appropriate combination with the structure described in any of the other embodiments.

Embodiment 9

A band structure of the transistor of one embodiment of the present invention is described.

Figure 44A:
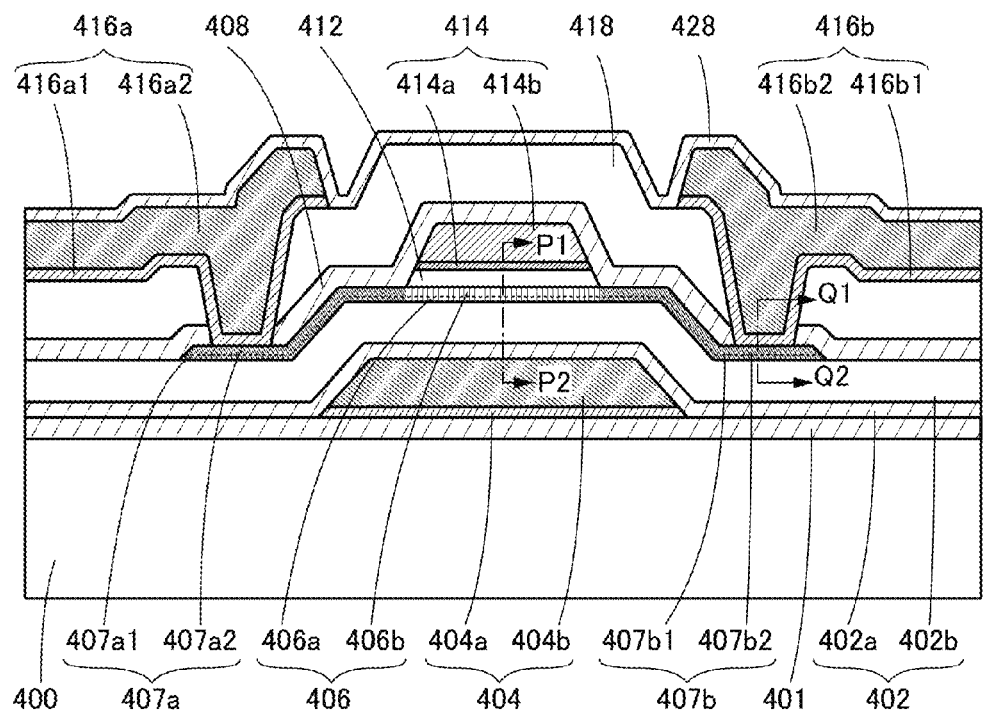
FIG. 44A is a cross-sectional view of a transistor.

FIG. 44A is a cross-sectional view of a transistor including an oxide semiconductor layer according to one embodiment of the present invention.

The transistor illustrated in FIG. 44A includes an insulating layer 401 over a substrate 400, a conductive layer 404a over the insulating layer 401, a conductive layer 404b over the conductive layer 404a, an insulating layer 402a over the insulating layer 401, the conductive layer 404a, and the conductive layer 404b, an insulating layer 402b over the insulating layer 402a, a semiconductor layer 406a over the insulating layer 402b, a semiconductor layer 406b over the semiconductor layer 406a, an insulating layer 412 over the semiconductor layer 406b, a conductive layer 414a over the insulating layer 412, a conductive layer 414b over the conductive layer 414a, an insulating layer 408 over the insulating layer 402b, the semiconductor layer 406a, the semiconductor layer 406b, the insulating layer 412, the conductive layer 414a, and the conductive layer 414b, an insulating layer 418 over the insulating layer 408, a conductive layer 416a1 and a conductive layer 416b1 over the insulating layer 418, a conductive layer 416a2 and a conductive layer 416b2 respectively over the conductive layer 416a1 and the conductive layer 416b1, and an insulating layer 428 over the insulating layer 418, the conductive layer 416a2, and the conductive layer 416b2.

The insulating layer 401 is able to have a function of suppressing entry of impurities such as copper to a channel formation region of the transistor.

The stacked conductive layers 404a and 404b are collectively referred to as a conductive layer 404. The conductive layer 404 has a function of a gate electrode of the transistor. The conductive layer 404 may have a function of shielding the channel formation region of the transistor from light.

The insulating layers 402a and 402b are collectively referred to as an insulating layer 402. The insulating layer 402 has a function of a gate insulating layer of the transistor. Furthermore, the insulating layer 402a may have a function of suppressing entry of impurities such as copper to the channel formation region of the transistor.

The semiconductor layers 406a and 406b are collectively referred to as a semiconductor layer 406. The semiconductor layer 406 has a function of the channel formation region of the transistor. For example, the semiconductor layer 406a and the semiconductor layer 406b correspond to the oxide semiconductor layer 130b and the oxide semiconductor layer 130c described in the above embodiment, respectively.

The semiconductor layer 406a includes a region 407a1 and a region 407b1 which overlap none of the insulating layer 412, the conductive layer 414a, the conductive layer 414b. Furthermore, the semiconductor layer 406b includes a region 407a2 and a region 407b2 which overlap none of the insulating layer 412, the conductive layer 414a, the conductive layer 414b. The region 407a1 and the region 407b1 have lower resistance than the region overlapping the insulating layer 412, the conductive layer 414a, the conductive layer 414b in the semiconductor layer 406a. The region 407a2 and the region 407b2 have lower resistance than the region overlapping the insulating layer 412, the conductive layer 414a, the conductive layer 414b in the semiconductor layer 406b. The region with low resistance can also be referred to as a region with high carrier density.

The region 407a1 and the region 407a2 are collectively referred to as a region 407a. The region 407b1 and the region 407b2 are collectively referred to as a region 407b. The region 407a and the region 407b have functions of the source region and the drain region of the transistor.

The conductive layers 414a and 414b are collectively referred to as a conductive layer 414. The conductive layer 414 has a function of a gate electrode of the transistor. The conductive layer 414 may have a function of shielding the channel formation region of the transistor from light.

The insulating layer 412 has a function of a gate insulating layer of the transistor.

The insulating layer 408 may have a function of suppressing entry of impurities, such as copper included in the conductive layer 416a2, the conductive layer 416b2, or the like, to the channel formation region of the transistor.

The insulating layer 418 may have a function of an interlayer insulating layer of the transistor, which contributes to the reduction of parasitic capacitance between wirings of the transistor.

The conductive layers 416a1 and 416a2 are collectively referred to as a conductive layer 416a. The conductive layers 416b1 and 416b2 are collectively referred to as a conductive layer 416b. The conductive layer 416a and the conductive layer 416b have functions of the source electrode and the drain electrode of the transistor.

The insulating layer 428 may have a function of suppressing entry of impurities to the channel formation region of the transistor.

Figure 44B:
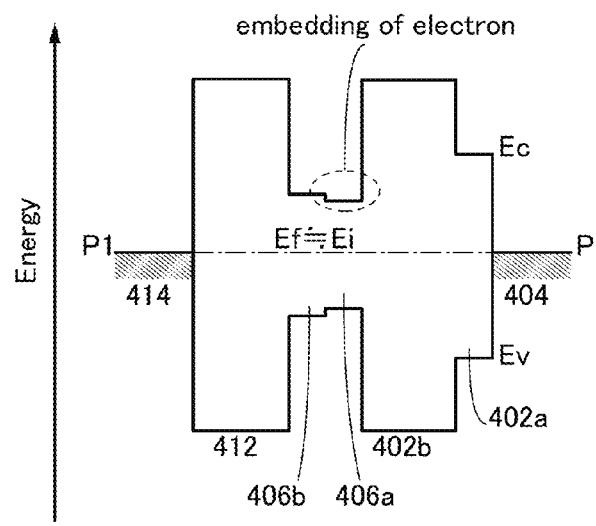
FIGS. 44B and 44C are band diagrams of the transistor.

Now, a band structure in the P1-P2 cross section including the channel formation regions of the transistor is illustrated in FIG. 44B. Here, the semiconductor layer 406a has a slightly narrower energy gap than the semiconductor layer 406b. The insulating layer 402a, the insulating layer 402b, and the insulating layer 412 have wider energy gaps than the semiconductor layer 406a and the semiconductor layer 406b. The Fermi levels (denoted by Ef) of the semiconductor layer 406a, the semiconductor layer 406b, the insulating layer 402a, the insulating layer 402b, and the insulating layer 412 are assumed to be equal to the intrinsic Fermi levels thereof (denoted by Ei). Work functions of the conductive layer 404 and the conductive layer 414 are assumed equal to the Fermi levels.

When a gate voltage is set to be higher than or equal to the threshold voltage of the transistor, an electron flows preferentially in the semiconductor layer 406a owing to the difference between the energies of the conduction band minimums of the semiconductor layers 406a and 406b. That is, it is considered that an electron is embedded in the semiconductor layer 406a. The energy at the conduction band minimum is denoted by Ec, and the energy at the valence band maximum is denoted by Ev.

Accordingly, in the transistor according to one embodiment of the present invention, the electronic embedding reduces the influence of interface scattering. Therefore, the channel resistance of the transistor according to one embodiment of the present invention is low.

Figure 44C:
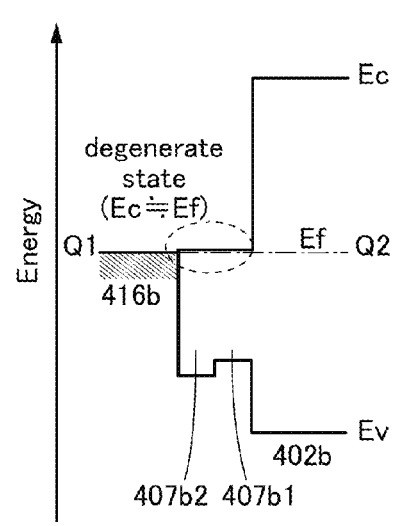

Next, FIG. 44C shows a band structure in the Q1-Q2 cross section including the source region or the drain region of the transistor. Here, the regions 407a1, 407b1, 407a2, and 407b2 are in a degenerate state. The Fermi level of the semiconductor layer 406a is approximately the same as the energy of the conduction band minimum in the region 407b1. The Fermi level of the semiconductor layer 406b is approximately the same as the energy of the conduction band minimum in the region 407b2. The same can apply to the regions 407a1 and 407a2.

At this time, an ohmic contact is made between the conductive layer 416b functioning as a source electrode or a drain electrode and the region 407b2 because an energy barrier therebetween is sufficiently low. Furthermore, an ohmic contact is made between the region 407b2 and the region 407b1. Similarly, an ohmic contact is made between the conductive layer 416a functioning as a source electrode or a drain electrode and the region 407a2 because an energy barrier therebetween is sufficiently low. Furthermore, an ohmic contact is made between the region 407a2 and the region 407a1. Therefore, electron transfer is conducted smoothly between the conductive layers 416a and 416b and the semiconductor layers 406a and 406b.

As described above, the transistor according to one embodiment of the present invention is a transistor in which the channel resistance is low, electron transfer between the channel formation region and the source and the drain electrodes is conducted smoothly, and the off-state current is extremely low. That is, the transistor has excellent switching characteristics.

This embodiment can be combined with any of the other embodiments in this specification as appropriate.

Embodiment 10

In this embodiment, effects of oxygen vacancy in an oxide semiconductor layer and hydrogen to which the oxygen vacancy is bonded are described below.

<(1) Formation and Stability of $V_oH$>

In the case where an oxide semiconductor film (hereinafter referred to as IGZO) is a complete crystal, H preferentially diffuses along the a-b plane at a room temperature. In heat treatment at 450° C., H diffuses along the a-b plane and in the c-axis direction. Here, description is made on whether H readily enters oxygen vacancy $V_o$ if the oxygen vacancy $V_o$ exists in IGZO. A state in which H is in oxygen vacancy $V_o$ is referred to as $V_oH$.

Figure 45:
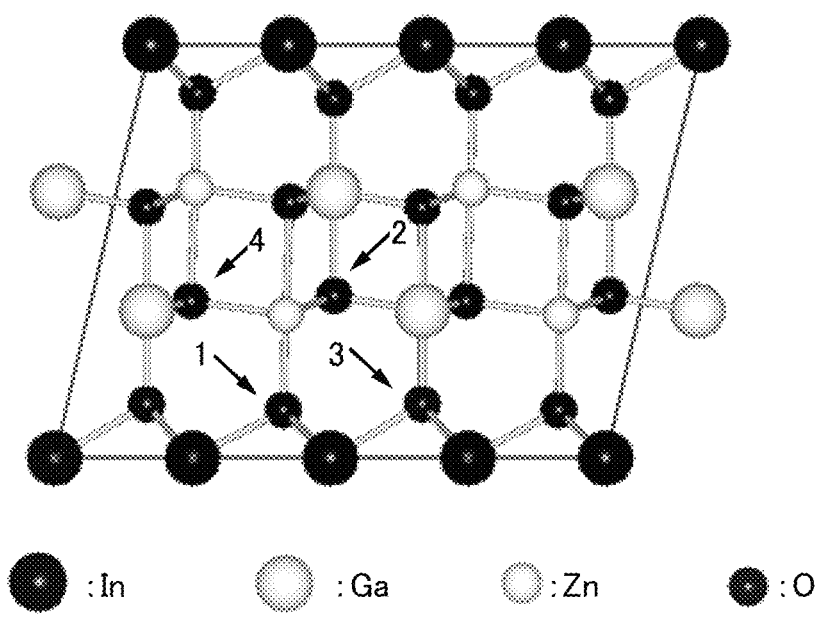
FIG. 45 shows a calculation model.

An $InGaZnO_4$ crystal model shown in FIG. 45 was used for calculation. The activation barrier ($E_a$) along the reaction path where H in $V_oH$ is released from $V_o$ and bonded to oxygen was calculated by a nudged elastic band (NEB) method. The calculation conditions are shown in Table 1.

TABLE 1

| | |
|---|---|
| Software | VASP |
| Calculation method | NEB method |
| Functional | GGA-PBE |
| Pseudopotential | PAW |
| Cut-off energy | 500 eV |
| K points | 2 × 2 × 3 |

In the $InGaZnO_4$ crystal model, there are four kinds of oxygen atoms 1 to 4 as shown in FIG. 45 which differ from each other in metal elements bonded to the oxygen atoms and the number of bonded metal elements. Here, calculation was made on the oxygen atoms 1 and 2 from which an oxygen vacancy $V_o$ is easily formed.

First, calculation was made on the oxygen atom 1, which is s bonded to three In atoms and one Zn atom.

Figure 46A:
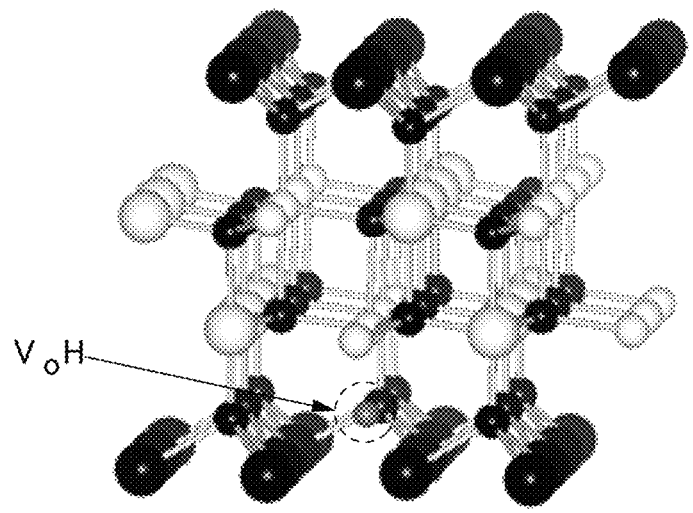
FIGS. 46A and 46B show an initial state and a final state, respectively.
Figure 46B:
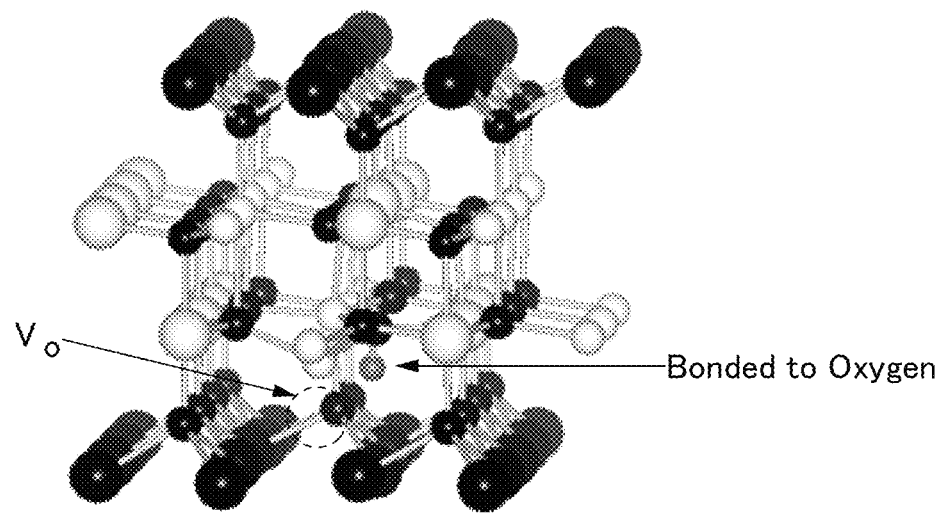
Figure 47:
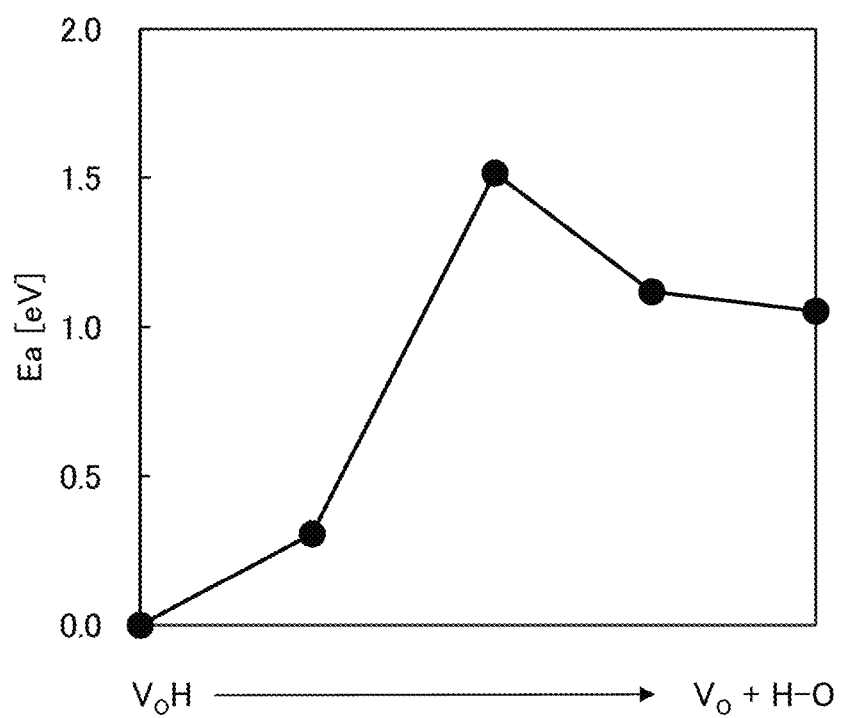
FIG. 47 shows an activation barrier.

FIG. 46A shows a model in the initial state and FIG. 46B shows a model in the final state. FIG. 47 shows the calculated activation barrier ($E_a$) in the initial state and the final state. Note that here, the initial state refers to a state in which a hydrogen atom exists in an oxygen vacancy $V_o$ ($V_oH$) that is formed by elimination of the oxygen atom 1, and the final state refers to a state (H—O) formed by the bonding of the hydrogen atom transferred from the oxygen vacancy $V_o$ with an oxygen atom bonded to one Ga atom and two Zn atoms.

From the calculation results, the transfer of the hydrogen atom from oxygen vacancy $V_o$ to bond with another oxygen atom needs an energy of approximately 1.52 eV, while the transfer of the hydrogen atom bonded to the oxygen atom into the oxygen vacancy $V_o$ needs an energy of approximately 0.46 eV.

Reaction frequency (F) was calculated from Formula 1 with use of the activation barriers ($E_a$) obtained by the calculation. In Formula 1, $k_B$ represents the Boltzmann constant and T represents the absolute temperature.

$$\Gamma = v\exp\left(-\frac{E_a}{k_BT}\right) \quad (1)$$

The reaction frequency at 350° C. was calculated on the assumption that the frequency factor $v=10^{13}$ [1/sec]. The frequency of the hydrogen-atom transfer from the model shown in FIG. 46A to the model shown in FIG. 46B was 5.52×10⁰ [1/sec], whereas the frequency of the hydrogen-atom transfer from the model shown in FIG. 46B to the model shown in FIG. 46A was 1.82×10⁹ [1/sec]. This suggests that the hydrogen atom diffusing in IGZO readily forms $V_oH$, and the hydrogen atom is unlikely to be eliminated from the oxygen vacancy $V_o$ once $V_oH$ is formed.

Next, calculation was made on the oxygen atoms 2 which is bonded to one Ga atom and two Zn atoms.

Figure 48A:
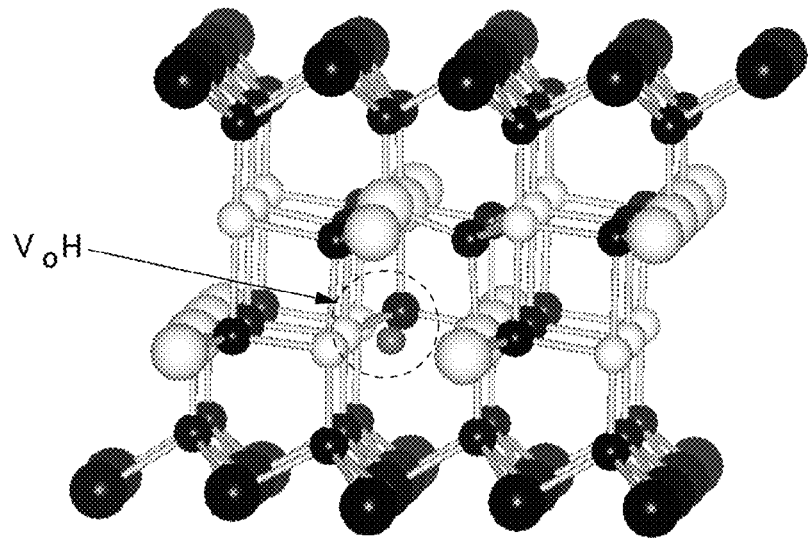
FIGS. 48A and 48B show an initial state and a final state, respectively.
Figure 48B:
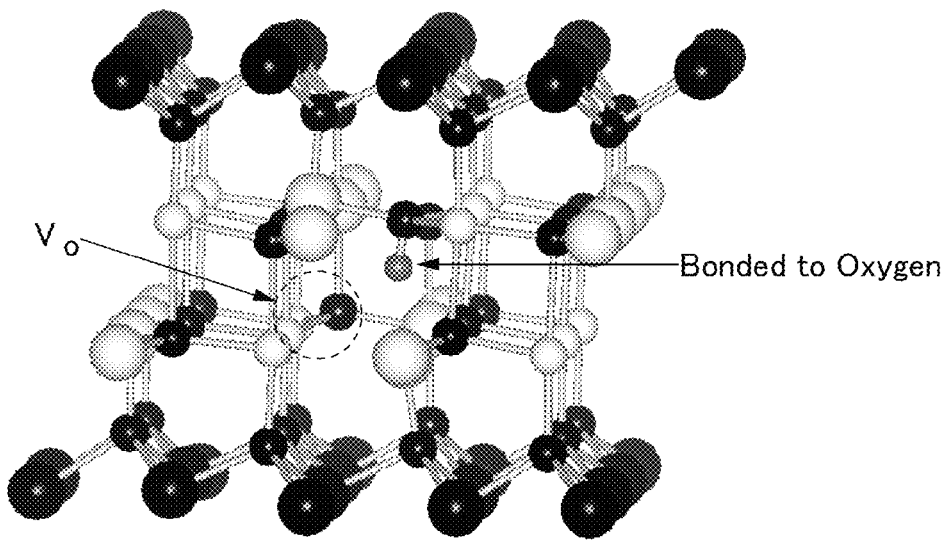
Figure 49:
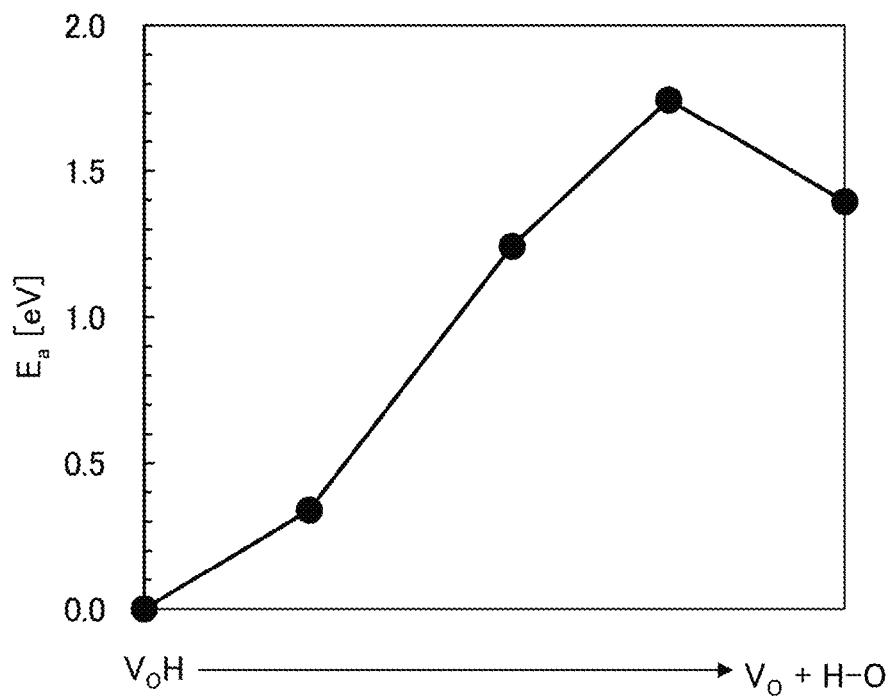
FIG. 49 shows an activation barrier.

FIG. 48A shows a model in the initial state and FIG. 48B shows a model in the final state. FIG. 49 shows the calculated activation barrier ($E_a$) in the initial state and the final state. Note that here, the initial state refers to a state in which a hydrogen atom exists in an oxygen vacancy $V_o$ ($V_oH$) that is formed by elimination of the oxygen atom 2, and the final state refers to a state (H—O) formed by the bonding of the hydrogen atom transferred from the oxygen vacancy $V_o$ with an oxygen atom bonded to one Ga atom and two Zn atoms.

From the calculation results, the transfer of the hydrogen atom inform the oxygen vacancy $V_o$ to bond with another oxygen atom needs an energy of approximately 1.75 eV, while the transfer of the hydrogen atom to the oxygen atom into the oxygen vacancy $V_o$ needs an energy of approximately 0.35 eV.

Reaction frequency (F) was calculated from Formula 1 with use of the activation barriers ($E_a$) obtained by the calculation.

The reaction frequency at 350° C. was calculated on the assumption that the frequency factor $v=10^{13}$ [1/sec]. The frequency of the hydrogen-atom transfer from the model shown in FIG. 48A to the model shown in FIG. 48B was 7.53×10⁻¹² [1/sec], whereas the frequency of the hydrogen-atom transfer from the model shown in FIG. 48B to the model shown in FIG. 48A was 1.44×10¹⁰ [1/sec]. This suggests that the hydrogen atom is unlikely to be eliminated from the oxygen vacancy $V_o$ once $V_oH$ is formed.

From the above results, it was found that a hydrogen atom in IGZO is easily diffused in annealing and if an oxygen vacancy $V_o$ exists, the hydrogen atom is readily trapped in the oxygen vacancy $V_o$ to form a $V_oH$.

<(2) Transition Level of $V_oH$>

The aforementioned calculation by the NEB method indicates that in the case where an oxygen vacancy $V_o$ exists in IGZO, the hydrogen atom easily forms a stable $V_oH$. To determine whether $V_oH$ is related to a carrier trap, the transition level of $V_oH$ was calculated.

The model used for calculation is an InGaZnO₄ crystal model (112 atoms). $V_oH$ models of the oxygen atoms 1 and 2 shown in FIG. 45 were made to calculate the transition levels. The calculation conditions are shown in Table 2.

TABLE 2

| Software | VASP |
|---|---|
| Model | InGaZnO₄ crystal (112 atoms) |
| Functional | HSE06 |
| Ratio of exchange terms | 0.25 |
| Pseudopotential | GGA-PBE |
| Cut-off energy | 800 eV |
| K points | 1 × 1 × 1 |

The ratio of exchange terms was adjusted to have a band gap close to the experimental value. As a result, the band gap of the InGaZnO₄ crystal model without defects was 3.08 eV that was close to the experimental value, 3.15 eV.

The transition level ($\in$(q|q')) of a model having defect D can be calculated by the following Formula 2. Note that $\Delta E(D^q)$ represents the formation energy of defect D at charge q and is calculated by Formula 3.

$$\varepsilon(q/q') = \frac{\Delta E(D^q) - \Delta E(D^{q'})}{q' - q} \quad (2)$$

$$\Delta E(D^q) = E_{tot}(D^q) - E_{tot}(\text{bulk}) + \sum_i \Delta n_i \mu_i + q(\varepsilon_{VBM} + \Delta V_q + E_F) \quad (3)$$

In Formulae 2 and 3, $E_{tot}(D^q)$ represents the total energy of the model having defect D at the charge q in, $E_{tot}$(bulk) represents the total energy in a model without defects (complete crystal), $\Delta n_i$ represents a change in the number of atoms i contributing to defects, $\|_i$ represents the chemical potential of atom i, $\in_{VBM}$ represents the energy of the valence band maximum in the model without defects, $\Delta V_q$ represents the correction term relating to the electrostatic potential, and $E_F$ represents the Fermi energy.

Figure 50:
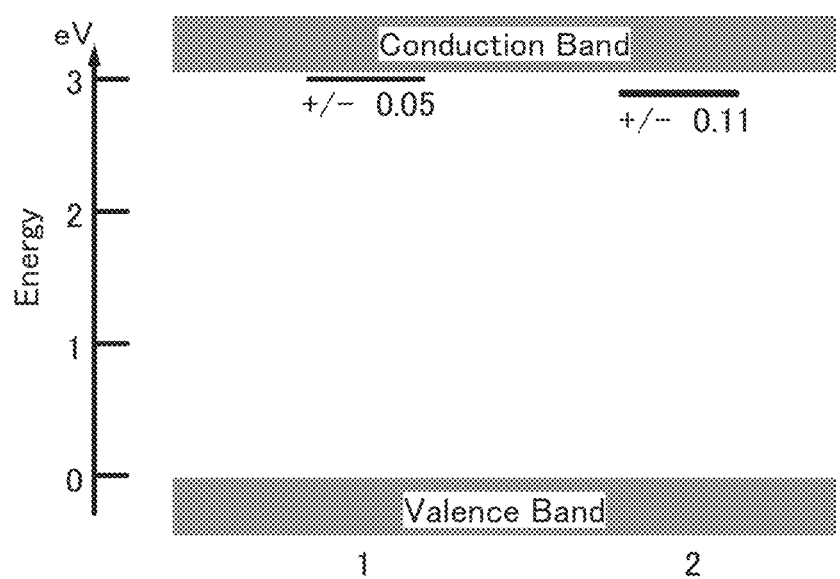
FIG. 50 shows the transition levels of VoH.

FIG. 50 shows the transition levels of $V_oH$ obtained from the above formulae. The numbers in FIG. 50 represent the depth from the conduction band minimum. In FIG. 50, the transition level of $V_oH$ in the oxygen atom 1 is at 0.05 eV from the conduction band minimum, and the transition level of $V_oH$ in the oxygen atom 2 is at 0.11 eV from the conduction band minimum. Therefore, these $V_oH$ are related to electron traps, that is, $V_oH$ was proven to behave as a donor. Furthermore, IGZO including $V_oH$ was found to have conductivity.

This embodiment can be combined as appropriate with any of the other embodiments in this specification.

Embodiment 11

An imaging device according to one embodiment of the present invention and a semiconductor device including the imaging device can be used for display devices, personal computers, and image reproducing devices provided with recording media (typically, devices that reproduce the content of recording media such as digital versatile discs (DVDs) and have displays for displaying the reproduced images). Other than the above, as an electronic appliances which can use the imaging device according to one embodiment of the present invention or the semiconductor device including the imaging device, mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 51A to 51F illustrate specific examples of these electronic appliances.

Figure 51A:
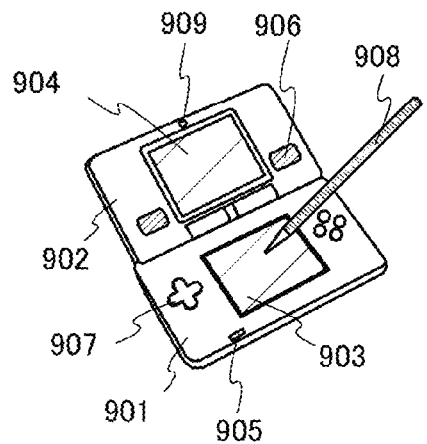
FIGS. 51A to 51F illustrate electronic appliances.

FIG. 51A illustrates a portable game console including a housing 901, a housing 902, a display portion 903, a display portion 904, a microphone 905, a speaker 906, an operation key 907, a stylus 908, a camera 909, and the like. Although the portable game console in FIG. 51A has the two display portions 903 and 904, the number of display portions included in a portable game console is not limited to this number. The imaging device of one embodiment of the present invention can be used in the camera 909.

Figure 51B:
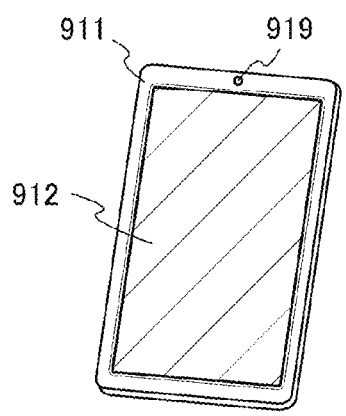

FIG. 51B illustrates a portable information terminal, which includes a first housing 911, a display portion 912, a camera 919, and the like. A touch panel function of the display portion 912 enables input and output of information. The imaging device of one embodiment of the present invention can be used in the camera 919.

Figure 51C:
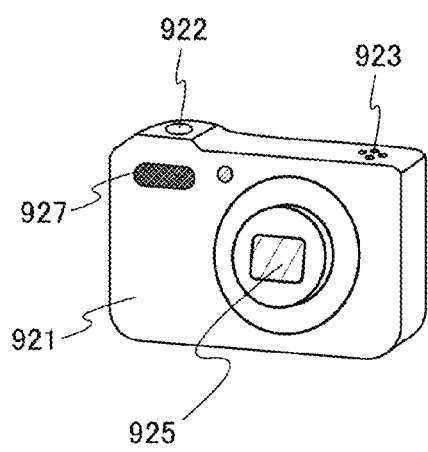

FIG. 51C illustrates a digital camera including a housing 921, a shutter button 922, a microphone 923, a light-emitting portion 927, a lens 925, and the like. The imaging device of one embodiment of the present invention can be used in a portion corresponding to a focus of the lens 925.

Figure 51D:
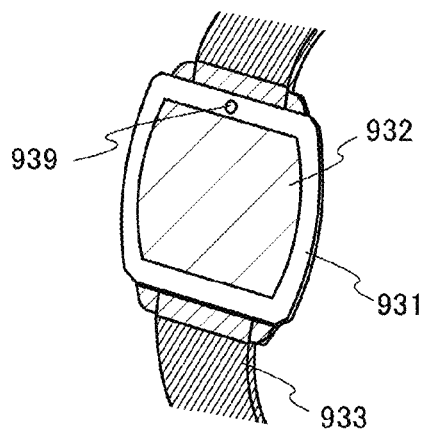

FIG. 51D illustrates a wrist-watch-type information terminal, which includes a housing 931, a display portion 932, a wristband 933, a camera 939, and the like. The display portion 932 may be a touch panel. The imaging device of one embodiment of the present invention can be used in the camera 939.

Figure 51E:
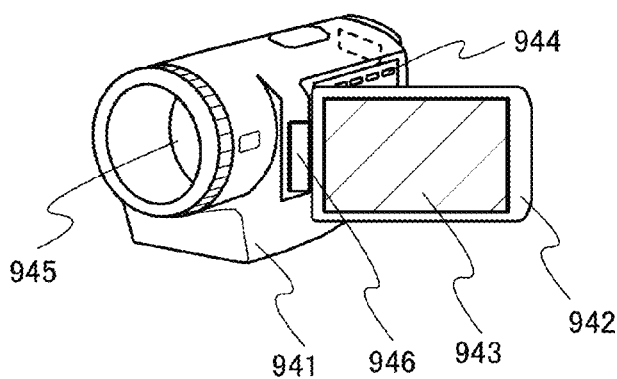

FIG. 51E illustrates a video camera including a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942. The imaging device of one embodiment of the present invention can be used in a portion corresponding to a focus of the lens 945.

Figure 51F:
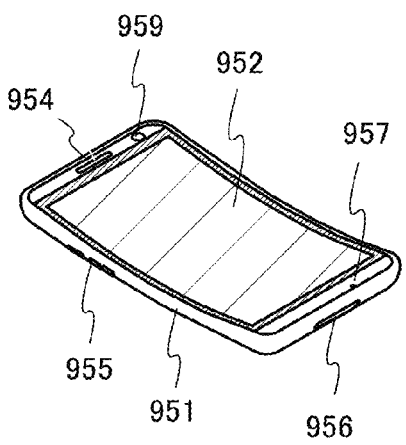

FIG. 51F illustrates a mobile phone which includes a display portion 952, a microphone 957, a speaker 954, a camera 959, an input/output terminal 956, an operation button 955, and the like in a housing 951. The imaging device of one embodiment of the present invention can be used in the camera 959.

This embodiment can be combined with any of the other embodiments in this specification as appropriate.

Embodiment 12

In this embodiment, modification examples of the transistor described in the above embodiment will be described with reference to FIGS. 52A to 52F, FIGS. 53A to 53F, and FIGS. 54A to 54E. The transistors illustrated in FIGS. 52A to 52F each includes, over a substrate 821, an oxide semiconductor layer 828 over an insulating layer 824, an insulating layer 837 in contact with the oxide semiconductor layer 828, and a conductive layer 840 in contact with the insulating layer 837 and overlapping the oxide semiconductor layer 828. The insulating layer 837 functions as a gate insulating film. The conductive layer 840 functions as a gate electrode layer.

The transistors are provided with an insulating layer 846 in contact with the oxide semiconductor layer 828 and an insulating layer 847 in contact with the insulating layer 846. Moreover, conductive layers 856 and 857 in contact with the oxide semiconductor layer 828 through the openings in the insulating layer 846 and the insulating layer 847 are provided. The conductive layers 856 and 857 function as a source electrode layer and a drain electrode layer.

As the conductive layers, the oxide semiconductor layer, and the insulating layers included in the transistor described in this embodiment, those described in the above embodiments can be used as appropriate.

Figure 52A:
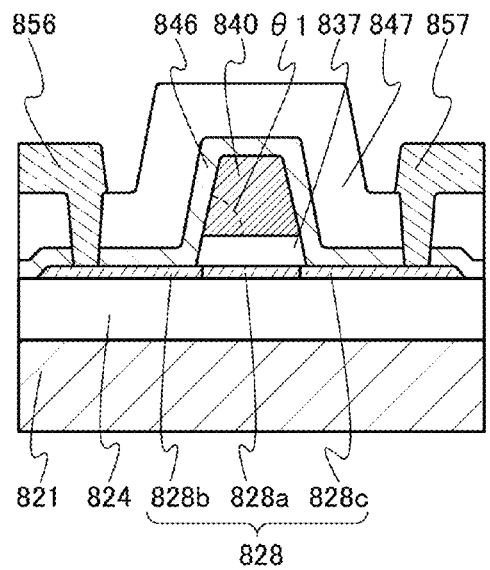
FIGS. 52A to 52F are cross-sectional views each illustrating a transistor.

In the transistor illustrated in FIG. 52A, the oxide semiconductor layer 828 includes a region 828a overlapping the conductive layer 840 and regions 828b and 828c containing an impurity element. The regions 828b and 828c are formed so that the region 828a is sandwiched therebetween. The conductive layers 856 and 857 are in contact with the regions 828b and 828c respectively. The region 828a functions as a channel region. The regions 828b and 828c have lower resistivity than the region 828a. The regions 828b and 828c function as a source region and a drain region.

Figure 52B:
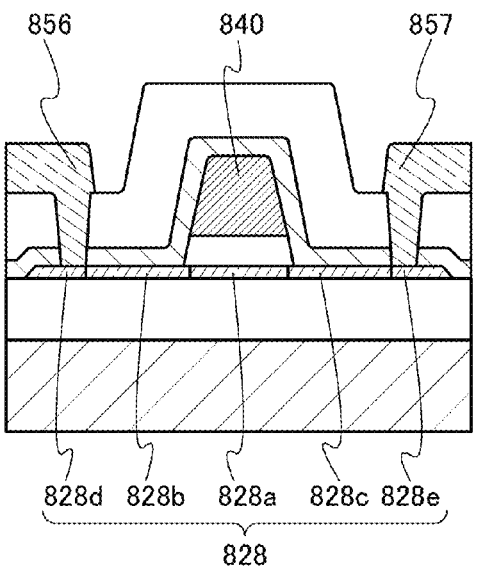

Alternatively, as in the transistor illustrated in FIG. 52B, the oxide semiconductor layer 828 may have a structure in which an impurity element is not added to regions 828d and 828e in contact with the conductive layers 856 and 857. In this case, the regions 828b and 828c containing an impurity element are provided between the region 828a and the regions 828d and 828e in contact with the conductive layers 856 and 857. The regions 828d and 828e have conductivity when the voltage is applied to the conductive layers 856 and 857; thus, the regions 828d and 828e function as a source region and a drain region.

Note that the transistor illustrated in FIG. 52B can be formed in such a manner that after the conductive layers 856 and 857 are formed, an impurity element is added to the oxide semiconductor layer using the conductive layer 840 and the conductive layers 856 and 857 as masks.

An end portion of the conductive layer 840 may have a tapered shape. The angle θ1 formed between a surface where the insulating layer 837 and the conductive layer 840 are in contact with each other and a side surface of the conductive layer 840 may be less than 90°, greater than or equal to 10° and less than or equal to 85°, greater than or equal to 15° and less than or equal to 85°, greater than or equal to 30° and less than or equal to 85°, greater than or equal to 45° and less than or equal to 85°, or greater than or equal to 60° and less than or equal to 85°. Such an angle allows the improvement of the coverage of the side surfaces of the insulating layer 837 and the conductive layer 840 with the insulating layer 846.

Next, modification examples of the regions 828b and 828c are described. FIGS. 52C to 52F are each an enlarged view of the oxide semiconductor layer 828 and its vicinity illustrated in FIG. 52A. The channel length L indicates a distance between a pair of regions containing an impurity element.

Figure 52C:
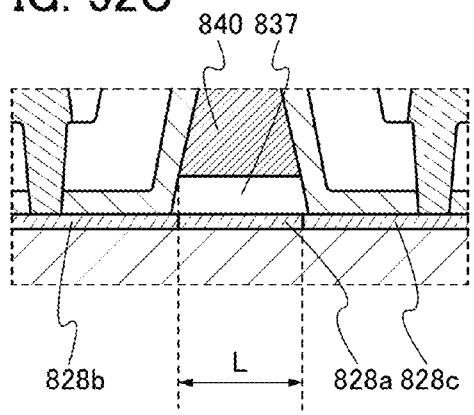

As illustrated in FIG. 52C, in a cross-sectional view in the channel length direction, the boundaries between the region 828a and the regions 828b and 828c are aligned or substantially aligned with the end portion of the conductive layer 840 with the insulating layer 837 positioned therebetween. In other words, the boundaries between the region 828a and the regions 828b and 828c are aligned or substantially aligned with the end portion of the conductive layer 840, when seen from the above.

Figure 52D:
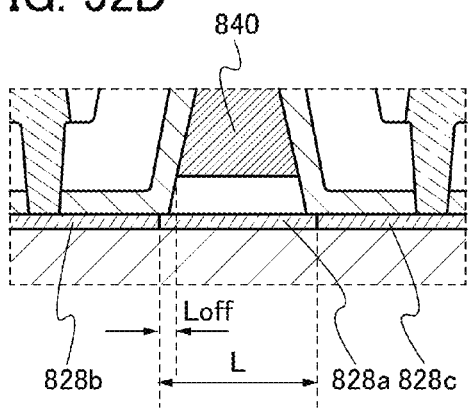

Alternatively, as illustrated in FIG. 52D, in a cross-sectional view in the channel length direction, the region 828a has a region that does not overlap the end portion of the conductive layer 840. The region functions as an offset region. The length of the offset region in the channel length direction is referred to as $L_{off}$. Note that when a plurality of offset regions are provided, $L_{off}$ indicates the length of one offset region. The offset region is included in the channel region. Note that $L_{off}$ is smaller than 20%, smaller than 10%, smaller than 5%, or smaller than 2% of the channel length L.

Figure 52E:
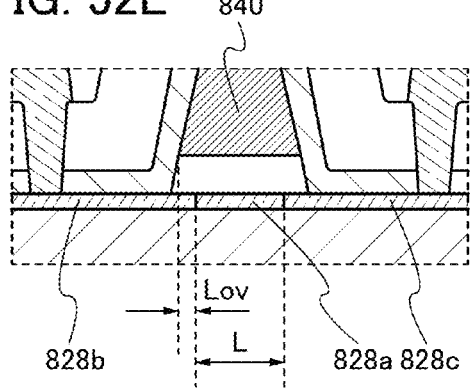

Alternatively, as illustrated in FIG. 52E, in a cross-sectional view in the channel length direction, the regions 828b and 828c each have a region overlapping the conductive layer 840 with the insulating layer 837 positioned therebetween. The regions function as an overlap region. The overlap region in the channel length direction is referred to as $L_{ov}$. $L_{ov}$ is smaller than 20%, smaller than 10%, smaller than 5%, or smaller than 2% of the channel length L.

Figure 52F:
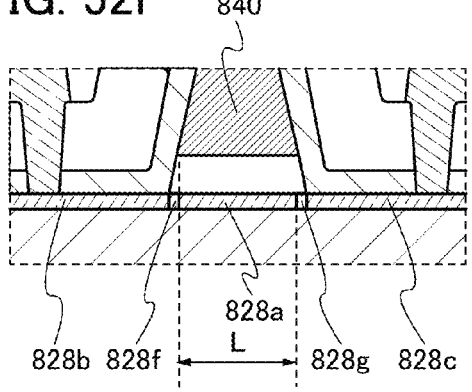

Alternatively, as illustrated in FIG. 52F, in a cross-sectional view in the channel length direction, a region 828f is provided between the region 828a and the region 828b, and a region 828g is provided between the region 828a and the region 828c. The regions 828f and 828g have lower concentration of an impurity element and higher resistivity than the regions 828b and 828c. Although the regions 828f and 828g overlap the insulating layer 837 in this case, they may overlap the insulating layer 837 and the conductive layer 840.

Note that in FIGS. 52C to 52F, the transistor illustrated in FIG. 52A is described; however, the transistor illustrated in FIG. 52B can employ any of the structures in FIGS. 52C to 52F as appropriate.

Figure 53A:
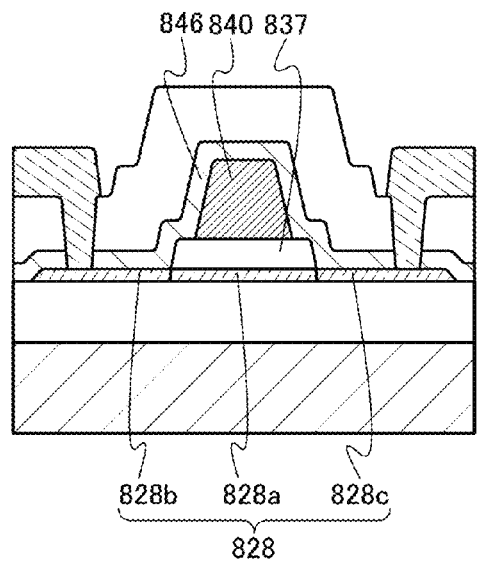
FIGS. 53A to 53F are cross-sectional views each illustrating a transistor.

In the transistor illustrated in FIG. 53A, the end portion of the insulating layer 837 is positioned on an outer side than the end portion of the conductive layer 840. In other words, the insulating layer 837 has a shape such that the end portion extends beyond the end portion of the conductive layer 840. The insulating layer 846 can be kept away from the region 828a; thus, nitrogen, hydrogen, and the like contained in the insulating layer 846 can be prevented from entering the region 828a functioning as a channel region.

Figure 53B:
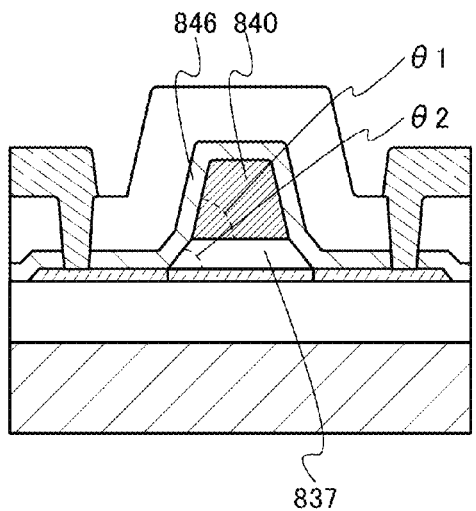

In the transistor illustrated in FIG. 53B, the insulating layer 837 and the conductive layer 840 each have a tapered shape, and the angles of the tapered shapes are different from each other. In other words, the angle θ1 formed between a surface where the insulating layer 837 and the conductive layer 840 are in contact with each other and a side surface of the conductive layer 840 is different from an angle θ2 formed between a surface where the oxide semiconductor layer 828 and the insulating layer 837 are in contact with each other and the side surface of the insulating layer 837. The angle θ2 may be less than 90°, greater than or equal to 30° and less than or equal to 85°, or greater than or equal to 45° and less than or equal to 70°. For example, when the angle θ2 is less than the angle θ1, the coverage with the insulating layer 846 is improved. Alternatively, when the angle θ2 is greater than the angle θ1, the insulating layer 846 can be kept away from the region 828a; thus, nitrogen, hydrogen, or the like contained in the insulating layer 846 can be prevented from entering the region 828a functioning as a channel region.

Next, modification examples of the regions 828b and 828c are described with reference to FIGS. 53C to 53F. Note that FIGS. 53C to 53F are each an enlarged view of the oxide semiconductor layer 828 and its vicinity illustrated in FIG. 53A.

Figure 53C:
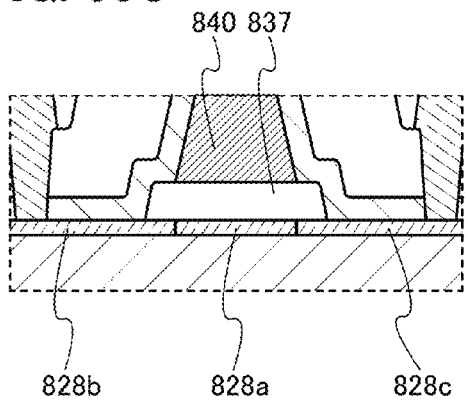

As illustrated in FIG. 53C, in a cross-sectional view in the channel length direction, the boundaries between the region 828a and the regions 828b and 828c are aligned or substantially aligned with the end portion of the conductive layer 840 with the insulating layer 837 positioned therebetween. In other words, when seen from the above, the boundaries between the region 828a and the regions 828b and 828c are aligned or substantially aligned with the end portion of the conductive layer 840.

Figure 53D:
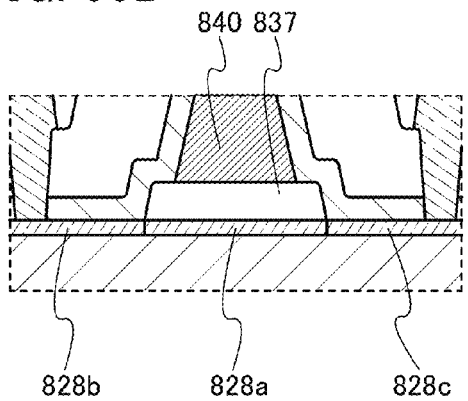

As illustrated in FIG. 53D, in a cross-sectional view in the channel length direction, the region 828a has a region that does not overlap the conductive layer 840. The region functions as an offset region. In other words, when seen from the above, the end portions of the regions 828b and 828c are aligned or substantially aligned with the end portion of the insulating layer 837 and do not overlap the end portion of the conductive layer 840.

Figure 53E:
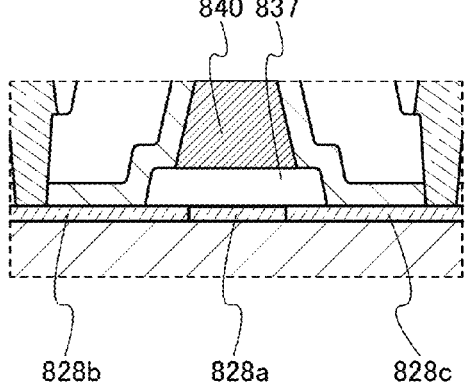

As illustrated in FIG. 53E, in a cross-sectional view in the channel length direction, the regions 828b and 828c each have a region overlapping the conductive layer 840 with the insulating layer 837 positioned therebetween. Such a region is referred to as an overlap region. In other words, when seen from the above, the end portions of the regions 828b and 828c overlap the conductive layer 840.

Figure 53F:
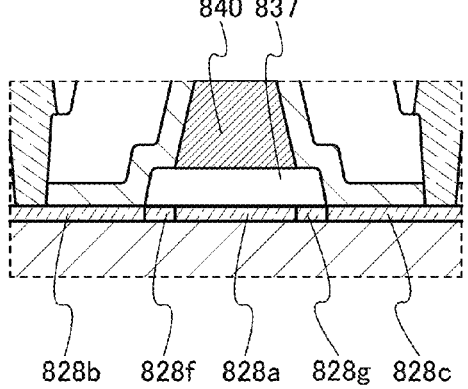

As illustrated in FIG. 53F, in a cross-sectional view in the channel length direction, the region 828f is provided between the region 828a and the region 828b, and the region 828g is provided between the region 828a and the region 828c. The regions 828f and 828g have lower concentration of an impurity element and higher resistivity than the regions 828b and 828c. Although the regions 828f and 828g overlap the insulating layer 837 in this case, they may overlap the insulating layer 837 and the conductive layer 840.

Note that in FIGS. 53C to 53F, the transistor illustrated in FIG. 53A is described; however, the transistor illustrated in FIG. 53B can employ any of the structures in FIGS. 53C to 53F as appropriate.

Figure 54A:
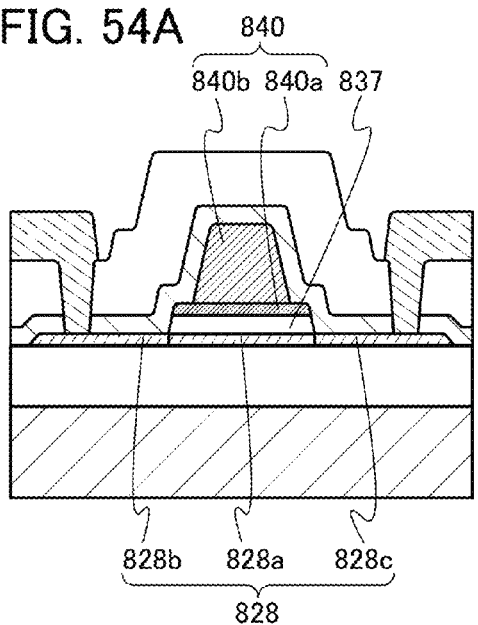
FIGS. 54A to 54E are cross-sectional views each illustrating a transistor.

In the transistor illustrated in FIG. 54A, the conductive layer 840 has a stacked structure including a conductive layer 840a in contact with the insulating layer 837 and a conductive layer 840b in contact with the conductive layer 840a. The end portion of the conductive layer 840a is positioned on an outer side than the end portion of the conductive layer 840b. In other words, the conductive layer 840a has such a shape that the end portion extends beyond the end portion of the conductive layer 840b.

Next, modification examples of the regions 828b and 828c are described. Note that FIGS. 54B to 54E are each an enlarged view of the oxide semiconductor layer 828 and its vicinity illustrated in FIG. 54A.

Figure 54B:
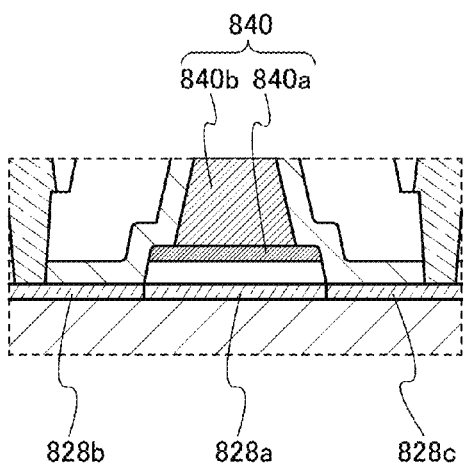

As illustrated in FIG. 54B, in a cross-sectional view in the channel length direction, the boundaries between the region 828a and the regions 828b and 828c are aligned or substantially aligned with the end portion of the conductive layer 840a in the conductive layer 840 with the insulating layer 837 positioned therebetween. In other words, when seen from the above, the boundaries between the region 828a and the regions 828b and 828c are aligned or substantially aligned with the end portion of the conductive layer 840.

Figure 54C:
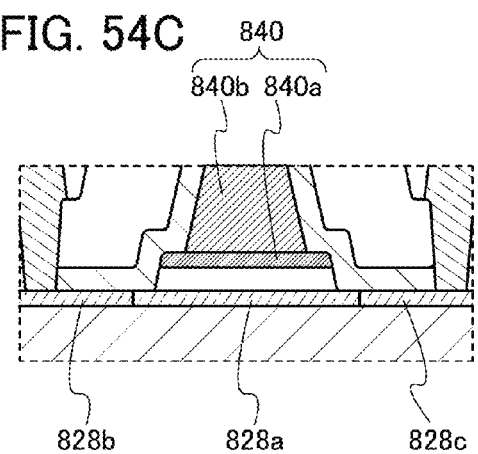

As illustrated in FIG. 54C, in a cross-sectional view in the channel length direction, the region 828a has a region that does not overlap the conductive layer 840. The region functions as an offset region. In other words, when seen from the above, the end portions of the regions 828b and 828c do not overlap the end portion of the conductive layer 840.

Figure 54D:
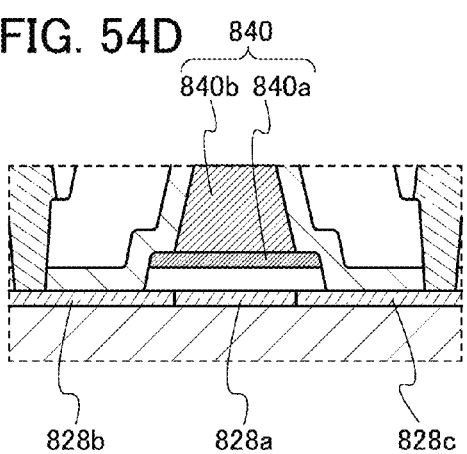

As illustrated in FIG. 54D, in a cross-sectional view in the channel length direction, the regions 828b and 828c each have a region overlapping the conductive layer 840, specifically the conductive layer 840a. Such a region is referred to as an overlap region. In other words, when seen from the above, the end portions of the regions 828b and 828c overlap the conductive layer 840a.

Figure 54E:
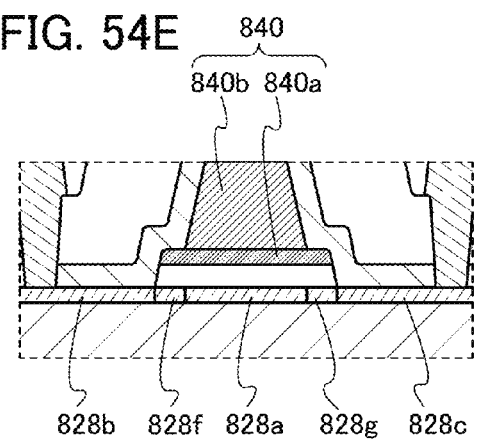

As illustrated in FIG. 54E, in a cross-sectional view in the channel length direction, the region 828f is provided between the region 828a and the region 828b, and the region 828g is provided between the region 828a and the region 828c. The impurity element is added to the regions 828f and 828g through the conductive layer 840a; thus, the regions 828f and 828g have lower concentration of impurity element and higher resistivity than the regions 828b and 828c. Although the regions 828f and 828g overlap the conductive layer 840a, they may overlap both the conductive layer 840a and the conductive layer 840b.

The end portion of the insulating layer 837 may be positioned on the outer side than the end portion of the conductive layer 840a.

Alternatively, the side surface of the insulating layer 837 may be curved.

Alternatively, the insulating layer 837 may have a tapered shape. In other words, an angle formed between a surface where the oxide semiconductor layer 828 and the insulating layer 837 are in contact with each other and a side surface of the insulating layer 837 may be less than 90°, preferably greater than or equal to 30° and less than 90°.

As described with FIG. 54E, the oxide semiconductor layer 828 includes the region 828f and the region 828g having lower concentration of an impurity element and higher resistivity than the regions 828b and 828c, whereby the electric field of the drain region can be relaxed. Thus, a deterioration of the transistor due to the electric field of the drain region, such as a shift of the threshold voltage of the transistor, can be inhibited.

This embodiment can be combined with any of the other embodiments in this specification as appropriate.

Embodiment 13

Figure 55:
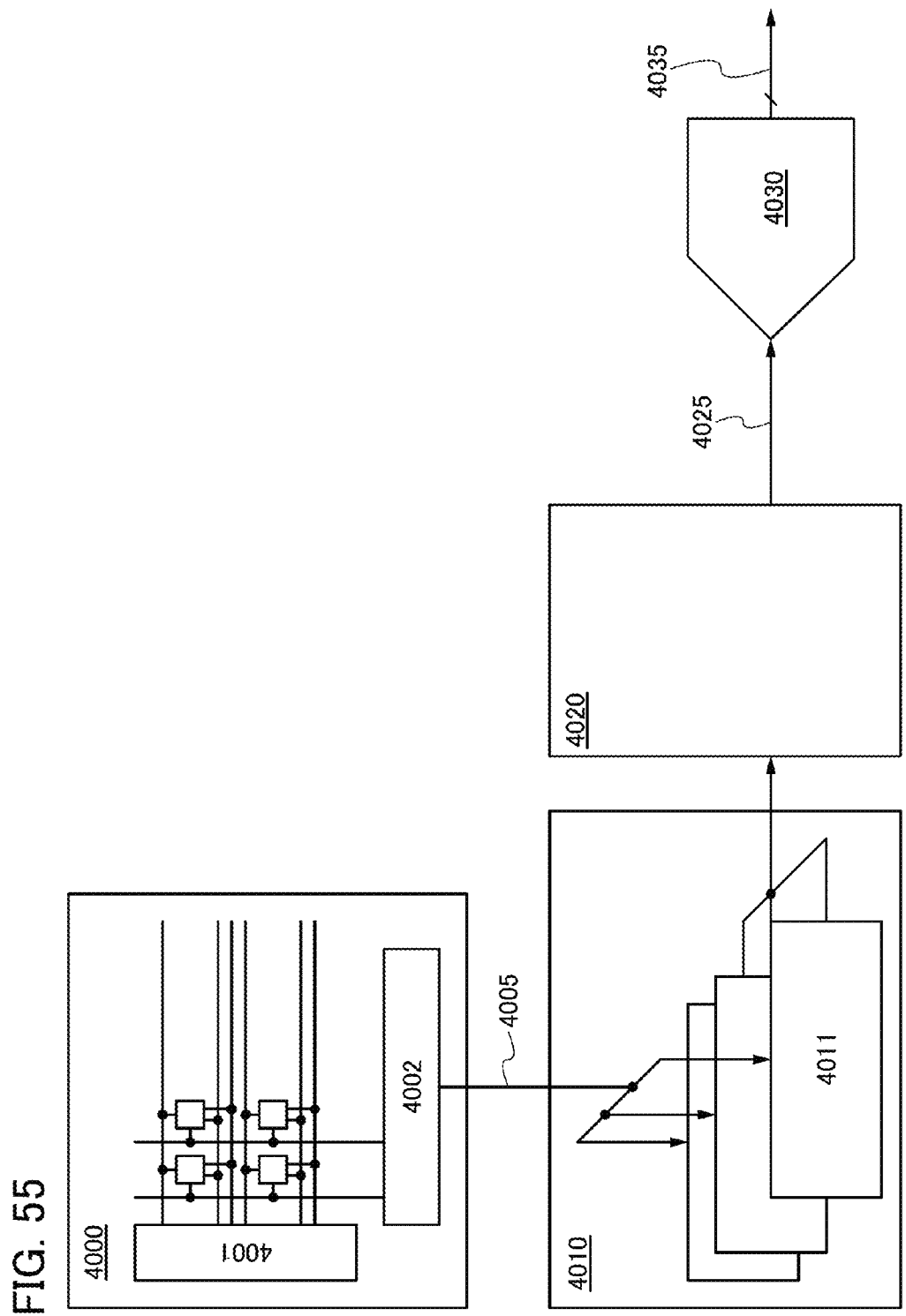
FIG. 55 shows an image processing engine of an imaging device.

In this embodiment, an example of an image processing engine of an imaging device (image sensor) is described with reference to FIG. 55.

The imaging device includes an imaging unit 4000, an analog memory unit 4010, an image processing engine unit 4020, and an A/D converter 4030. The imaging unit 4000 includes a plurality of pixels arranged in a matrix, a driver circuit 4001, and a reading circuit 4002. Each pixel includes a photodiode and a transistor. The analog memory unit 4010 includes a plurality of analog memories 4011. Here, each analog memory 4011 includes memory cells the number of which is greater than the number of pixels in the imaging unit 4000. That is, each analog memory 4011 can store first imaging data 4005 of one frame obtained by the imaging unit 4000.

The operation of the imaging device is described below. As a first step, a first imaging data 4005 of one frame is obtained in each pixel. Image-capturing may be conducted by what is called a rolling shutter system, in which pixels are sequentially exposed to light and first imaging data 4005 is sequentially read out, or by what is called a global shutter system, in which all the pixels are exposed to light at a time and the imaging data 4005 is sequentially read out.

In the case of the rolling shutter system, during a period in which the imaging data 4005 of pixels in a certain row is read out, light exposure can be performed on pixels in another row; as a result, the frame frequency of imaging can be easily increased. In the case of the global shutter system, even when an object is moving, an image with little distortion can be obtained.

As a second step, the first imaging data 4005 obtained in each pixel is stored in a first analog memory 4011 through the reading circuit 4002. Here, unlike in a general imaging device, it is effective that the first imaging data 4005 that is analog data is stored in the first analog memory 4011 as it is. In other words, analog-to-digital conversion processing is unnecessary, and thus the frame frequency of image-capturing can be easily increased.

Subsequently, the first step and the second step are repeated n times. Note that in the n-th repetition, n-th imaging data 4005 obtained in each pixel is stored in an n-th analog memory 4011 through the reading circuit 4002.

As a third step, with use of the first to n-th imaging data 4005 stored in the plurality of analog memories 4011, desired image processing is performed in the image processing engine unit 4020 to obtain processed imaging data 4025.

As a fourth step, the processed imaging data 4025 is subjected to analog-to-digital conversion in the A/D converter 4030 to obtain image data 4035.

As a method of the image processing, processed imaging data 4025 having no focus blur is obtained from a plurality of pieces of imaging data 4005. Since the sharpness of all the imaging data 4005 is calculated, most clear imaging data 4005 can be obtained as the processed imaging data 4025. Alternatively, a region with high sharpness is extracted from each piece of imaging data 4005 and the obtained regions are connected to each other, whereby the processed imaging data 4025 can be obtained.

Furthermore, as another method of the image processing, processed data 4025 having optimal brightness is obtained from the plurality of pieces of imaging data 4005. The processed imaging data 4025 can be obtained as follows: the highest brightness of each piece of imaging data 4005 is calculated, and the processed imaging data 4025 are obtained from the imaging data 4005 except the imaging data 4005 whose highest brightness has reached a saturation value.

In addition, the lowest brightness of each piece of imaging data 4005 is calculated, and the processed imaging data 4025 are obtained from the imaging data 4005 except imaging data 4005 whose lowest brightness has reached a saturation value.

Note that in the case where the first and second steps are executed in time with lighting of a flash light for image-capturing, imaging data 4005 corresponding to the timing at which irradiation with an optimal amount of light is conducted can be obtained.

This embodiment can be combined with any of the other embodiments in this specification as appropriate.

This application is based on Japanese Patent Application serial no. 2014-088747 filed with Japan Patent Office on Apr. 23, 2014, the entire contents of which are hereby incorporated by reference.

What is claimed is:
1. A semiconductor device comprising:
a first circuit over a first surface of a silicon substrate, the first circuit comprising a first transistor and a second transistor;
a second circuit comprising a photodiode in the silicon substrate and a third transistor; and
a light-controlling layer in the silicon substrate, wherein:
the first transistor includes an active region in the silicon substrate;
the photodiode includes a first electrode and a second electrode in the silicon substrate;
the light-controlling layer surrounds a side surface of the photodiode;
an insulating layer is over the first transistor and the photodiode;
the second transistor and the third transistor are over the insulating layer;
each of the first to third transistors comprises a gate, a first terminal, and a second terminal;
the first terminal of the first transistor is electrically connected to the first terminal of the second transistor;
the first electrode of the photodiode is electrically connected to the first terminal of the third transistor;
the gate of the third transistor overlaps with the photodiode in a direction which is perpendicular to the first surface of the silicon substrate; and
the photodiode does not overlap with the first transistor in the direction which is perpendicular to the first surface of the silicon substrate.

2. The semiconductor device according to claim 1, wherein the first transistor is a p-channel transistor.

3. The semiconductor device according to claim 1, wherein the third transistor includes an oxide semiconductor.

4. The semiconductor device according to claim 1, wherein the second transistor includes an oxide semiconductor.

5. The semiconductor device according to claim 1, wherein the light-controlling layer comprises an insulator.

6. The semiconductor device according to claim 1, wherein a light-receiving surface of the photodiode is a second surface of the silicon substrate, which is opposite to the first surface, and
wherein the second electrode is on a side of the second surface of the silicon substrate.

7. The semiconductor device according to claim 1, wherein a metal passes through the light-controlling layer.

8. An imaging device comprising the semiconductor device according to claim 1.

9. An electronic device comprising the semiconductor device according to claim 1.

10. A semiconductor device comprising:
a first circuit over a first surface of a silicon substrate, the first circuit comprising a first transistor and a second transistor;
a second circuit comprising a photodiode in the silicon substrate, a third transistor, a fourth transistor, and a fifth transistor; and
a light-controlling layer in the silicon substrate,
wherein:
the first transistor includes an active region in the silicon substrate;
the photodiode includes a first electrode and a second electrode in the silicon substrate;
the light-controlling layer surrounds a side surface of the photodiode;
an insulating layer is over the first transistor and the photodiode;
the second transistor and the third transistor are over the insulating layer;
each of the first to fifth transistors comprises a gate, a first terminal, and a second terminal;
the gate of the first transistor is electrically connected to the gate of the second transistor;
the first terminal of the first transistor is electrically connected to the first terminal of the second transistor;
the first electrode of the photodiode is electrically connected to the first terminal of the third transistor;
the second terminal of the third transistor is electrically connected to the first terminal of the fourth transistor and the gate of the fifth transistor; and
the gate of the third transistor overlaps with the photodiode in a direction which is perpendicular to the first surface of the silicon substrate; and
the photodiode does not overlap with the first transistor in the direction which is perpendicular to the first surface of the silicon substrate.

11. The semiconductor device according to claim 10,
wherein the second circuit further comprises a sixth transistor having a gate, a first terminal, and a second terminal, and
wherein the first terminal of the fifth transistor is electrically connected to the first terminal of the sixth transistor.

12. The semiconductor device according to claim 10, wherein the first transistor is a p-channel transistor.

13. The semiconductor device according to claim 10, wherein the third transistor includes an oxide semiconductor.

14. The semiconductor device according to claim 10, wherein the second transistor includes an oxide semiconductor.

15. The semiconductor device according to claim 10, wherein the fourth transistor and the fifth transistor each include an oxide semiconductor.

16. The semiconductor device according to claim 11, wherein the sixth transistor includes an oxide semiconductor.

17. The semiconductor device according to claim 10, wherein the light-controlling layer comprises an insulator.

18. The semiconductor device according to claim 10, wherein a light-receiving surface of the photodiode is a second surface of the silicon substrate, which is opposite to the first surface, and
wherein the second electrode is on a side of the second surface of the silicon substrate.

19. The semiconductor device according to claim 10, wherein a metal passes through the light-controlling layer.

20. An imaging device comprising the semiconductor device according to claim 10.

21. An electronic device comprising the semiconductor device according to claim 10.

22. The semiconductor device according to claim 1, wherein the light-controlling layer does not overlap with the third transistor in the direction which is perpendicular to the first surface of the silicon substrate.

23. The semiconductor device according to claim 10, wherein the light-controlling layer does not overlap with the third transistor in the direction which is perpendicular to the first surface of the silicon substrate.

* * * * *